(12) United States Patent
Menard et al.

(10) Patent No.: US 10,481,336 B2
(45) Date of Patent: Nov. 19, 2019

(54) METHODS AND SYSTEMS FOR MICROELECTRONIC PACKAGING

(71) Applicants: AEPONYX INC., Repentigny (CA); UNIVERSITE DU QUEBEC A MONTREAL, Montreal (CA)

(72) Inventors: Francois Menard, Trois-Rivieres (CA); Fréderic Nabki, Montreal (CA); Michaël Ménard, Verdun (CA); Martin Bérard, Repentigny (CA)

(73) Assignees: Aeponyx Inc., Repentigny, Quebec (CA); Universite Du Quebec a Montreal, Montreal, Quebec (CA)

( * ) Notice: Subject to any disclaimer, the term of this patent is extended or adjusted under 35 U.S.C. 154(b) by 148 days.

(21) Appl. No.: 15/504,149

(22) PCT Filed: Aug. 17, 2015

(86) PCT No.: PCT/CA2015/000466
§ 371 (c)(1),
(2) Date: Feb. 15, 2017

(87) PCT Pub. No.: WO2016/023105
PCT Pub. Date: Feb. 18, 2016

(65) Prior Publication Data
US 2018/0299622 A1    Oct. 18, 2018

Related U.S. Application Data

(60) Provisional application No. 62/037,655, filed on Aug. 15, 2014.

(51) Int. Cl.
| | |
|---|---|
| G02B 6/35 | (2006.01) |
| G02B 6/12 | (2006.01) |
| G02B 6/122 | (2006.01) |
| B81B 5/00 | (2006.01) |
| G02B 6/124 | (2006.01) |
| G02B 6/42 | (2006.01) |
| G02B 6/00 | (2006.01) |

(52) U.S. Cl.
CPC .............. *G02B 6/3518* (2013.01); *B81B 5/00* (2013.01); *G02B 6/00* (2013.01); *G02B 6/12004* (2013.01);
(Continued)

(58) Field of Classification Search
CPC ................................... G02B 6/35; G02B 6/12
(Continued)

(56) References Cited

U.S. PATENT DOCUMENTS 6,577,785 B1 * 6/2003 Spahn ................... G02B 6/122
385/22
6,980,727 B1 * 12/2005 Lin ........................ G02B 6/266
385/140
(Continued)

*Primary Examiner* — Kaveh C Kianni
(74) *Attorney, Agent, or Firm* — Rosenberg, Klein & Lee

(57) ABSTRACT

Hybrid optical integration places very strict manufacturing tolerances and performance requirements upon the multiple elements to exploit passive alignment techniques as well as having additional processing requirements. Alternatively, active alignment and soldering/fixing where feasible is also complex and time consuming with 3, 4, or 6-axis control of each element. However, microelectromechanical (MEMS) systems can sense, control, and activate mechanical processes on the micro scale. Beneficially, therefore the inventors combine silicon MEMS based micro-actuators with silicon CMOS control and drive circuits in order to provide alignment of elements within a silicon optical circuit either with respect to each other or with other optical elements hybridly integrated such as compound semiconductor elements. Such inventive MEMS based circuits may be either maintained as active during deployment or powered off once the alignment has been "locked" through an attachment/retention/latching process.

20 Claims, 37 Drawing Sheets

(52) U.S. Cl.
CPC ........... *G02B 6/124* (2013.01); *G02B 6/1228* (2013.01); *G02B 6/357* (2013.01); *G02B 6/3596* (2013.01); *G02B 6/4214* (2013.01); *B81B 2201/033* (2013.01); *B81B 2201/042* (2013.01); *G02B 2006/12061* (2013.01); *G02B 2006/12078* (2013.01); *G02B 2006/12085* (2013.01); *G02B 2006/12104* (2013.01); *G02B 2006/12107* (2013.01); *G02B 2006/12121* (2013.01); *G02B 2006/12145* (2013.01)

(58) Field of Classification Search
USPC .......................................................... 385/18
See application file for complete search history.

(56) References Cited

U.S. PATENT DOCUMENTS

| | | | |
|---|---|---|---|
| 8,326,100 B2 * | 12/2012 | Chen | G02B 6/14 264/1.24 |
| 2003/0108274 A1 * | 6/2003 | Haronian | G02B 6/122 385/17 |
| 2003/0113067 A1 * | 6/2003 | Koh | G02B 6/12004 385/48 |
| 2004/0122328 A1 * | 6/2004 | Wang | A61B 1/00048 600/476 |
| 2004/0184710 A1 * | 9/2004 | Kubby | G02B 6/358 385/16 |
| 2004/0184760 A1 * | 9/2004 | Kubby | G02B 6/3508 385/147 |
| 2004/0264847 A1 * | 12/2004 | Koh | G02B 6/3502 385/22 |
| 2005/0167508 A1 * | 8/2005 | Syms | G06K 7/10653 235/473 |
| 2005/0180678 A1 * | 8/2005 | Panepucci | G01D 5/266 385/13 |
| 2006/0127029 A1 * | 6/2006 | Lin | G02B 6/3508 385/140 |
| 2011/0103733 A1 * | 5/2011 | Tang | G02B 6/12007 385/1 |
| 2016/0327751 A1 * | 11/2016 | Wu | G02B 6/29344 |

* cited by examiner

800

900

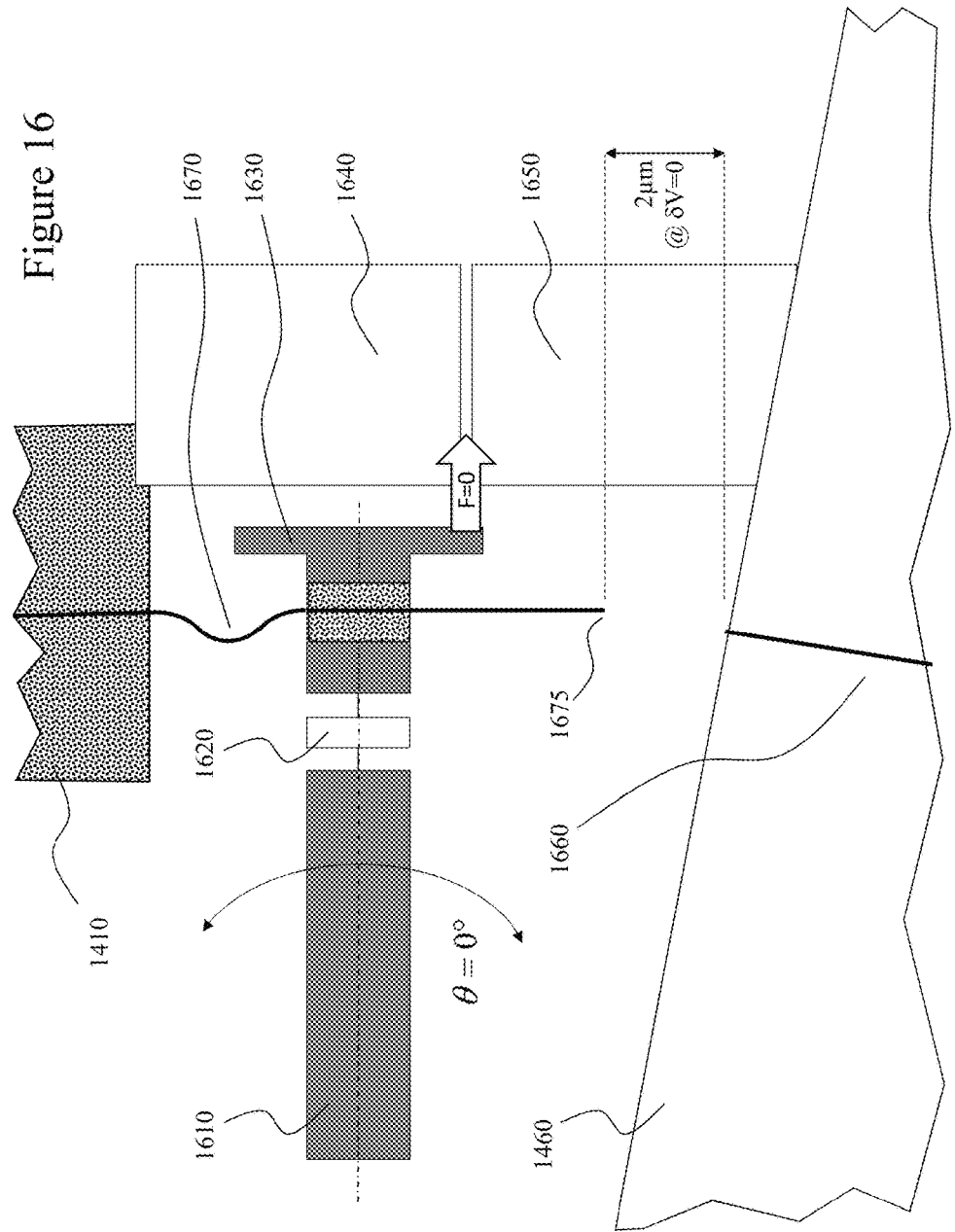

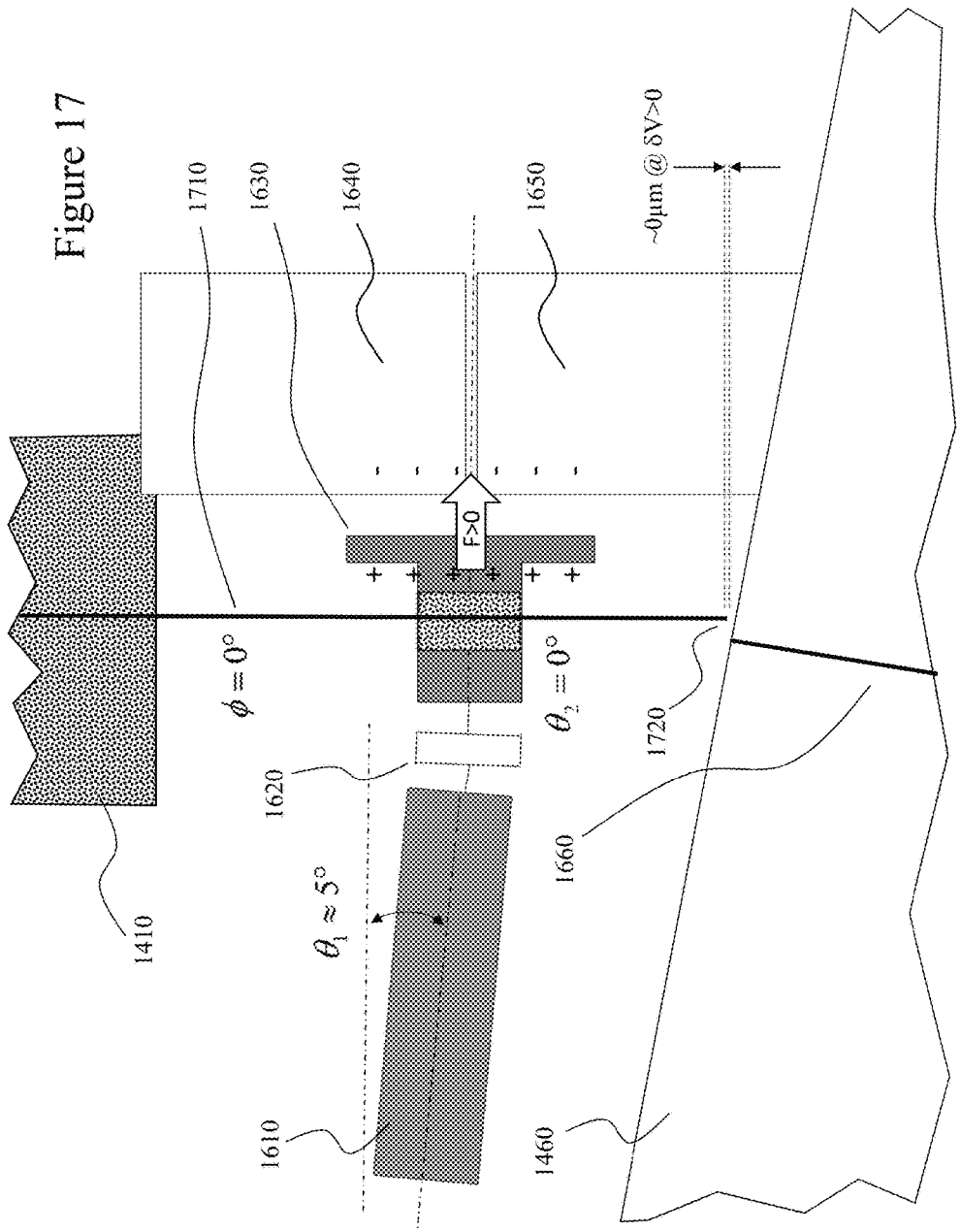

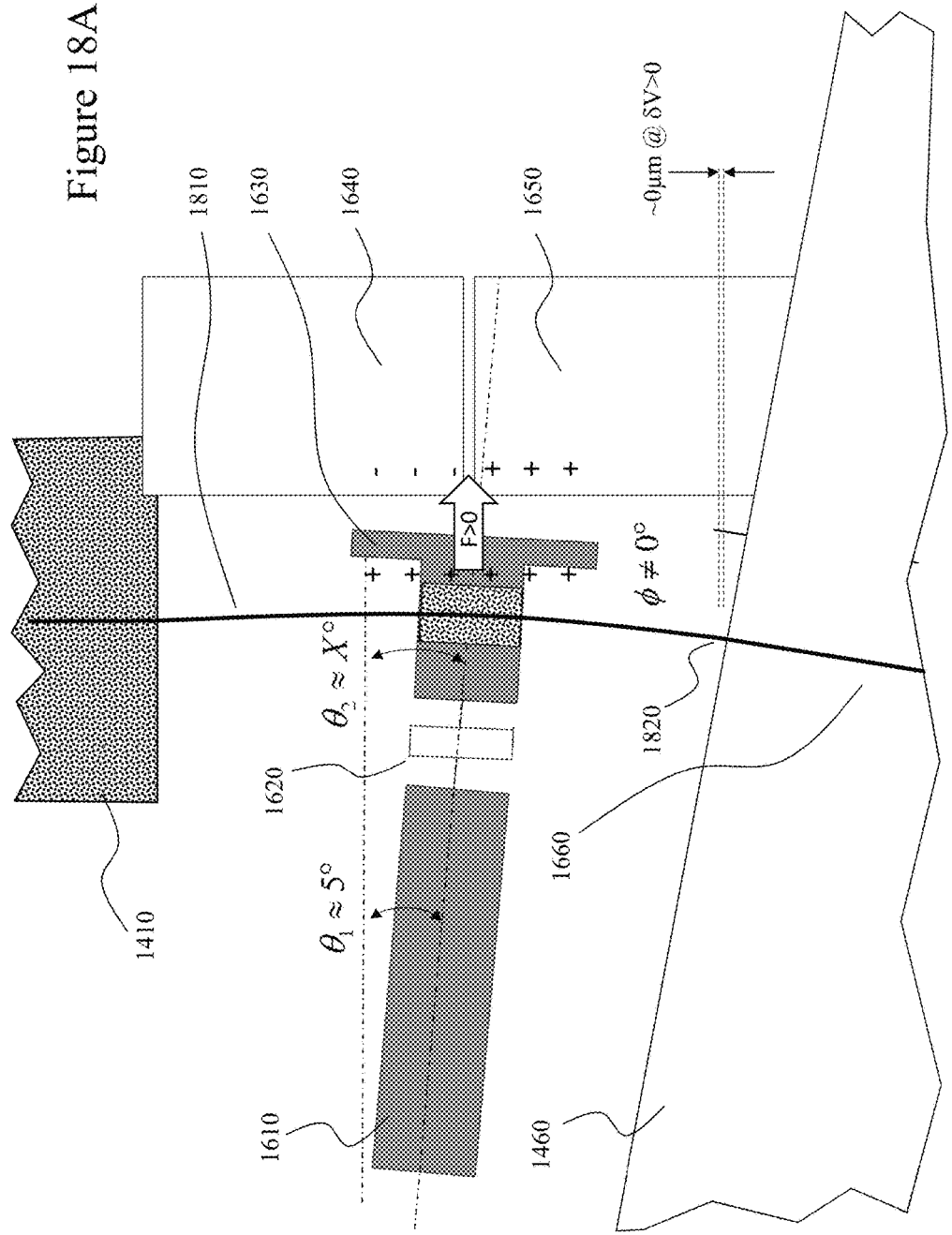

METHODS AND SYSTEMS FOR MICROELECTRONIC PACKAGING

CROSS-REFERENCE TO RELATED APPLICATIONS

This patent application claims the benefit of priority as a 371 National Phase Entry of Patent Cooperation Treaty Application PCT/CA2015/000,466 filed on Aug. 17, 2015 entitled "Methods and Systems for Microelectromechanical Packaging" which itself claims the benefit of priority from U.S. Provisional Patent Application 62/037,655 filed on Aug. 15, 2014 entitled "Methods and Systems for Microelectromechanical Packaging."

FIELD OF THE INVENTION

This invention relates to microelectromechanical systems (MEMS) and more particular to designs for optical component packaging and optical coupling employing MEMS devices as part of their design and/or for alignment.

BACKGROUND OF THE INVENTION

Silicon Photonics is a promising technology for reducing the cost structure of various optical components by leveraging the economies of scale of the microelectronics industry. In the same way as silicon CMOS circuits can be packaged using multiple die, then in principle so can silicon photonics devices. In order to optically interconnect a silicon photonics device to another device, various light energy transfer approaches have been developed based either on near field, far field or adiabatic coupling. Only near field edge coupling can provide for both low loss as well as for polarization diversity. However, to date, the packaging of photonic integrated circuits to support edge coupling has been restricted to active assembly and thus slow and very expensive as requiring light to perform the alignment. The passive packaging of silicon photonics devices has thus far been restricted to applications where higher optical losses can be tolerated. Even with the most innovative waveguide tapers, inverse tapers and mode (spot) size converters to perform mode field conversion and mode field diameter matching, it has been impossible up to now to perform the passive packaging of telecom grade photonic integrated circuits.

Silicon microelectromechanical systems (MEMS) are small integrated devices or systems that combine electrical and mechanical components within a single silicon die, although other material systems may be employed. The components can range in size from the sub-micrometer level to the millimeter level, and there can be any number, from one, to few, to potentially thousands or millions, in a particular system. Historically, MEMS devices have leveraged and extended the fabrication techniques developed for the silicon integrated circuit industry, namely lithography, doping, deposition, etching, etc. to add mechanical elements such as beams, gears, diaphragms, and springs to silicon circuits either as discrete devices or in combination with silicon electronics. Examples of MEMS device applications today include inkjet-printer cartridges, accelerometers, miniature robots, micro-engines, locks, inertial sensors, micro-drives, micro-mirrors, micro actuators, optical scanners, fluid pumps, transducers, chemical sensors, pressure sensors, and flow sensors. These MEMS systems can sense, control, and activate mechanical processes on the micro scale, and function individually or in arrays to generate effects on the macro scale and have become a successful actuating technology.

Accordingly, it would be beneficial to combine silicon MEMS based micro-actuators with silicon CMOS control and drive circuits in order to provide alignment of elements within a silicon optical circuit either with respect to each other or with other optical elements hybrid integrated with the silicon optical circuit. In this manner, active alignment of input and output SOI waveguides to an InP optical gain chip (or other SOI circuit) may be provided which may be either maintained as active during deployment of the optical component comprising these elements or removed once the alignment has been "locked" through an attachment/retention/latching process.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations in the prior art relating to microelectromechanical systems and more particular to designs and enhancements for MEMS mirrors and optical components exploiting such MEMS mirror elements.

In accordance with an embodiment of the invention there is provided a device comprising:
an optical waveguide structure;
a micro-positioner comprising a first portion for providing a motion of an arm of the micro-positioner under action of a first electrostatic actuator, the arm of the micro-positioner, and a second portion having attached to it a predetermined portion of the optical waveguide structure; and
a pivot located at a predetermined position on the arm of the micro-positioner such that motion of arm under the action of the first electrostatic actuator results in the arm pivoting about the pivot.

In accordance with an embodiment of the invention there is provided a device comprising an optical waveguide structure wherein a predetermined portion of the optical waveguide structure is to a second portion of the optical waveguide structure by a third portion of the optical waveguide structure which is unsupported and cantilevered over an air gap.

In accordance with an embodiment of the invention there is provided a device comprising an optical waveguide structure and a micro-positioner comprising a first portion for providing motion of an arm of the micro-positioner under action of a first electrostatic actuator, the arm of the micro-positioner, and a second portion having attached to it a predetermined portion of the optical waveguide structure.

In accordance with an embodiment of the invention there is provided a device comprising an optical waveguide structure and a micro-positioner wherein first and second portions of the micro-positioner are coupled via an element allowing angular motion of the second portion of the micro-positioner relative to the first portion of the micro-positioner.

In accordance with an embodiment of the invention there is provided a device comprising:
an optical waveguide structure;
a micro-positioner comprising a first portion for providing a motion of an arm of the micro-positioner under action of a first electrostatic actuator, the arm of the micro-positioner, and a second portion having attached to it a predetermined portion of the optical waveguide structure;

a pivot located at a predetermined position on the arm of the micro-positioner such that motion of the arm under the action of the first electrostatic actuator results in the arm pivoting about the pivot; and a second electrostatic actuator for providing electrostatic control of the angular orientation and the translational displacement of the second portion of the micro-positioner relative to the first portion of the micro-positioner separated by and after a spring actuator.

In accordance with an embodiment of the invention there is provided a method comprising of adjusting the coupling precision of displacing an optical waveguide whose position is determined as a function of an actuation rotation angle of a MEMS rotary actuator via the selection of a pivot point location and an arm length for a MEMS element attached to the MEMS rotary actuator to which the optical waveguide is attached but is unsupported over one or more sections of the optical waveguide either side of the arm In accordance with an embodiment of the invention there is provided a device comprising:

an optical waveguide structure;

a micro-positioner comprising a first portion for providing a motion of an arm of the micro-positioner under action of a first electrostatic actuator, the arm of the micro-positioner, and a second portion for supporting a predetermined portion of the optical waveguide structure;

a pivot located at a predetermined position on the arm of the micro-positioner such that motion of arm under the action of the first electrostatic actuator results in the arm pivoting about the pivot; and a plurality of actuators which can provide the micro-positioner translational planar displacement relative to the optical waveguide structure.

In accordance with an embodiment of the invention there is provided a device comprising:

an optical waveguide structure;

a micro-positioner comprising a first portion for providing a motion of an arm of the micro-positioner under action of a first electrostatic actuator, the arm of the micro-positioner, and a second portion for supporting a predetermined portion of the optical waveguide structure;

a pivot located at a predetermined position on the arm of the micro-positioner such that motion of arm under the action of the first electrostatic actuator results in the arm pivoting about the pivot; and a second micro-positioner disposed in predetermined relationship relative to the micro-positioner such that under tandem action of the first and second micro-positioners a predetermined location within an optical waveguide forming a predetermined portion of the optical waveguide structure can be moved over a first predetermined range of lateral motion and a second predetermined range of angular motion.

In accordance with an embodiment of the invention there is provided a device comprising:

an optical waveguide structure;

a micro-positioner comprising a first portion for providing a motion of an arm of the micro-positioner under action of a first electrostatic actuator, the arm of the micro-positioner, and a second portion for supporting a predetermined portion of the optical waveguide structure;

a pivot located at a predetermined position on the arm of the micro-positioner such that motion of arm under the action of the first electrostatic actuator results in the arm pivoting about the pivot; and an optical component disposed upon an optical bench carrier substrate of the device for providing an optical function in conjunction with the optical waveguide structure, wherein the first micro-positioner allows an optical waveguide forming a predetermined portion of the optical waveguide structure to be aligned in at least one of angle and lateral position relative to a second optical waveguide forming a predetermined portion of the optical component.

In accordance with an embodiment of the invention there is provided a device comprising:

an optical waveguide structure;

a micro-positioner comprising a first portion for providing a motion of an arm of the micro-positioner under action of a first electrostatic actuator, the arm of the micro-positioner, and a second portion for supporting a predetermined portion of the optical waveguide structure;

a pivot located at a predetermined position on the arm of the micro-positioner such that motion of arm under the action of the first electrostatic actuator results in the arm pivoting about the pivot;

a second micro-positioner disposed in predetermined relationship relative to the micro-positioner such that under the tandem action of the first and second micro-positioners a predetermined location within an optical waveguide forming a predetermined portion of the optical waveguide structure can be moved over a first predetermined range of lateral motion and a second predetermined range of angular motion; and an optical component disposed upon a substrate of the device for providing an optical function in conjunction with the optical waveguide structure, wherein the first and second micro-positioners allow an optical waveguide forming a predetermined portion of the optical waveguide structure to be aligned to a second optical waveguide forming a predetermined portion of the optical component.

According to an embodiment of the invention there are provided a plurality of micro-positioners to extend or compress in a telescopic matter an optical waveguide structure whereas the optical waveguide structure has multiple attachment anchors to a plurality of MEMS based micro-positioner arms.

According to an embodiment of the invention there is provided a device comprising an optical waveguide structure that is either U-shaped or S-shaped waveguide and anchored on one end to a first MEMS based micro-positioner and the second end to the second MEMS based micro-positioner.

According to an embodiment of the invention there is provided a device comprising an optical waveguide structure can be manipulated to reduce an optical gap between the optical waveguide structure and another optical waveguide structure mounted to at least one of a common carrier with the optical waveguide structure and the optical waveguide structure.

According to an embodiment of the invention there is provided a device employing at least one of a U-shaped and S-shaped waveguide to improve geometrical uniformity of the optical waveguide structure along the light propagation axis while it is being extended or compressed under the action of a MEMS based micro-positioner.

According to an embodiment of the invention there is provided a device comprising: an optical bench carrier substrate;

an optical waveguide forming part of an optical waveguide structure formed upon the carrier substrate;

a plurality of pads of a predetermined material formed upon the substrate with predetermined positions relative to a facet of the optical waveguide; and an optical component disposed upon a substrate of the device for providing an optical function in conjunction with the optical waveguide structure, wherein the plurality of pads under electrical control provide for a relative motion of the optical component relative to the optical waveguide in a direction substantially perpendicular to the carrier substrate.

According to an embodiment of the invention there is provided an optical bench carrier substrate wherein an optical component is either flip-mounted to the plurality of pads or inserted into a recess within the carrier substrate and mounted to the plurality of pads which are at the bottom of the recess.

According to an embodiment of the invention there is provided an optical bench carrier substrate wherein a plurality of optical components monolithically integrated into an optical photonic circuit are wafer level bonded onto the optical bench carrier substrate and mounted respectively to a plurality of pads which are at the bottom of the recess.

According to an embodiment of the invention there is provided device comprising: an optical bench carrier substrate;

an optical waveguide forming part of an optical waveguide structure formed upon the carrier substrate;

a comb drive microelectromechanical (MEMS) element; and an optical component disposed upon a carrier substrate of the device for providing an optical function in conjunction with the optical waveguide structure, wherein the MEMS element provides for a relative motion of the optical component relative to the optical waveguide in a direction substantially perpendicular to the optical bench carrier substrate.

According to an embodiment of the invention there is provided device comprising a comb drive microelectromechanical (MEMS) element that is one of a plurality of MEMS elements, wherein the plurality of MEMS elements allow for at least one of:

different vertical motion of at least one of a first end of the optical component and a second distal end of the optical component; and for roll adjustment of at least one of the first end of the optical component and the second distal end of the optical component; and.

for translational adjustment of at least one of the first end of the optical component and a second distal end of the optical component.

According to an embodiment of the invention there is provided a device comprising: a first MEMS actuator for providing rotary motion of an element of the device; and a second MEMS actuator for selectively locking and unlocking the first MEMS actuator.

According to an embodiment of the invention there is provided a device comprising:

a first MEMS actuator for providing rotary motion of an element of the device; and a second MEMS actuator for selectively locking and unlocking the first MEMS actuator, wherein the first MEMS actuator has a first element which engages an opening within a plurality of openings within the second MEMS actuator when the second MEMS actuator is not actuated and can rotate when the second MEMS actuator is actuated as a second element forming a predetermined portion of the second MEMS actuator moves the plurality of openings away from the first element.

According to an embodiment of the invention there is provided a device comprising:

a first MEMS actuator for providing rotary motion of an element of the device; and a second MEMS actuator for selectively locking and unlocking the first MEMS actuator, wherein.

the first MEMS actuator has a plurality of first elements of which one engages an opening within the second MEMS actuator when the second MEMS actuator is not actuated and can rotate when the second MEMS actuator is actuated as a second element forming a predetermined portion of the second MEMS actuator moves the opening away from the plurality of first elements.

According to an embodiment of the invention there is provided a device comprising: an optical waveguide structure;

a first micro-positioner comprising a first portion for providing a motion of an arm of the micro-positioner under action of a first electrostatic actuator, the arm of the micro-positioner, and a second portion for supporting a predetermined portion of the optical waveguide structure; wherein the optical waveguide structure either side of the predetermined portion of the optical waveguide structure is unsupported.

According to an embodiment of the invention there is provided a device comprising a first micro-positioner comprising a first portion for providing a motion of an arm of the micro-positioner under action of a first electrostatic actuator, the arm of the micro-positioner, and a second portion for supporting a predetermined portion of an element disposed atop the second portion, wherein the second portion varies in thickness along a predetermined portion of its length such that actuation of the first electrostatic actuator moves the second portion relative to the element thereby adjusting the vertical position of the element.

According to an embodiment of the invention there is provided a device comprising:

an optical die flip-chip mounted to a micro-optical-electromechanical systems (MOEMS) carrier, the optical die comprising:
  a compound semiconductor optical element formed within a compound semiconductor; and
  an optical waveguide structure formed within a high refractive material bonded to the surface of the compound semiconductor optical element and coupled to the compound semiconductor optical element;

the MOEMS carrier comprising:
  an optical waveguide structure;
  a micro-positioner comprising a first portion for providing a motion of an arm of the micro-positioner under action of a first electrostatic actuator, the arm of the micro-positioner, and a second portion having attached to it a predetermined portion of the optical waveguide structure; and
  a pivot located at a predetermined position on the arm of the micro-positioner such that motion of arm under the action of the first electrostatic actuator results in the arm pivoting about the pivot.

According to an embodiment of the invention there is provided a method for modifying an active semiconductor optical element by providing a high refractive index layer on an upper surface of a compound semiconductor wafer comprising the active semiconductor optical element and processing the high refractive index layer such that it forms a waveguide taper optically coupled to the active semiconductor optical element.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIGS. 16 to 18A depict the configuration and manipulation of a silicon nitride-on-silicon waveguide within a MOEMS exploiting MEMS micro-positioners according to an embodiment of the invention;

DETAILED DESCRIPTION

The present invention is directed to microelectromechanical systems (MEMS) and more particular to designs for optical component packaging and optical coupling employing MEMS devices as part of their design and/or for alignment.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Wavelength Tunable Optical Source

Figure 1A:
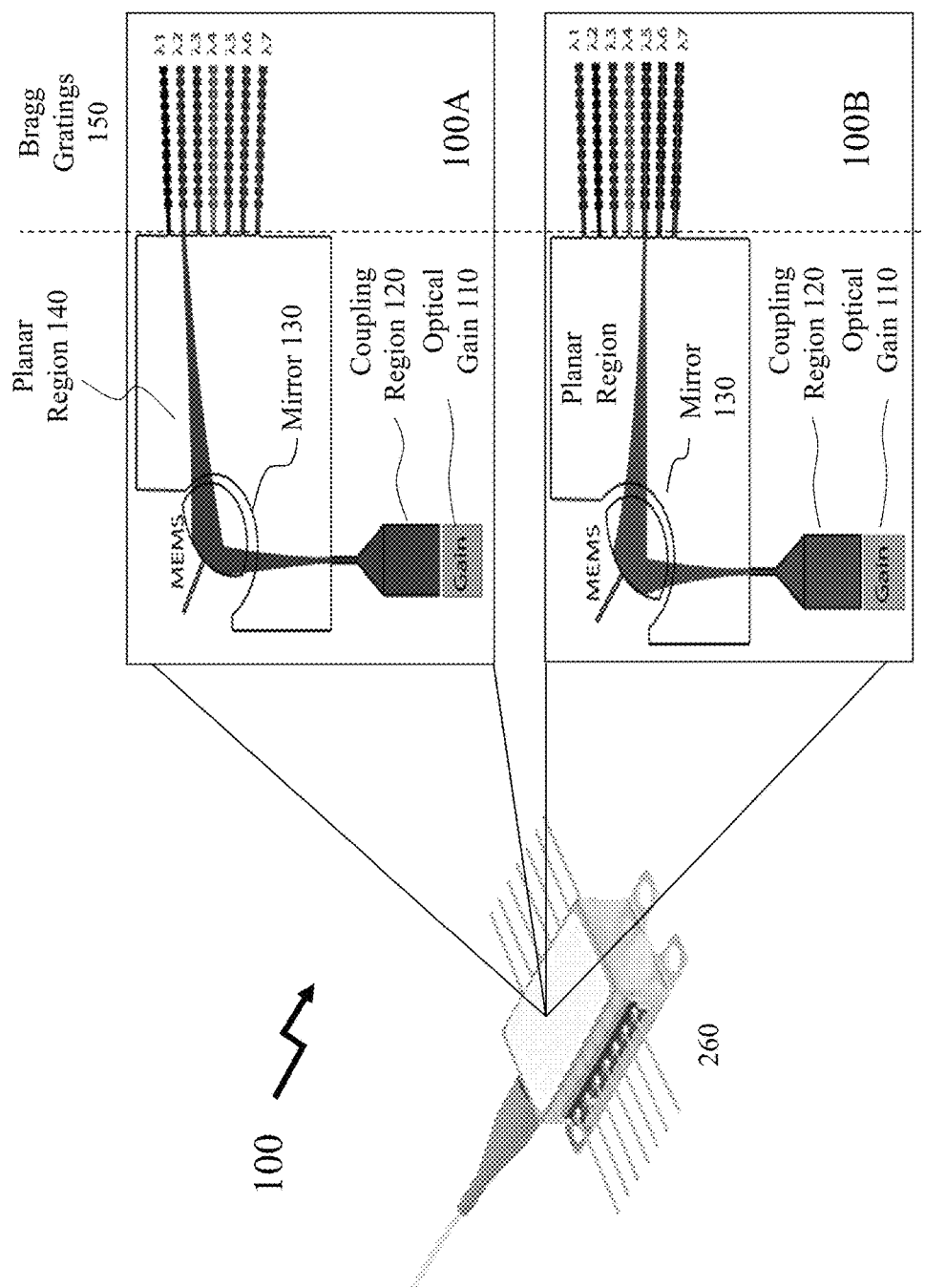
FIGS. 1A and 1B depict a wavelength tunable source according to an embodiment of the invention together with examples of silicon-on-insulator waveguide technologies for its implementation.

Wavelength tunable optical sources and/or receivers have significant benefit in the provisioning of transmitters, receivers, and transceivers within todays optical communication networks and evolving requirements for optical networks with dynamic wavelength allocation, reduced installation complexity, single line card designs, and reconfigurability. Within the prior art several approaches have been employed to date and whilst these have demonstrated high performance transmitters they suffer limitations such as assembly complexity, achievable performance, and high cost. However, referring to FIG. 1 there is depicted an alternate configuration 100 for an ECL exploiting silicon photonics and MEMS is depicted in first and second schematics 100A and 100B respectively. Accordingly, an optical gain element 110 is coupled via a coupling region 120 to planar waveguide region 140. The diverging optical signal from the optical gain element 110 is coupled to a selected Bragg grating within an array of Bragg reflectors 150 via the planar waveguide region 140 and MEMS mirror 130 wherein the design of the MEMS mirror 130 is such that the optical signal is coupled re-focused to the plane of the waveguides forming part of the Bragg gratings within the array of Bragg reflectors 150. It would be evident that in addition to wavelength tunable transmitters the approach of a MEMS mirror in conjunction with an array of Bragg reflectors may also form part of wavelength tunable receivers, reconfigurable optical add-drop multiplexers (ROADMs), wavelength selective optical switches, and other wavelength selective structures, for example.

Optical Waveguide Technologies

According to embodiments of the invention, the substrate of choice is usually silicon due to the availability of standard MEMS fabrication processes, prototyping facilities, and production operations, e.g. MUMPs (Multi-User MEMS Processes) from MEMSCAP, Sandia National Laboratories SUMMiT V processes, Teledyne DALSA's Multi-Project Wafer "Shuttle" runs and production facilities, and STMicroelectronics high volume MEMS manufacturing facilities for example.

Silicon Nitride Core Waveguide Platform

Amongst the optical waveguide technology options for optical waveguides in the telecommunication windows at 1300 nm & 1550 nm are silicon nitride ($Si_3N_4$) cored waveguides with silicon dioxide ($SiO_2$) cladding. An example of such a waveguide geometry is depicted in first waveguide cross-section 100C in FIG. 1B which may be employed according to embodiments of the invention. Accordingly, the optical waveguide 1000 comprises a 5 µm lower silicon dioxide 230 cladding, a 70 nm silicon nitride ($Si_3N_4$) 240 core, and a 5 µm upper silicon dioxide 230 cladding. The waveguide cross-section 100D is depicted where the optical waveguide couples via the air gap to the MEMS mirror (MEMSM) 1100. As the optical waveguide is ≈10 µm thick the MEMSM 1100 at the air gap interface may be the same material structure atop an actuated silicon (Si) MEMS structure formed within the Si substrate. The optical waveguide 1100 has below it before the Si substrate a layer of polyimide which is also etched back to form part of the pivot for the MEMSM 1100. Deposited onto the vertical end wall of the optical waveguide 1000 and wall of the MEMSM 1100 are anti-reflection coatings.

Silicon on Insulator Waveguide Platform

Figure 1B:
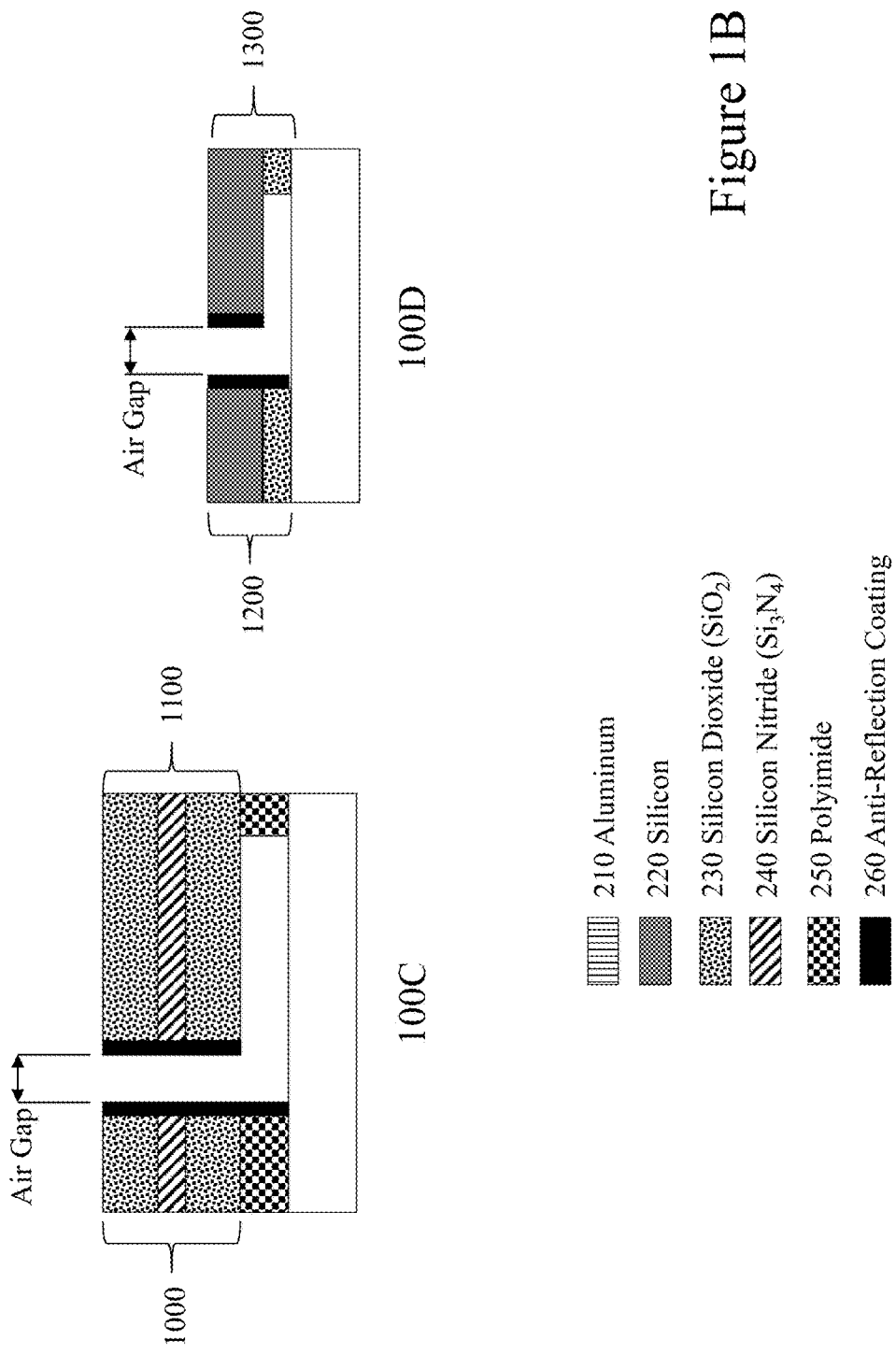

Amongst the optical waveguide technology options for optical waveguides in the telecommunication windows at 1300 nm & 1550 nm are silicon-on-insulator waveguides with air cladding at the top and silicon dioxide ($SiO_2$) cladding at the bottom Referring to second waveguide cross-section 100D in FIG. 1B there is depicted a waveguide geometry 1200 according to an embodiment of the invention comprising a lower silicon dioxide ($SiO_2$) 230 lower cladding, a silicon 220 core, and relying on the refractive index of air or another material to confine total internal reflection. The waveguide cross-section 100D is similarly depicted where the optical waveguide 1200 couples via the air gap to the MEMSM 1300.

However, due to the high refractive index of Si the thickness limit of the silicon (Si) for a single-mode waveguide is 220 nm which is too thin for MEMS devices. However, at a thickness of 1 µm 5 modes exist within a silicon planar waveguide having modal indices of n=3.405, 3.203, 2.845, 2.281, 1.487 and accordingly a rib waveguide geometry may be employed in order to select the fundamental mode. Accordingly, the MEMSM 1300 for 1 µm Si may be formed from the same material. Due to the refractive indices the anti-reflection (AR) layer on the air gap of the optical waveguide 1200 and MEMSM 1300 can be formed from parylene with a refractive index of 1.66. The thickness of the AR coating would be, in this instance, 233 nm thick.

MEMS & Optical Waveguide Manufacturing Process Flow—Silicon Nitride Core

An exemplary manufacturing sequence is presented and described below in respect of FIGS. 2 to 5 exploiting standard Si manufacturing processes and Si MEMS technology in order to fabricate a MEMS mirror (MEMSM) together with an array of waveguide Bragg reflectors and optical waveguides. Whilst the process flow is for $Si_3N_4$ the process flow for Si and other optical waveguide—MEMS platforms upon silicon would be very similar. For the Si process flow there is clearly no requirement to deposit and pattern the $SiO_2$—$Si_3N_4$—$SiO_2$ waveguides whilst in others such as silicon oxynitride, polymer, spin-on-glass, and doped $SiO_2$ deposition and patterning steps would be present. Structures combining MEMS elements and optical elements are commonly referred to as micro-optical-electromechanical systems (MOEMS).

Figure 2:
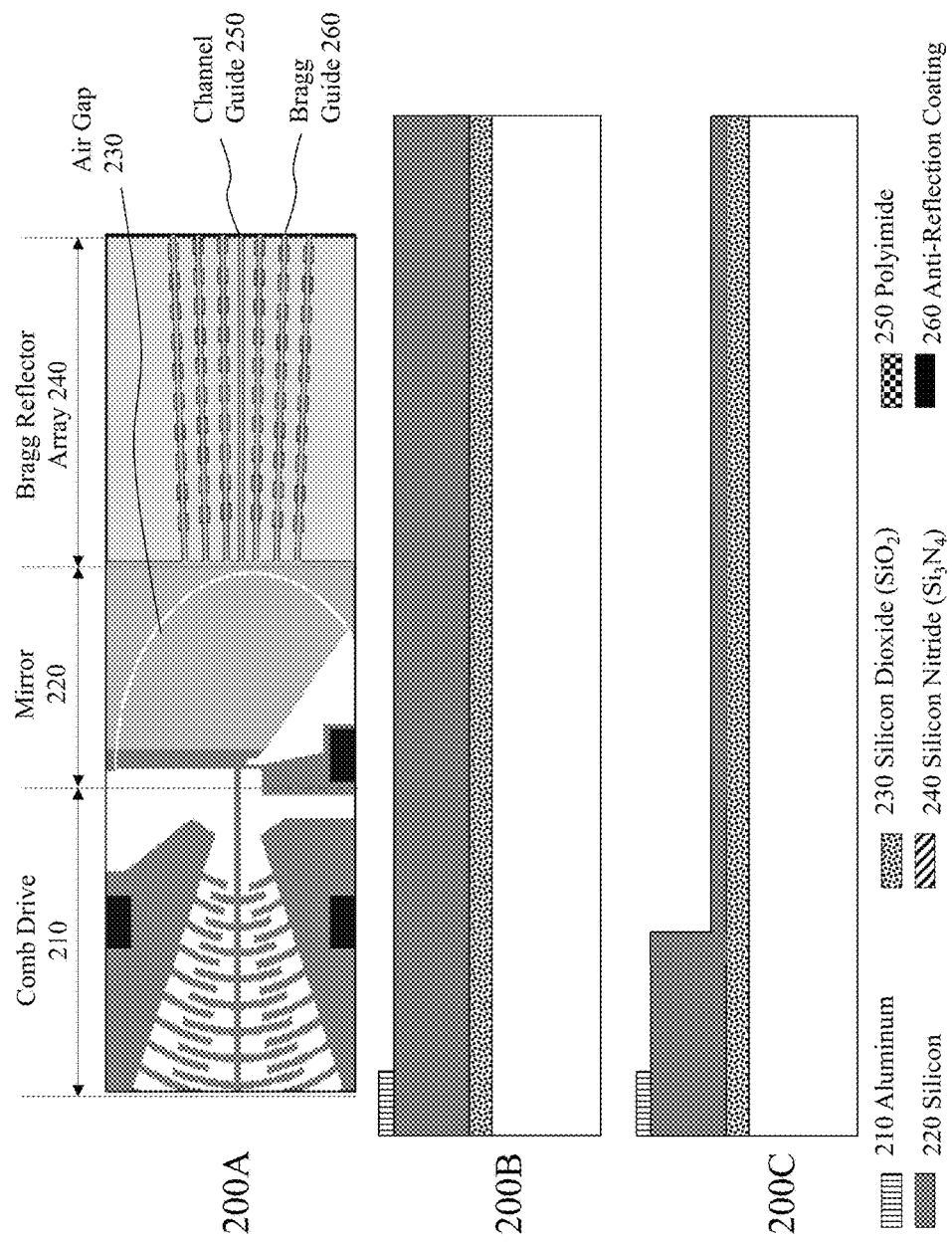
FIGS. 2 through 5 depict an exemplary process flow for the manufacture of a MEMS mirror actuated Bragg waveguide interrogator exploiting silicon nitride waveguides according to an embodiment of the invention.

Referring to first schematic 200A in FIG. 2 there is depicted a plan view of a MOems-TUunable Silicon (MOTUS) optical engine comprising a semi-circular MEMS mirror (SC-MEMSM) 220 attached to a comb drive 210 and then a Bragg reflector array 240 comprising a central channel waveguide 250 which couples light into and out of the wavelength dependent reflector circuit and arrays of Bragg waveguides 260 disposed either side of the channel waveguide. In other embodiments of the wavelength dependent reflector circuit the Bragg waveguides 660 may be disposed symmetrically either side of the channel waveguide, asymmetrically with different channel counts either side of the channel waveguide, and asymmetrically to one side of the channel waveguide. Such design considerations may be based upon factors including, but not limited to, the angular rotation range of the SC-MEMSM 620, the number of wavelength channels, the design of the MEMS comb drive 210, and the design of the electrostatic driver circuit for the MEMS comb drive 210.

Accordingly, referring to second schematic 200B in FIG. 2 a cross-section of the MOTUS circuit is depicted in cross-sectional view comprising silicon dioxide (SiO2) 230, silicon (Si) 220, and aluminum (Al) 310 which has already been patterned and etched. Considering a typical silicon-on-insulator (SOI) substrate then the Si 220 is 5 µm thick. The Al 310 may be sputtered with a thickness of 300 nm which after patterning through a lithography process may be removed using a standard Al wet etch process. Subsequently in third schematic 200C the MOTUS circuit is depicted after the exposed Si 220 has been pattered lithographically and deep etched to remove 4.5 µm using a deep reactive ion etching (DRIE) process using sulphur hexafluoride ($SF_6$) and octafluorocyclobutane ($C_4F_8$) after which the resist is stripped.

Figure 3:
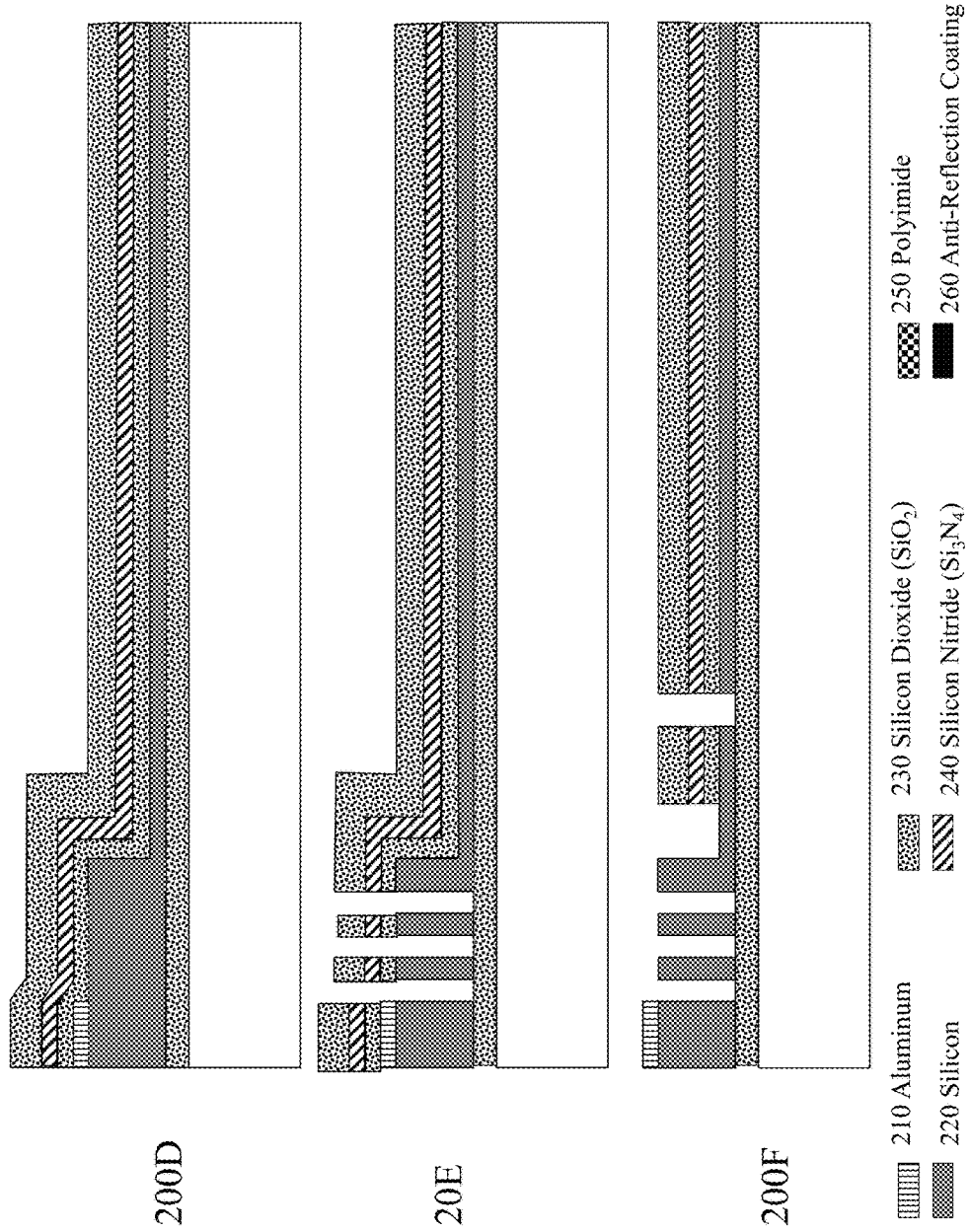

Now referring to fourth schematic 200D in FIG. 3 the optical waveguide layer stack is deposited comprising 4 µm $SiO_2$ 230, 100 nm silicon nitride ($Si_3N_4$) 240, and 4 µm $SiO_2$ 230 according to another design embodiment of the $Si_3N_4$ waveguide platform rather than the 5 µm·$SiO_2$—70 nm $Si_3N_4$—5 µm·$SiO_2$ described supra in respect of FIG. 3. The deposition being for example through chemical vapour deposition (CVD).

Next in fifth schematic 200E in FIG. 3 the MOTUS circuit is depicted after the optical waveguides and comb drive openings have been defined, using a DRIE etching process with a $SF_6$—$C_4F_8$—Argon (Ar) process having an aspect ratio of 1:1.6 to etch the 4 µm $SiO_2$ 230—100 nm silicon nitride ($Si_3N_4$) 240—4 µm $SiO_2$ 230 stack, and the comb drive has been defined using a DRIE etching process with a $SF_6$—$C_4F_8$ process having an aspect ratio of 1:1 to etch the 5 µm Si 220.

Subsequently in sixth schematic 200F in FIG. 3 the MOTUS circuit cross-section is depicted after the air gap has been formed and the excess regions of the optical waveguides atop the comb drive etc. have been removed. These steps are achieved using a DRIE etching process with a $SF_6$—$C_4F_8$—Argon (Ar) process having an aspect ratio of 1:8 to etch the $SiO_2$ 230—$Si_3N_4$ 240—$SiO_2$ 230 stack, and the comb drive has been defined using a DRIE etching process with a $SF_6$—$C_4F_8$ having an aspect ratio of 2:1 to etch the 0.5 µm Si 220. Whereas the preceding steps were carried out with a critical dimension of approximately 5 µm the photolithography for the air gap processes have a critical dimension of approximately 1 µm. Next in seventh schematic 200G in FIG. 4 the Bragg grating sections of the optical Bragg reflectors are photolithographically defined and etched using a DRIE etching process with a $SF_6$—$C_4F_8$—Argon (Ar) process having an aspect ratio of 1:8 to partially etch the upper cladding comprising SiO2 230.

Alternatively, the process sequence resulting in fifth and sixth schematics 200E and 200F may be reversed such that the waveguide is first removed above the MEMS actuator part and then it would be patterned using a more optimized mask. Now referring to eighth schematic 200H in FIG. 4 a reflective layer, gold (Au) 380, is deposited and patterned onto the SC-MEMSM mirror sidewalls and anti-reflection (AR) coatings are deposited and patterned onto the SC-MEMSM mirror sidewall and optical waveguide sidewall either side of the air gap. The AR coating may be magnesium fluoride, $MgF_2$, for example with a thickness of 280 nm. Subsequently as depicted in ninth schematic 200I the front surface of the MOTUS circuit is protected for wafer backside processing steps that follow. Accordingly, polyimide 350 with a thickness of 5 µm may be spin-coated onto the wafer and cured, e.g. 300° C. for 2 hours. Optionally at this point the substrate may also be thinned using Chemical Mechanical Polishing (CMP) for example. Polyimide 350 may, optionally, be photoresist rather than polyimide.

Figure 4:
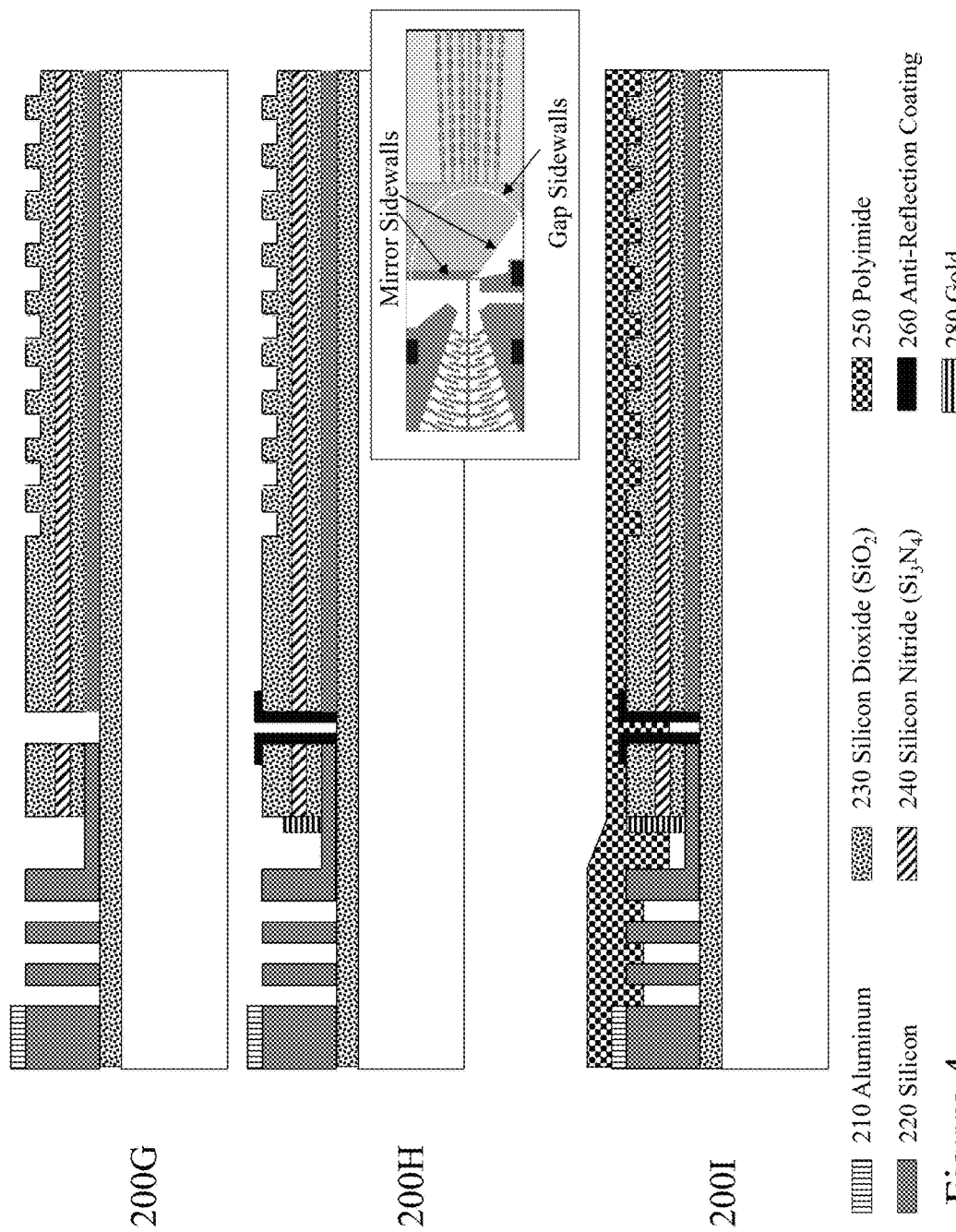
Figure 5:
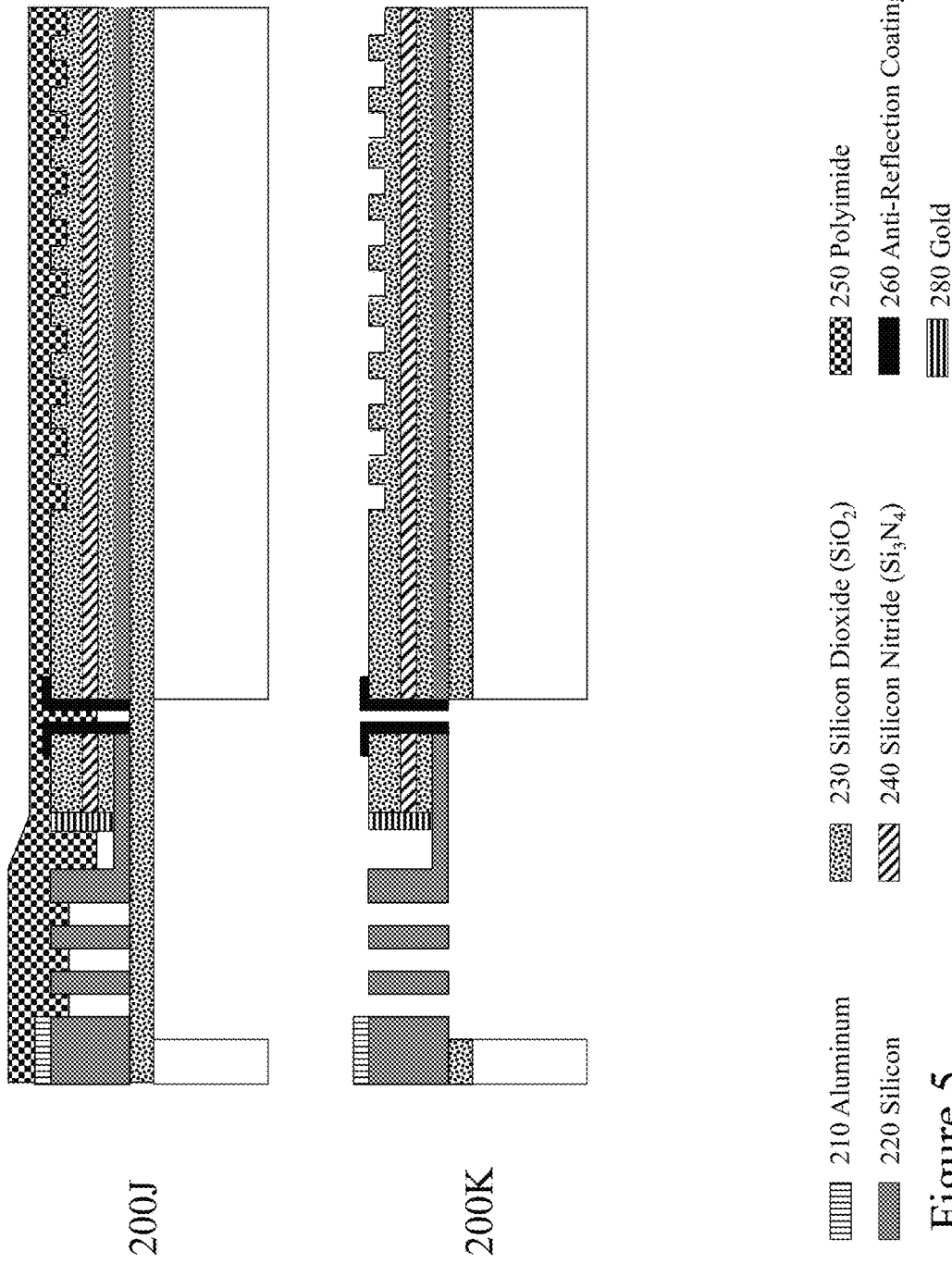

In ninth schematic 200I in FIG. 4 the substrate, e.g. silicon, is lithographically processed to define the trench below the MEMS comb drive and SC-MEMSM sections of the MOTUS circuit. This may, for example, be via a DRIE using $SF_6$—$C_4F_8$ stopping at the $SiO_2$ 220 layer. Then in tenth schematic 200J in FIG. 5 the $SiO_2$ 220 is etched from the backside using an ME process, for example, followed by resist stripping, wafer dicing, polyimide removal by plasma ashing, for example, and mechanical polishing of the MOTUS circuit die sidewall for connection between the channel waveguide and optical fiber, as shown in schematic 200K.

Semi-Circular Mems Mirror (SC-MEMSM) & Actuator Design

As discussed supra in respect of the MOTUS an optical signal is coupled from an initial optical waveguide to a MEMS mirror wherein it is reflected and coupled to a subsequent optical waveguide having a Bragg grating formed within. The reflected optical signals from the Bragg grating then traverse the reverse path. Accordingly, the MEMS mirror rotates to couple to different optical waveguides with different Bragg gratings and thence provide the required wavelength tunability. In order to minimize losses, the optical signal is maintained in waveguides all the way through this process and accordingly the region between the ends of the waveguides and the mirror is a waveguide as well. This results in a SC-MEMSM so that the mirror can rotate, the optical signal is maintained within the waveguide, and the waveguide can rotate relative to the channel waveguide section of the MOTUS optical engine.

Figure 6:
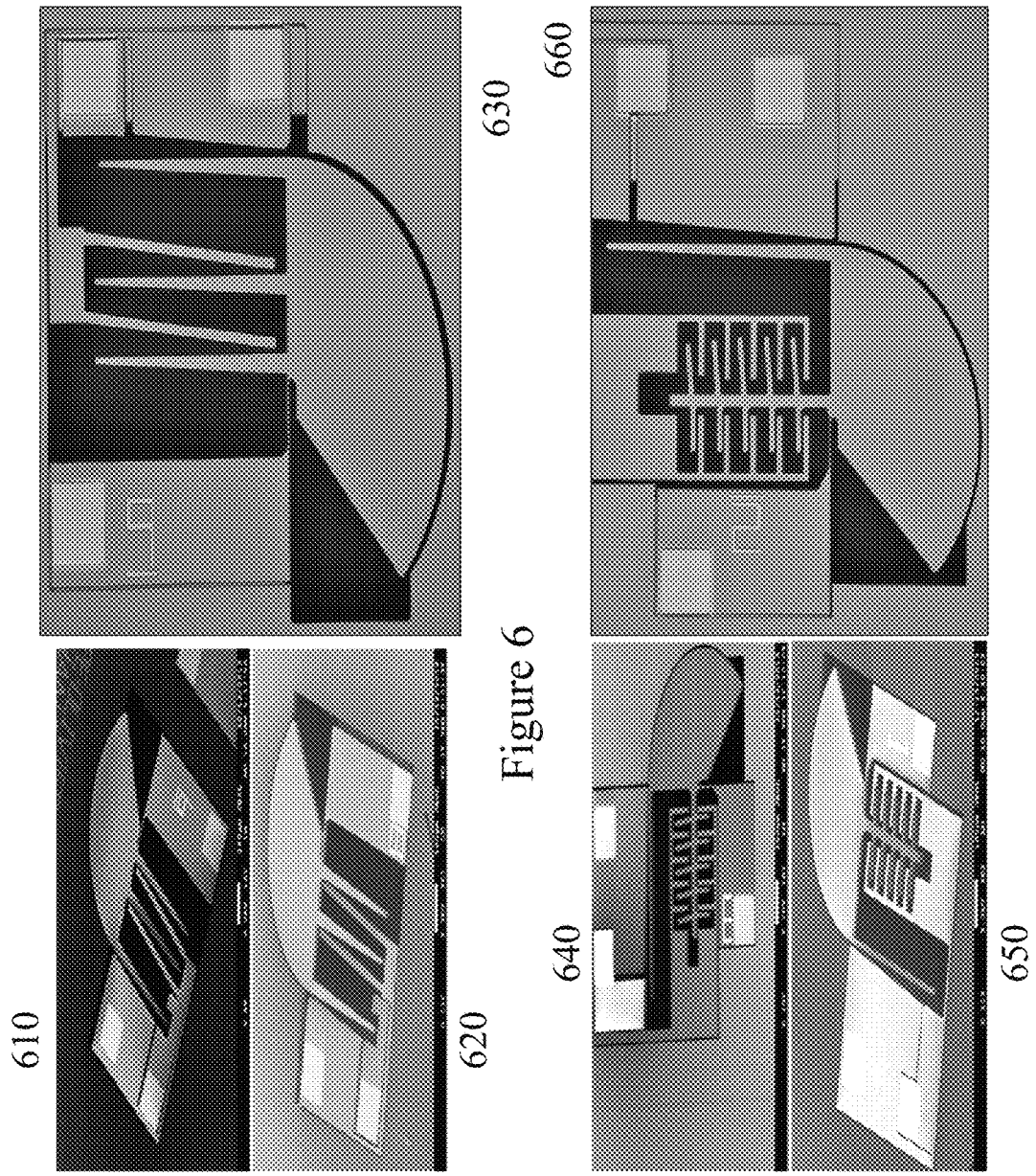
FIG. 6 depicts exemplary fabricated MEMS mirrors with their electrostatic comb actuators according to an embodiment of the invention.

Accordingly, referring to FIG. 6 and first to third images 610 to 630 respectively there is depicted a semi-circular MEMS mirror (SC-MEMSM) design according to an embodiment of the invention exploiting electrostatic actuation with slanted fingers. Accordingly, as designed the SC-MEMSM will rotate when the 8 µm SC-MEMSM fingers are electrostatically attracted to the drive contacts. The SC-MEMSM finger adjacent the solid $V_{DD}$ electrode is angled at 4.5° whilst the other SC-MEMSM fingers adjacent $V_{DD}$ electrode fingers are angled at 6°. The disc of the SC-MEMSM subtends an arc of 135° and is attached via a 3 µm pivot element to the $V_{SS}$ electrode. Towards the end of the solid $V_{DD}$ electrode by the SC-MEMSM finger a stopper electrode is provided which is selectively biased to $V_{SS}$.

Referring to fourth to sixth images 640 to 660 respectively in FIG. 6 there is depicted a SC-MEMSM design according to an embodiment of the invention exploiting electrostatic actuation with a comb drive and slanted fingers. Accordingly, as designed the SC-MEMSM will rotate when the 11 µm SC-MEMSM fingers within the comb drive are electrostatically attracted to the drive contacts. The SC-MEMSM also comprises a SC-MEMSM finger adjacent the solid $V_{DD}$ electrode is angled at 4.5° whilst the SC-MEMSM comb drive fingers that rotate are angled at 6° where these are attracted towards the other comb drive fingers (right-hand side) and are not angled where these will be repelled away from the other comb drive fingers (left-hand side). The disc of the SC-MEMSM subtends an arc of 135° and is attached via a 3 µm pivot element to the $V_{SS}$ electrode. Towards the end of the solid $V_{DD}$ electrode by the 8 µm SC-MEMSM finger a stopper electrode is provided which is selectively biased to $V_{SS}$.

Hybrid Semiconductor Integration

As discussed supra in respect of embodiments of the invention the MOTUS optical engine has been described as forming part of optical components including a wavelength tunable optical receiver and a wavelength tunable optical source. In this latter instance, the MOTUS optical engine is employed in conjunction with an optical gain medium, such as a semiconductor optical amplifier (SOA), providing a semiconductor optical gain block (SOG-BLOC). If the SOG-BLOC has both facets with low reflectivity then it acts as an optical amplifier. If, alternatively, it has one facet with low reflectivity and another facet with high reflectivity then if the facet with low reflectivity is coupled via the MOTUS optical engine to a wavelength selective reflector then the resulting wavelength dependent optical cavity will oscillate and lase at the wavelength defined by the wavelength selective reflector. With a MOTUS optical engine the resulting laser will be programmable in wavelength according to each of the Bragg reflectors selected through the SC-MEMSM.

Figure 7:
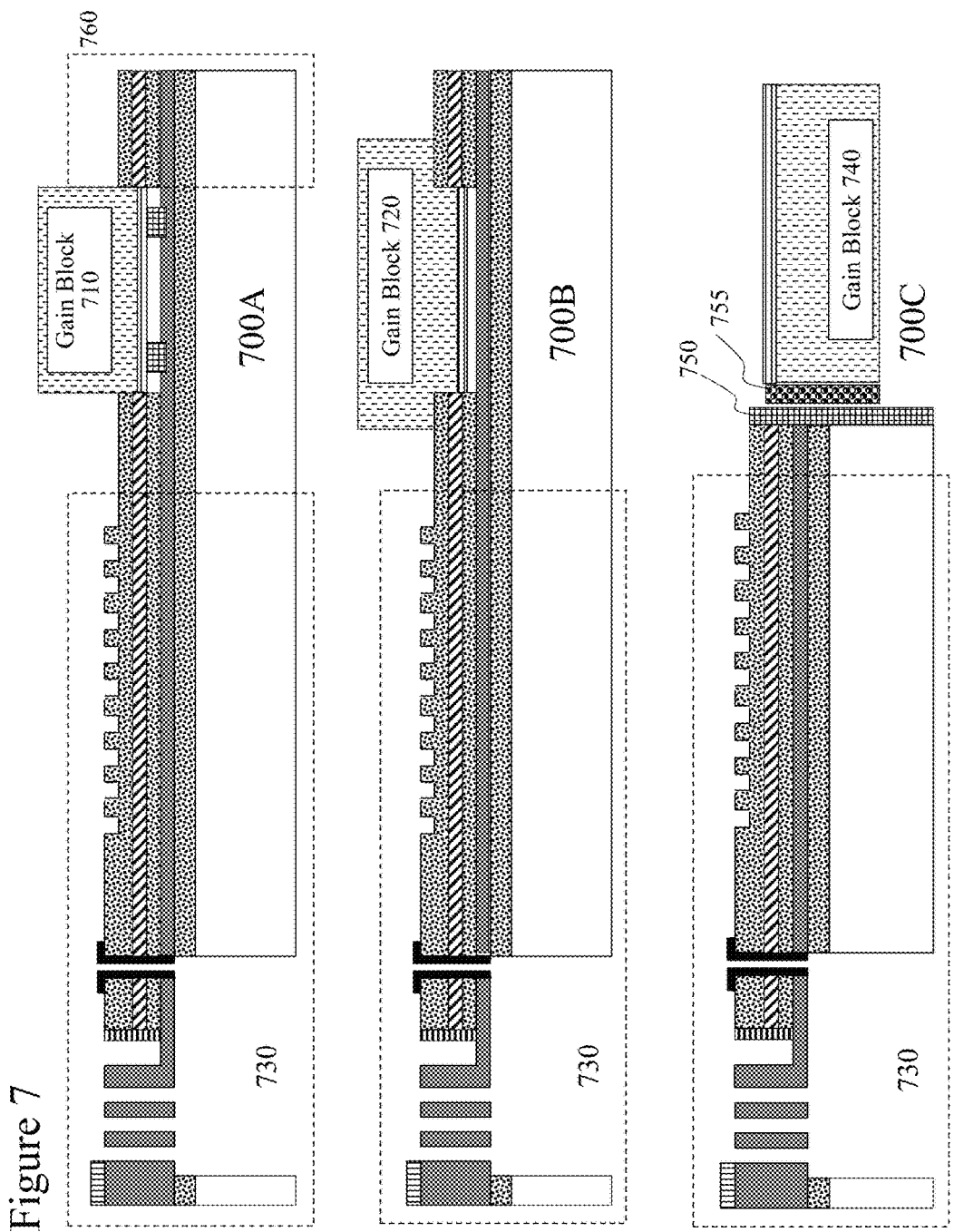
FIG. 7 depicts cross-sections through wavelength selective optical engines according to an embodiments of the invention for hybrid flip-chip assembly and butt-coupling of a semiconductor optical gain block with silicon nitride core waveguides.

As the MOTUS optical engine is based upon MEMS devices exploiting silicon on insulator substrates within the embodiments of the invention described supra then it would be evident that the semiconductor optical gain block may be integrated onto the MOTUS optical engine. Referring to FIG. 7 there are depicted first to third schematics 700A, 700B, and 700C respectively for the integration of a semiconductor optical gain block with a MOTUS optical engine 730 exploiting a $SiO_2$—$Si_3N_4$—$SiO_2$ waveguide upon a silicon-on-insulator (SOI) substrate. In first schematic 700A a gain block 710, which typically comprises an InGaAsP stack upon an InP substrate which is etched to form a rib or rib-loaded waveguide, has deposited upon it alignment features which key to features etched into the silicon underlying the $SiO_2$—$Si_3N_4$—$SiO_2$ waveguide. Accordingly, the position of the gain block 710 is laterally defined by the features etched into the silicon which may be provided as part of the same processing sequence as the formation of the MOTUS optical engine. The vertical position of the gain block 710 relative to the $SiO_2$—$Si_3N_4$—$SiO_2$ waveguide is determined by the features etched into the silicon, the alignment features deposited onto the gain block 710, and the tolerances of the $SiO_2$—$Si_3N_4$—$SiO_2$ waveguide layers.

In second schematic 700B a gain block 720 is aligned to an optical waveguide formed within a $SiO_2$—$Si_3N_4$—$SiO_2$ waveguide. In this instance, the vertical alignment of the optical waveguide within the gain block 720 to the $SiO_2$—$Si_3N_4$—$SiO_2$ waveguide is determined by the depth of the InP substrate etching of the gain block 720 and the $SiO_2$—$Si_3N_4$—$SiO_2$ waveguide tolerances whilst lateral alignment is achieved through physical features formed within the $SiO_2$—$Si_3N_4$—$SiO_2$ structure and the gain block 720 but now these are solely for lateral alignment. In third schematic 700C there is depicted a third schematic 700C for the integration of a semiconductor optical gain block, gain block 740, with a MOTUS optical engine 730 exploiting a $SiO_2$—$Si_3N_4$—$SiO_2$ waveguide upon a silicon-on-insulator (SOI) substrate. In third schematic 700C the gain block 740 is depicted in a hybrid butt coupling assembly configuration with silicon nitride cored MOTUS 730. Accordingly, as depicted third schematic 700C the gain block 740 is aligned vertically, laterally, and longitudinally to the appropriate common waveguide with the silicon nitride cored MOTUS 730. As depicted anti-reflection (AR) coatings 750 and 755 are applied to the MOTUS and the gain block 740 respectively. These AR coatings may be established assuming a small air interface within the transition region or no air gap. Alternatively, a single coating may be applied to one or other of the MOTUS 730 and gain block 740 assuming no air gap. Optionally, the gain block 740 may be mounted to a separate element of an overall assembly or it may be mounted to an underlying silicon substrate that has been appropriately patterned and deep etched for placement of the semiconductor optical gain block. The optical interface between the gain block and the silicon nitride cored MOTUS may also comprise angled facets relative to the optical waveguides within each of the gain block and MOTUS. Alternatively, the facets may be normal and the waveguides angled relative to the facets. The angled interfaces may reduce the reflectance and/or increase the AR coating manufacturing tolerances. Optionally, in first schematic 700A the region 760 may be eliminated if the gain block 710 can be coupled to a micro-optic or optical fiber directly at its output.

Figure 8:
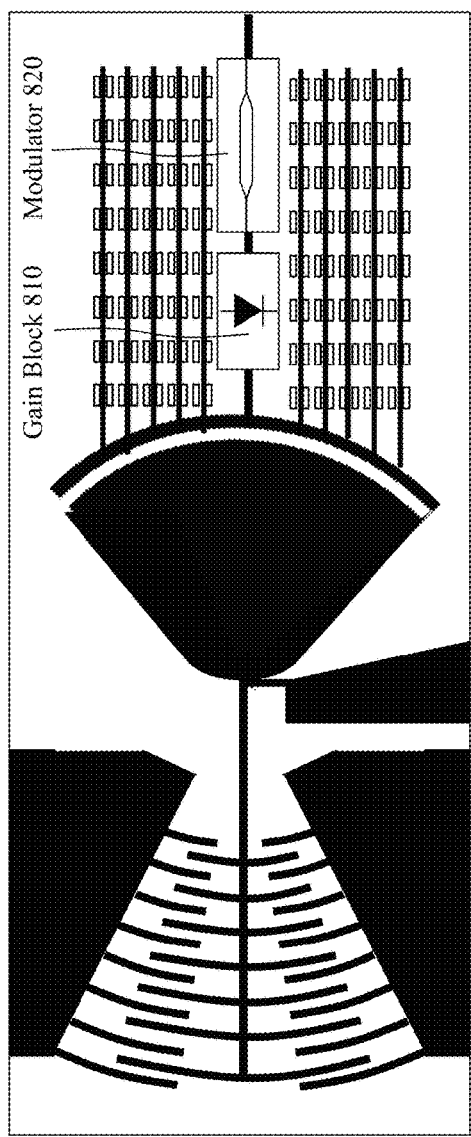
FIG. 8 depicts a wavelength selective optical engine according to an embodiment of the invention with hybrid integration of a semiconductor optical gain block and external Mach-Zehnder modulator die.
Figure 9:
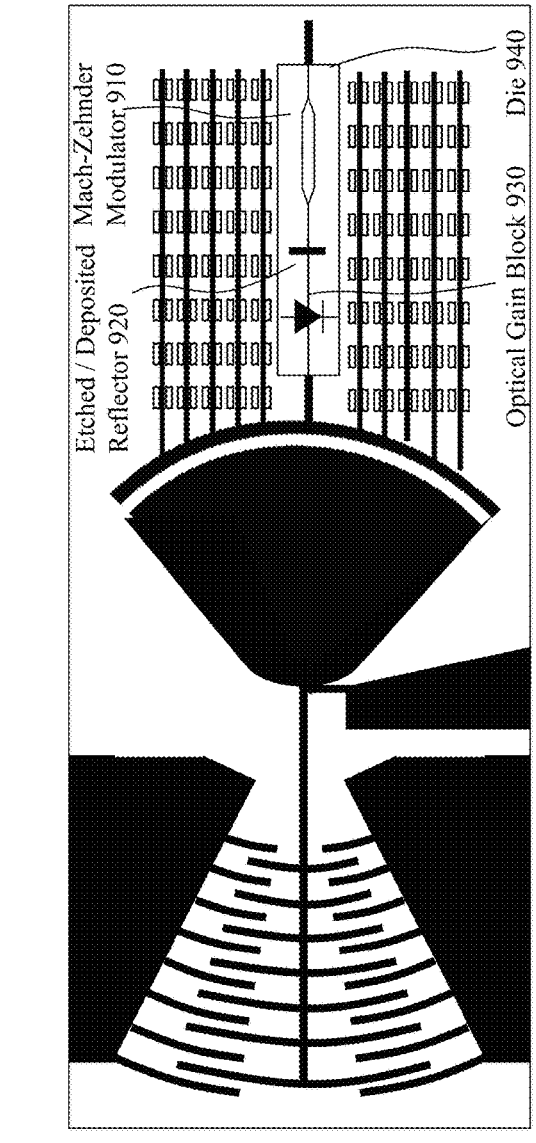
FIG. 9 depicts a wavelength selective optical engine according to an embodiment of the invention with hybrid integration of a monolithically integrated semiconductor optical gain block and external Mach-Zehnder modulator die.

In addition to the optical gain block an external modulator may also be hybridly integrated with the MOTUS optical engine either as a discrete element or integrated with the optical gain block. It would also be evident that whilst the optical gain block is shown at the end of the MOTUS optical engine distal from the SC-MEMSM that in other embodiments of the invention according to the number of channels, rotation angle of the SC-MEMSM, acceptable handling width of optical gain block, etc., that the gain block discretely or the gain block and external modulator may be disposed closer to the SC-MEMSM thereby reducing the length of the optical cavity forming the laser cavity. Such a wavelength selective MOTUS optical engine 800 is depicted in FIG. 8 wherein a gain block 810 and external modulator 820 are disposed upon the common waveguide within the same die length as the Bragg waveguide gratings. Whilst reducing the length of the optical cavity forming the laser cavity unless the gain block 810 and external modulator 820 die are narrow then the angular rotation requirements of the SC-MEMSM may be increased. Alternatively, as depicted in FIG. 9, a wavelength selective MOTUS optical engine 900 formed by the hybrid integration of a single semiconductor die 1840 with the MOTUS optical engine is shown. Semiconductor die 1840 comprises monolithically integrated semiconductor optical gain block 1830, high reflectivity mirror 1820, and external Mach-Zehnder modulator 1810. In this manner the multiple distributed Bragg reflector-external tunable cavity laser (MDBR-ECTL) formed by MOTUS in combination with the semiconductor optical gain block 1830 and high reflectivity mirror 1820 has its output externally modulated by the Mach-Zehnder modulator 1810. The high reflectivity mirror 1820 operates in conjunction with the wavelength selective Bragg grating within the MOTUS optical engine to provide the required cavity for lasing operation in conjunction with the semiconductor optical gain block 1830.

Figure 10:
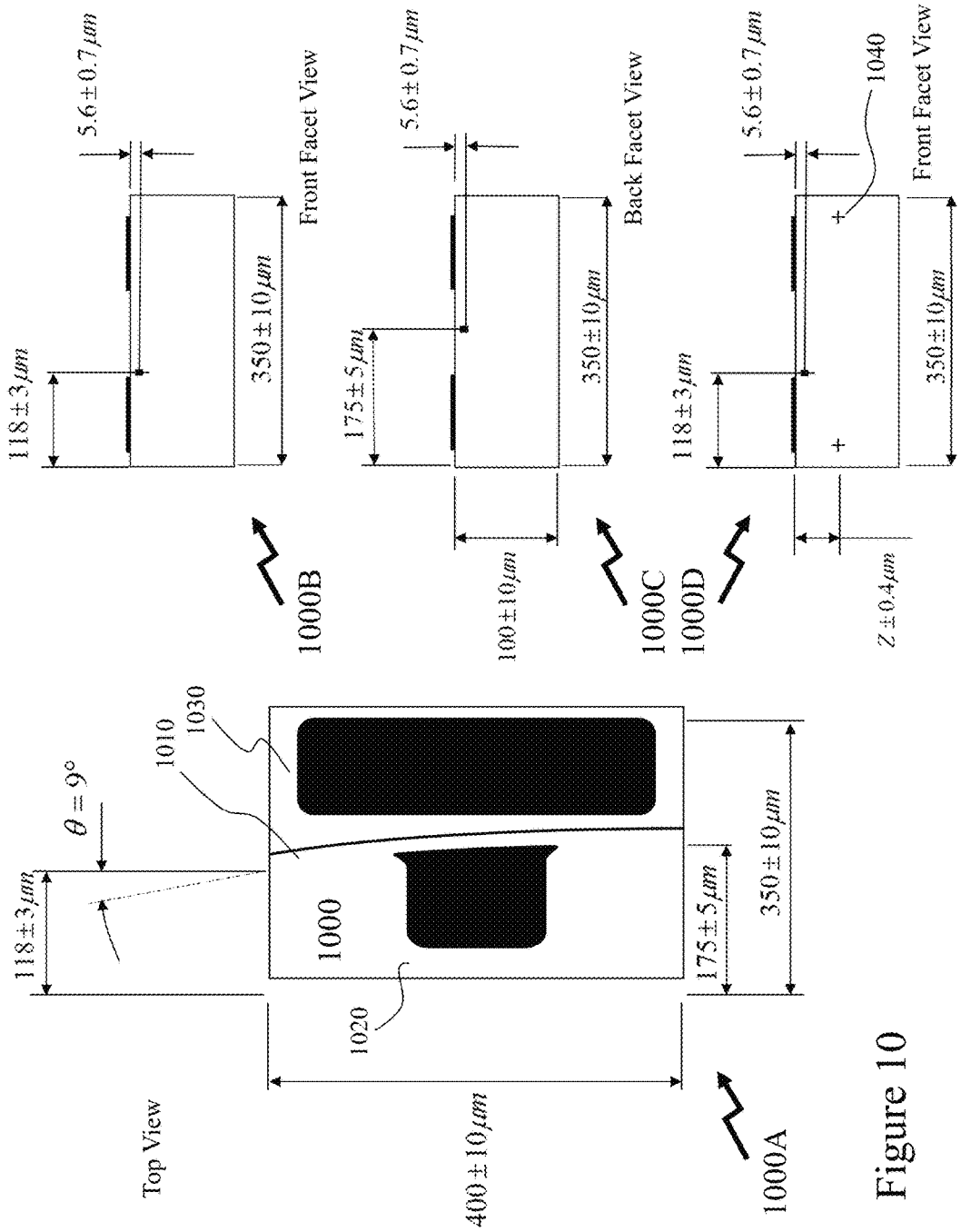
FIG. 10 depicts an optical gain block for hybrid integration with a silicon nitride-on-silicon MOEMS optical engine according to an embodiment of the invention.
Figure 11:
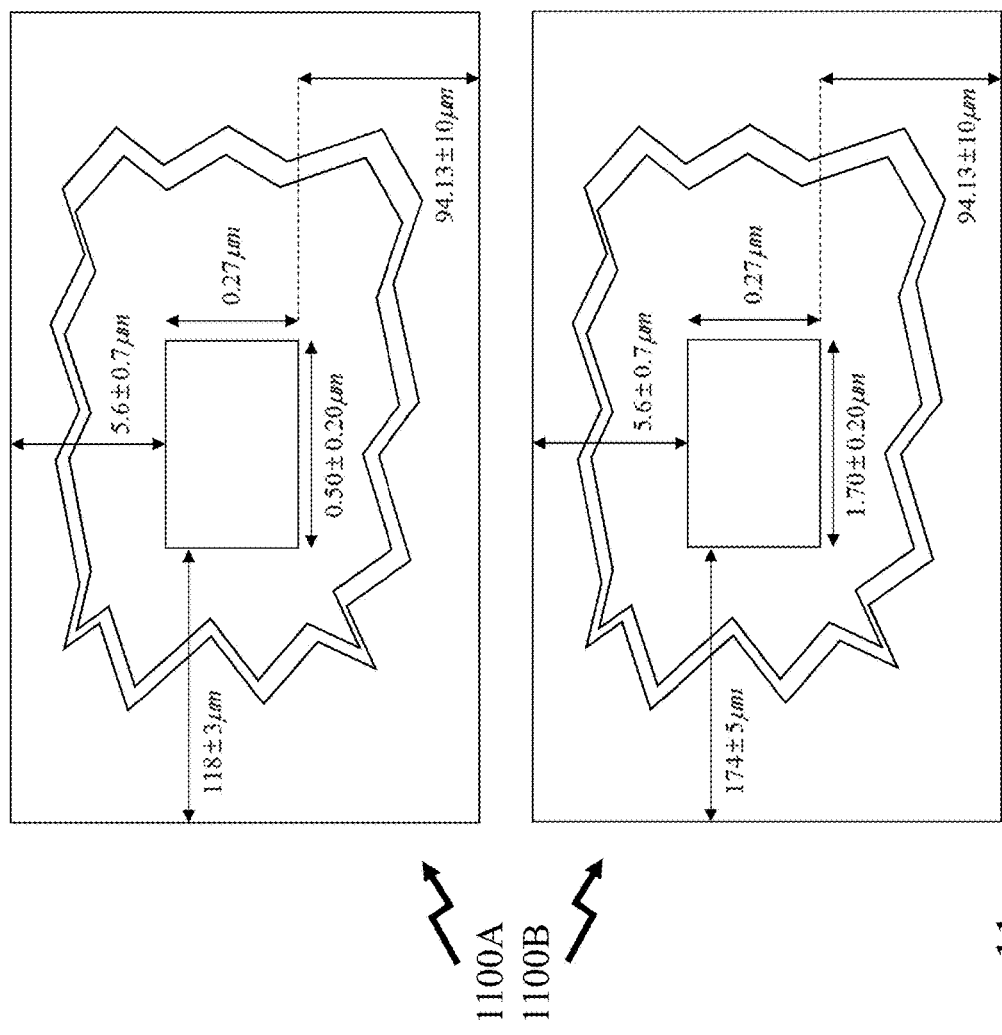
FIG. 11 depicts optical waveguide geometries for the input and output ports of the optical gain block of FIG. 10.

Now referring to FIG. 10 there is depicted an exemplary optical gain block die 1000 in plan 1000A together with first to third end elevations 1000B to 1000D respectively. First and second end elevations 1000B and 1000C represent either end of the optical gain block die in a first configuration whilst third elevation 1000D depicts the same end view as first end elevation 1000B but in a second configuration wherein marker 1040 have been formed within the optical gain block die 1000 during manufacturing. As depicted in plan view 1000A the optical gain block die 1000 comprises a waveguide 1010 running from one facet to the other with first and second electrical pads 1020 and 1030 respectively for biasing the optical gain block die 1000. The waveguide 1010 is perpendicular to one facet as depicted in second end elevation 1000C being 175±5 µm from one die edge and 5.6±0.7 µm down from the surface. At the other facet it has an angle of θ=9° which as depicted in first end elevation 1000B and is now 118±3 µm from the same die edge and 5.6±0.7 µm down from the surface. The overall optical gain block die 1000 is 350±10 µm wide, 400±10 µm long and 100±10 µm thick. As evident from third end elevation 1000D the markers, for example gold metallization, may be formed at a point within the growth sequence or before the growth sequence wherein the markers are Z±0.4 µm below the die surface, wherein Z is a value defined by the overall growth process and the insertion of the marker layer. Referring to FIG. 11 first and second waveguide geometries 1100A and 1100B are presented for the first end elevation 1000B and second end elevation 1000C showing that in addition to the angular and positional offsets between the waveguide at either end of the optical gain block die 1000 that the waveguide geometry changes in width from 0.50±0.20 µm to 1.70±0.20 µm with constant core thickness of 0.27 µm.

Accordingly, it is evident that when considering, for example, flip-chip die placement the distance of the nominal optical waveguide centre from a structural viewpoint is defined to within a tolerance of ±0.7 µm from the die surface provided that this is maintained as the absolute physical reference plane. However, unless the distance of the nominal waveguide centre of the silicon-on-insulator (SOI) waveguide is 5.6±0.7 µm above the silicon surface of the substrate for the SOI waveguide/MEMS structure then additional material/process tolerances must be included within the tolerance analysis of the vertical alignment between the SOI optical waveguide and waveguide of the optical gain block. Even in the ideal scenario as evident from second graph 1200B an insertion loss penalty of 0.5 dB is incurred for approximately 0.050 µm (50 nm) vertical offset between an active waveguide, such as waveguide 1010 in optical gain block die 1000, and a passive waveguide such as employed within a MOTUS, for example. Worse, the same loss versus offset is evident for the lateral offset but now, as evident from FIG. 10, rather than considering how to reduce a vertical tolerance of ±0.7 µm within the optical gain block die 1000 the issue is now accommodating lateral tolerances of the optical waveguide that are ±5 µm and ±3 µm at either end of the optical gain block die 1000. In contrast, as evident from first graph 1200A longitudinal tolerance issues are less critical as for a 0.5 dB loss penalty a gap of approximately 50 µm may be tolerated.

If the first and second electrical pads 1020 and 1030 respectively are employed for lateral alignment then the tolerance for this is expected to be increased significantly as now rather than die edges defined from dicing, for example, features defined photolithographically within the same process flow as the waveguide itself are employed. However, exploiting these for mechanical reference now adds the tolerances for these to the ±0.7 µm of the optical waveguide semiconductor stack.

Figure 12:
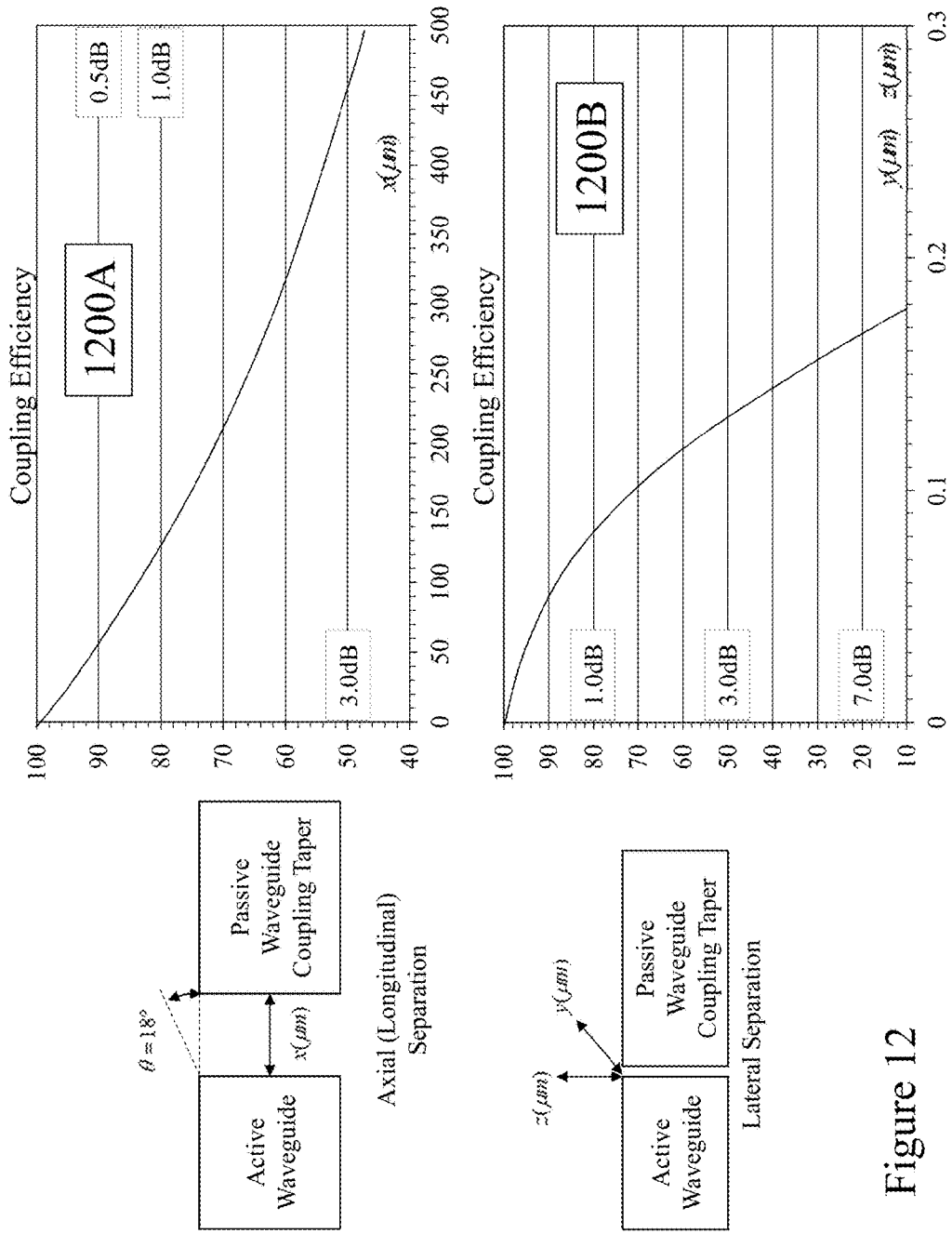
FIG. 12 depicts typical coupling curves for compound semiconductor waveguides to silicon nitride-on-silicon MOEMS for lateral and longitudinal offsets.

Accordingly, it would be evident that with the exception of third schematic 700C the accommodation/elimination of all of the tolerances arising from the active waveguide position relative to the die external geometry, within a fully passive alignment methodology such as discussed and presented within the prior art, is not feasible. Even relying upon features micro-machined or deposited during the manufacturing process where these are employed, for example, in flip-chip bonding yields tolerances that albeit reduced significantly, and for lateral tolerances by approximately an order of magnitude, these tolerances are still typically in the range ±0.5 µm to ±1 µm which as evident from second graph 1200B in FIG. 12 still yield massive insertion loss penalties for the resulting automatically aligned assembly.

Figure 13A:
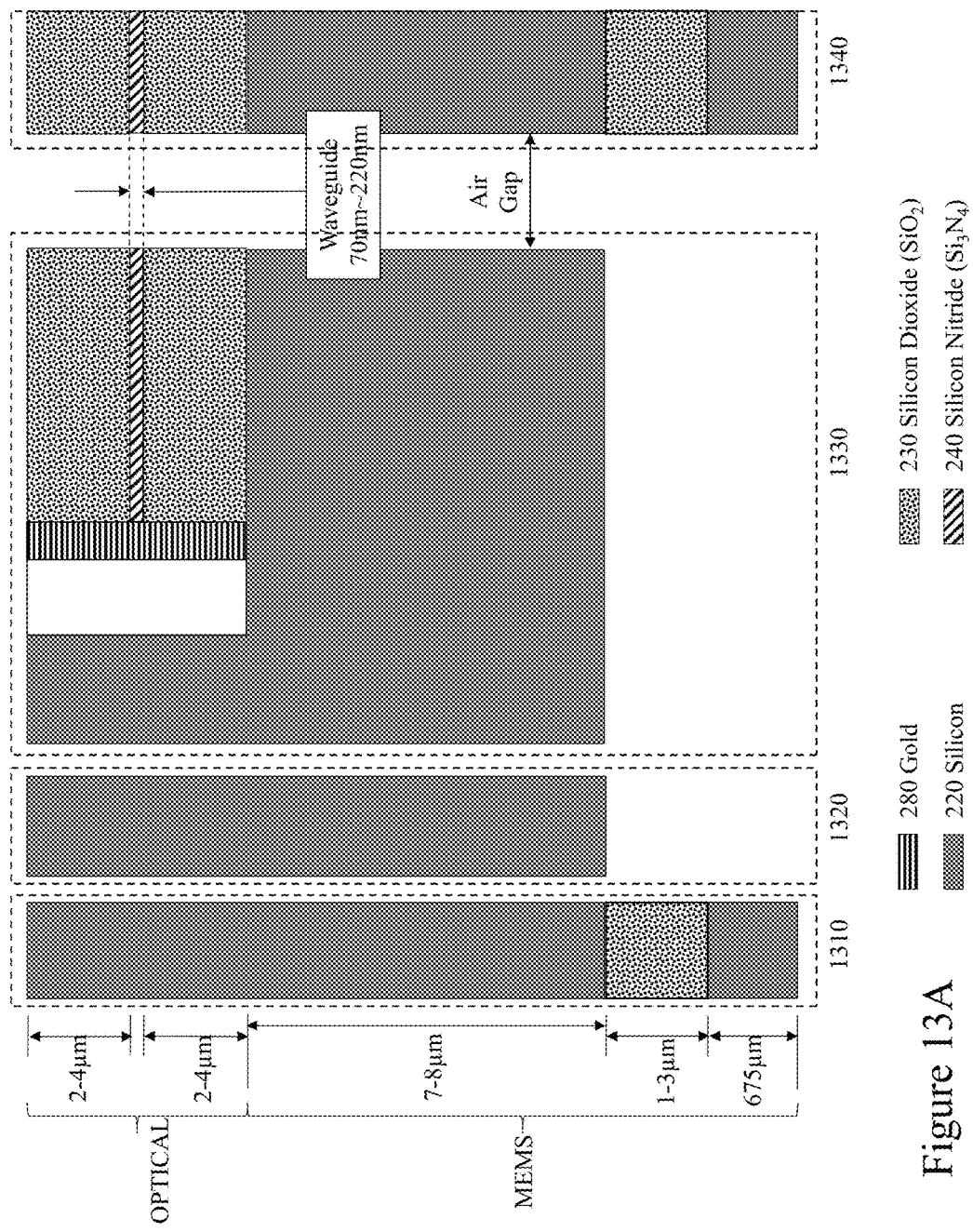
FIGS. 13A to 13C depict cross-sections of alternate structures for a MOEMS according to embodiments of the invention.

Referring to FIG. 13A there is depicted a cross-section of the waveguide/MEMS structure of an optical component exploiting MEMS such as a MOTUS as described supra in respect of FIGS. 1A and 2-9 respectively according to an embodiment of the invention wherein in addition to MEMS mirror a MEMS micro-actuator is implemented for active/dynamic alignment. Accordingly, a silicon 220 substrate of nominal thickness 675 µm has formed upon it a 1-3 µm layer of $SiO_2$ 230 and then a silicon 220 layer of minimum thickness 11-16 µm depending upon the optical waveguide structure which forms the basis of the MEMS elements. Within the waveguide region(s) the waveguide is comprised of a lower cladding layer of $SiO_2$ 230 with thickness 2-4 µm, a silicon nitride ($Si_3N_4$) core of thickness 70 nm≤t≤220 nm, and upper cladding layer of $SiO_2$ 230 with thickness 2-4 µm. Accordingly, based upon the etching of the lower 1-3 µm layer of $SiO_2$ 230 and silicon 220 substrate different regions of the device may be formed including supported MEMS structure 1310, free standing MEMS structure 1320, Micro-Opto-Electro-Mechanical structure 1330, and optical waveguide structure 1340.

Figure 13B:
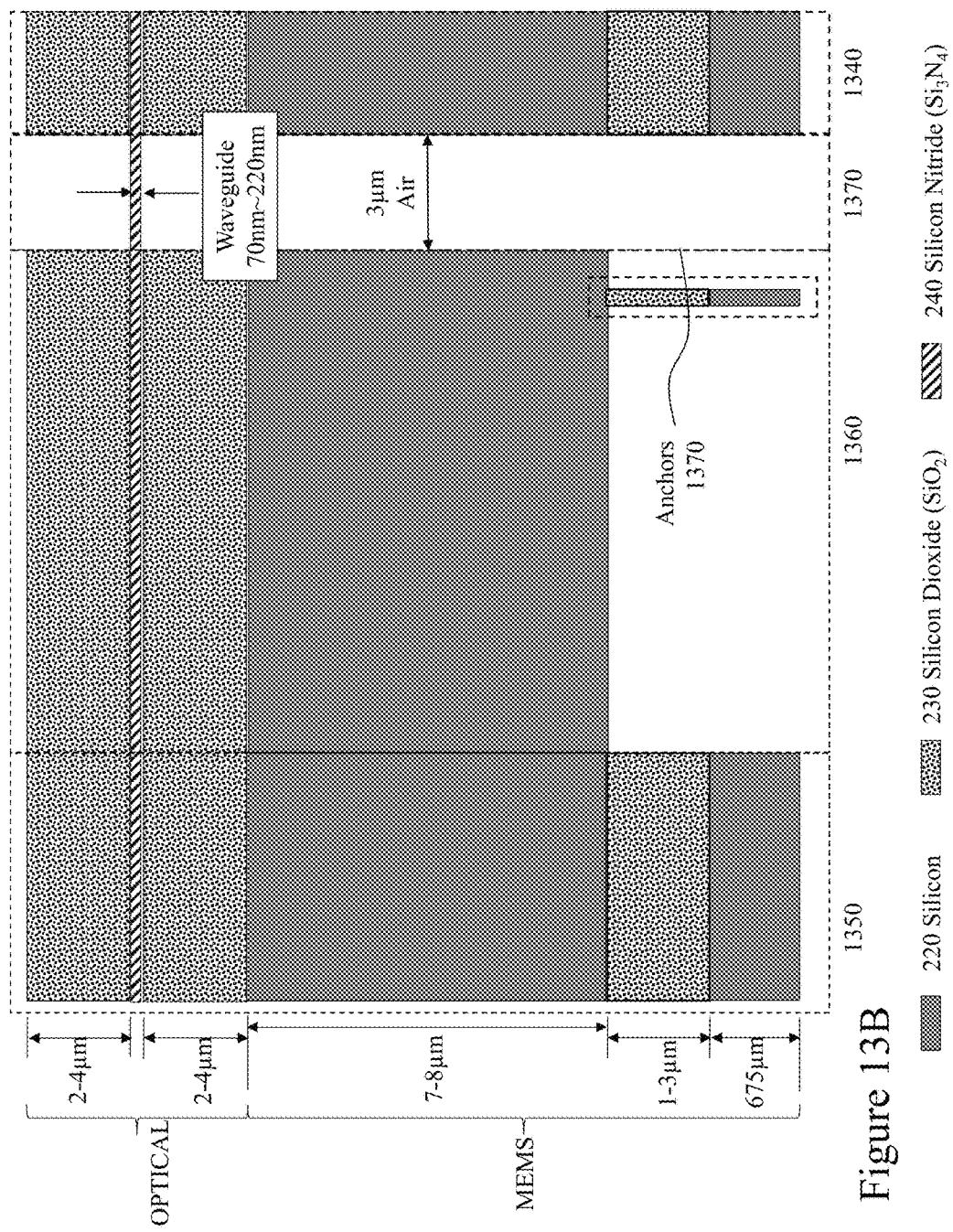

Now referring to FIG. 13B there is depicted a cross-section of a MOEMS exploiting a waveguide/MEMS structure similar to that depicted in FIG. 13A and of an optical component exploiting MEMS such as a MOTUS as described supra in respect of FIGS. 1A and 2-9 respectively according to an embodiment of the invention wherein a MEMS micro-actuator is implemented for active/dynamic alignment within a MOEMS configuration. As with FIG. 13A the layer stack comprises a silicon 220 substrate of nominal thickness 675 µm has formed upon it a 1-3 µm layer of $SiO_2$ 230 and then a silicon 220 layer of minimum thickness 11-16 µm depending upon the optical waveguide structure which forms the basis of the MEMS elements was originally formed but has been etched down to 7-8 µm. The optical waveguide structure is comprised of a lower cladding layer of $SiO_2$ 230 with thickness 2-4 µm, a silicon nitride ($Si_3N_4$) core of thickness 70 nm≤t≤220 nm, and upper cladding layer of $SiO_2$ 230 with thickness 2-4 µm. Accordingly, the MOEMS is structured with 4 different cross-sections including supported MOEMS 1350, unsupported MOEMS 1360, exposed core 1370, and optical waveguide structure 1340. In unsupported MOEMS 1360 the underlying silicon 220 substrate and silicon dioxide 230 have been removed, except for anchor(s) 1370, leaving the optical waveguide supported on the MEMS silicon 220. In exposed core 1370 the underlying silicon 220 substrate, sacrificial silicon dioxide 230, MEMS silicon 220, and upper/lower silicon dioxide 230 claddings have been removed leaving a short region of exposed silicon nitride 240 core. Within other embodiments of the invention exposed core 1370 may be alternatively be the optical waveguide absent MEMS silicon 220 support or the optical waveguide with reduced thickness upper and/or lower cladding.

Figure 13C:
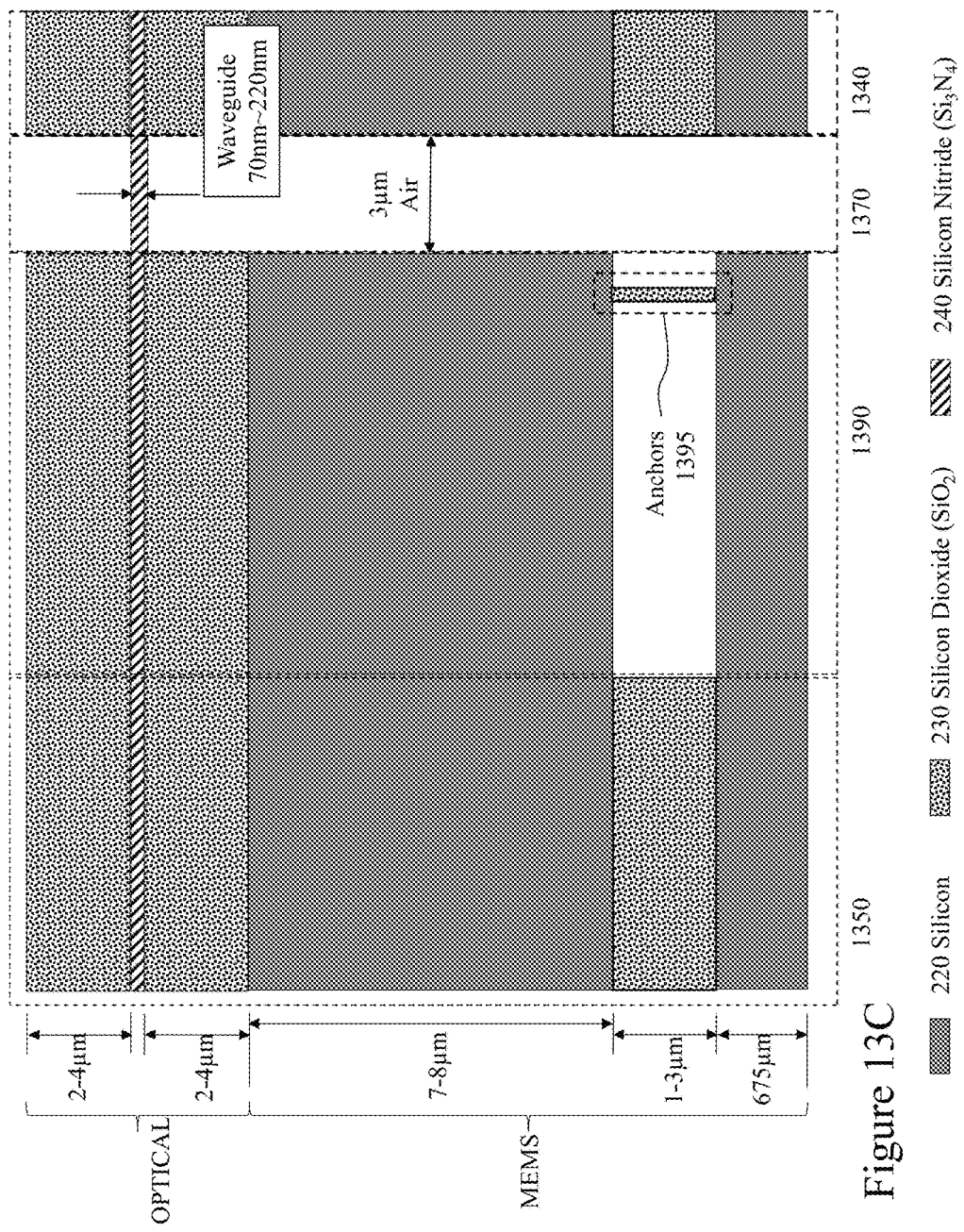

Now referring to FIG. 13C there is depicted a cross-section of a MOEMS exploiting a waveguide/MEMS structure similar to that depicted in FIGS. 13A and 13B comprising a silicon 220 substrate of nominal thickness 675 µm; a 1-3 µm layer of $SiO_2$ 230; a silicon 220 mechanical layer; and an optical waveguide structure comprised of a lower cladding layer of $SiO_2$ 230 with thickness 2-4 µm, a silicon nitride ($Si_3N_4$) core of thickness 70 nm≤t≤220 nm, and upper cladding layer of $SiO_2$ 230 with thickness 2-4 µm. In this instance the unsupported MOEMS 1360 is replaced with released MOEMS 1390 wherein the mechanical silicon 220 layer has been released from the silicon 220 substrate by etching the lowermost SiO2 230 but the silicon 220 substrate has not been removed. Accordingly, the anchors 1380 have now been replaced with anchors 1395 formed solely within the sacrificial SiO2 230 layer.

Figure 14:
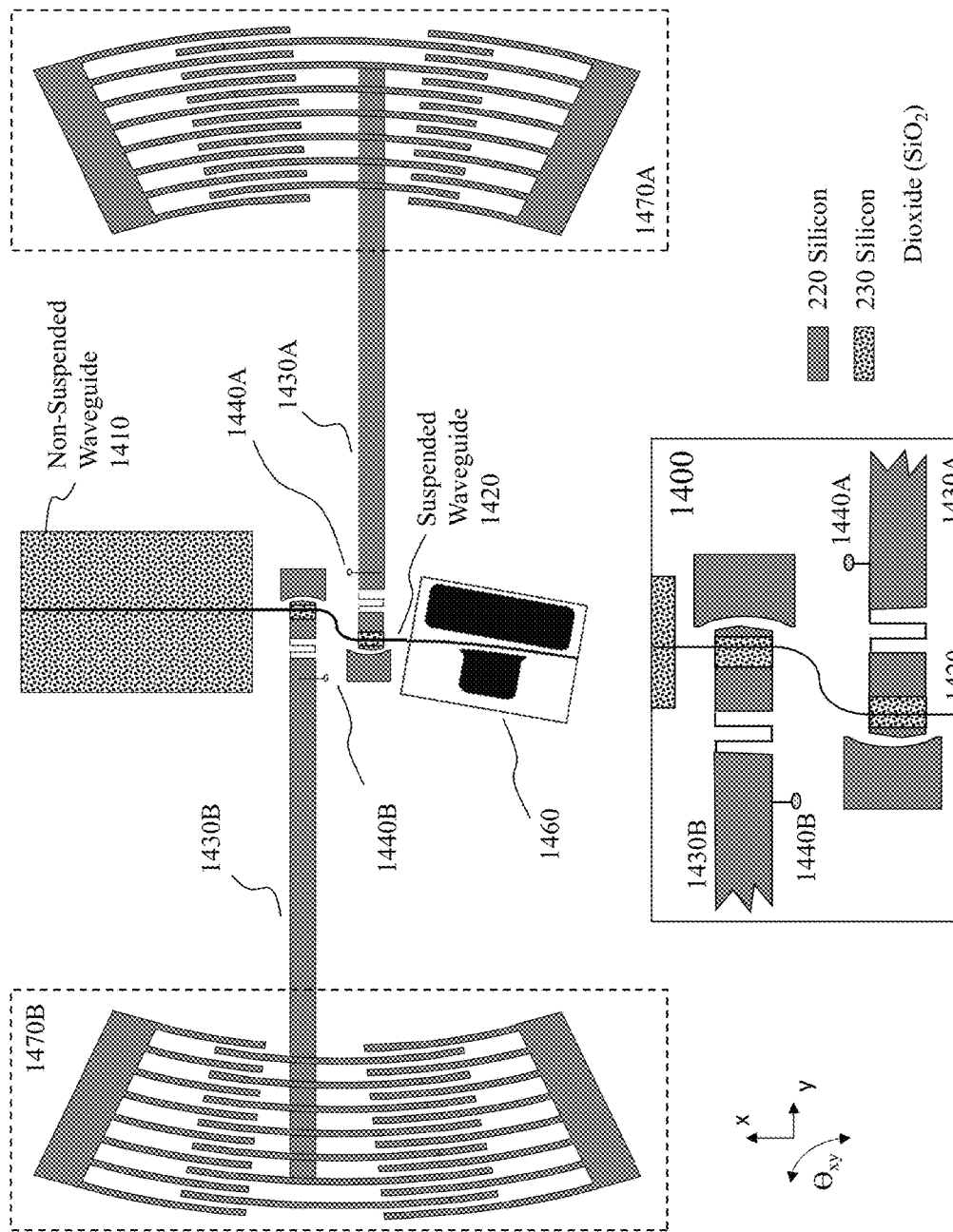
FIGS. 14 and 15 depict the configuration and manipulation of a silicon nitride-on-silicon waveguide within a MOEMS exploiting MEMS micro-positioners according to an embodiment of the invention.

Now referring to FIG. 14 there is depicted a MOEMS optical waveguide micro-positioner according to an embodiment of the invention. As depicted first and second actuators 1430A and 1430B are coupled at one end to first and second angular comb drives 1470A and 1470B respectively. At the other ends upon the first and second actuators 1430A and 1430B are optical waveguide 1420 sections. As evident from FIG. 14 and inset 1400 the optical waveguide 1420 comprises:

an initial section upon non-suspended waveguide 1410, equivalent to supported MOEMS 1350;
a first exposed core region, equivalent to exposed core 1370;
optical waveguide upon second actuator 1430B, equivalent to unsupported MOEMS 1360;
a second exposed core region, equivalent to exposed core 1370;

optical waveguide upon first actuator 1430A, equivalent to unsupported MOEMS 1360; and a third exposed core region, equivalent to exposed core 1370 and the portion of the optical waveguide 1420 closest to the optical gain block die 1460.

Accordingly, activation of one or other or both of the first and second angular comb drives 1470A and 1470B results in the movement of the respective one of the first and second actuators 1430A and 1430B which pivot about their respective anchors 1440A and 1440B such that the distal ends of the first and second actuators 1430A and 1430B from the first and second angular comb drives 1470A and 1470B similarly move thereby moving the optical waveguide supported by these distal ends of the first and second actuators 1430A and 1430B. In FIG. 14 the MOEMS optical waveguide micro-positioner is depicted in a first state, e.g. as manufactured or alternatively as the first and second angular comb drives 1470A and 1470B have been driven to position the first and second actuators 1430A and 1430B to these positions. Now referring to FIG. 15 and insert 1500 the MOEMS optical waveguide micro-positioner according to an embodiment of the invention is depicted after rotation and/or further rotation of the first and second angular comb drives 1470A and 1470B which result in the pivoting of the distal ends of the first and second actuators 1430A and 1430B around first and second anchors 1440A and 1440B which result in the optical waveguide geometry being varied to that of suspended waveguide 1510 and the position of the end of the optical waveguide shifting.

Figure 15:
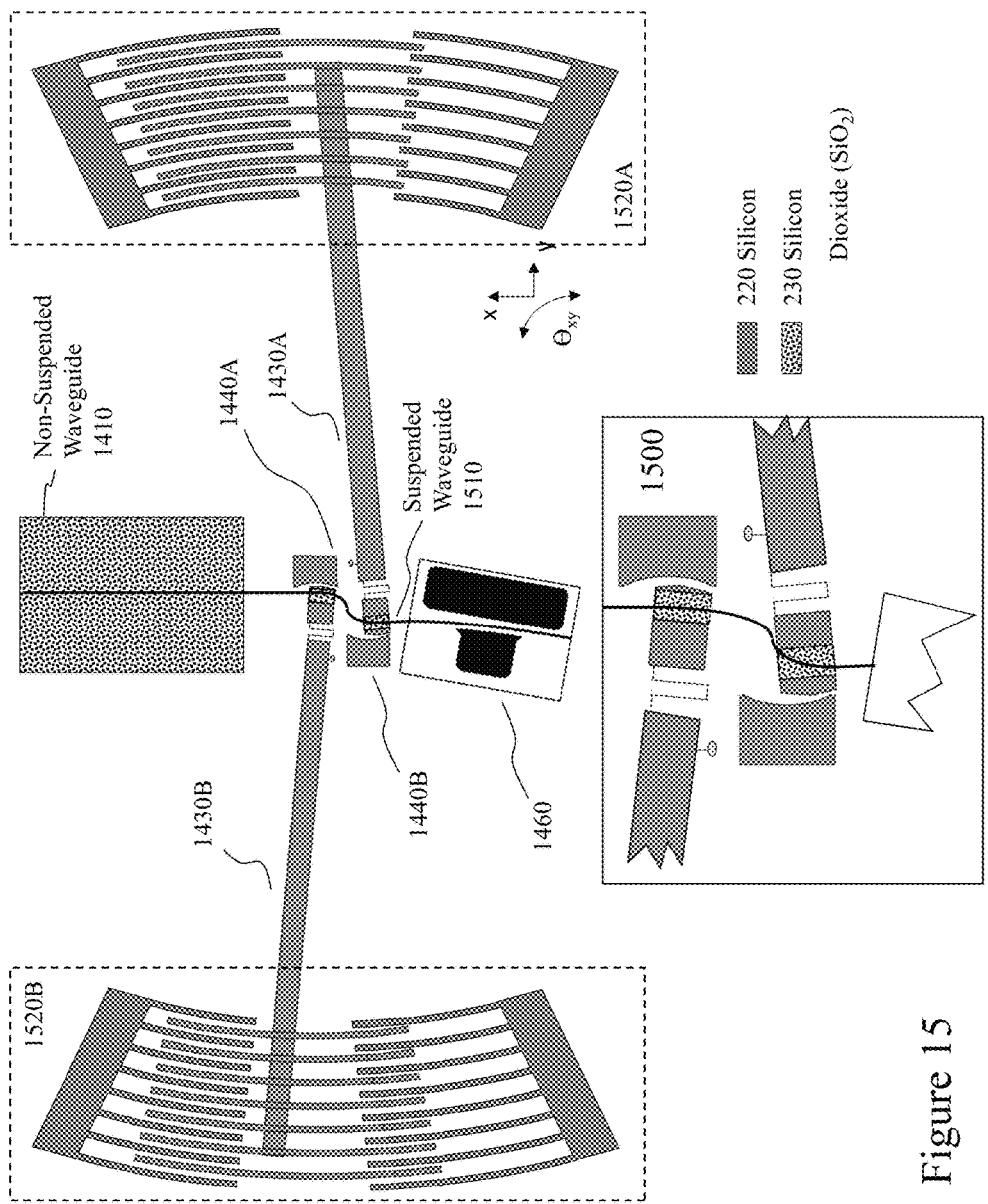

This is depicted in FIGS. 16 to 18 in simplified format according to an embodiment of the invention. Accordingly, referring to FIG. 16, the non-suspended waveguide 1410 is depicted together with the optical gain block 1460 and its gain waveguide 1660. Also depicted is an actuator comprising actuator arm 1610, actuator spring 1620, actuator tip 1630 and first and second actuator control electrodes 1640 and 1650 which are depicted in FIGS. 14 and 15 at the tip of the first and second actuators 1430A and 1430B as a single element but in this instance are depicted as two electrode segments. Also depicted is optical waveguide 1670 that has first and second core exposed sections and the section supported by the actuator tip 1630. The optical waveguide ending with waveguide tip 1675. In the embodiment depicted the waveguide tip is positioned approximately 2 μm from the facet of optical gain block 1460 and gain waveguide 1660 and is offset also angularly as the actuator is perpendicular to the non-suspended waveguide 1410, typically as a result of this being the default condition of the actuator drive or it's being biased to this condition.

Now referring to FIG. 17 the actuator has been pivoted by the angular comb drive, not shown for clarity, such that is now rotated relative to the optical gain block 1460 and non-suspended waveguide 1410. Accordingly, the actuator arm 1610 is shown rotated by approximately 5° although through the combined action of actuator spring 1620 and the respective biasing of actuator tip 1630 and first and second actuator control electrodes 1640 and 1650 the actuator tip 1630 is still essentially perpendicular to non-suspended waveguide 1410. The result is a translation of the actuator tip 1630 away from the non-suspended waveguide 1410 towards the optical gain block 1460. As depicted first and second actuator control electrodes 1640 and 1650 are biased at the same negative potential relative to the actuator tip 1630, i.e. ($V_{BIAS1}=V_{BIAS2}$) and $V_{BIAS1}<V_{ACTUATOR}$ where $V_{BIAS1}$; $V_{BIAS2}$ are the bias applied to first and second actuator control electrodes 1640 and 1650 respectively and $V_{ACTUATOR}$ is the bias applied to the actuator tip, if applied otherwise it is the floating bias of the actuator tip 1430. Now referring to FIG. 18A the bias voltages applied have been adjusted such that $V_{BIAS1}<V_{BIAS2}$ and $V_{BIAS2} \leq V_{ACTUATOR}$ such that the actuator tip 1630 is now rotated by X° due to the asymmetric attraction/repulsion from the first and second actuator control electrodes 1640 and 1650 which now results in the exposed core waveguide being tilted yielded waveguide 1810 and angled tip 1820 adjacent the facet of the optical gain block 1460 and its gain waveguide 1660.

Accordingly, through the voltages applied to the first and second actuator control electrodes 1640 and 1650 and the angular comb drive an optical waveguide forming part of a MOEMS circuit can be adjusted in position such that it can be coupled to a hybridly integrated component, e.g. optical gain block, external modulator, DFB laser, etc. As depicted in FIGS. 14 and 15 a pair of such actuators are employed whereas a single actuator is employed in FIGS. 16 to 18. It would be evident that whilst the embodiments of the invention have been described with respect to exposed core waveguide sections, e.g. as depicted in FIG. 13B by exposed core 1370, that optionally the exposed core may alternatively be a clad waveguide comprising upper and lower cores together with the core but having a lateral dimension comparable to the thickness, e.g. a square waveguide. Optionally, the silicon dioxide cladding in the exposed core regions may be replaced with a polymeric cladding or another material to provide suitable refractive index difference rather than silicon nitride—air without significantly altering the mechanical characteristics.

It would be evident that the range/resolution motion of the optical waveguide for the same mechanical configuration may be adjusted by the position of the anchor and hence the location of the pivot. Further the overall range is impacted by the design and mechanical properties of the unsupported optical waveguide portion(s).

Figure 18B:
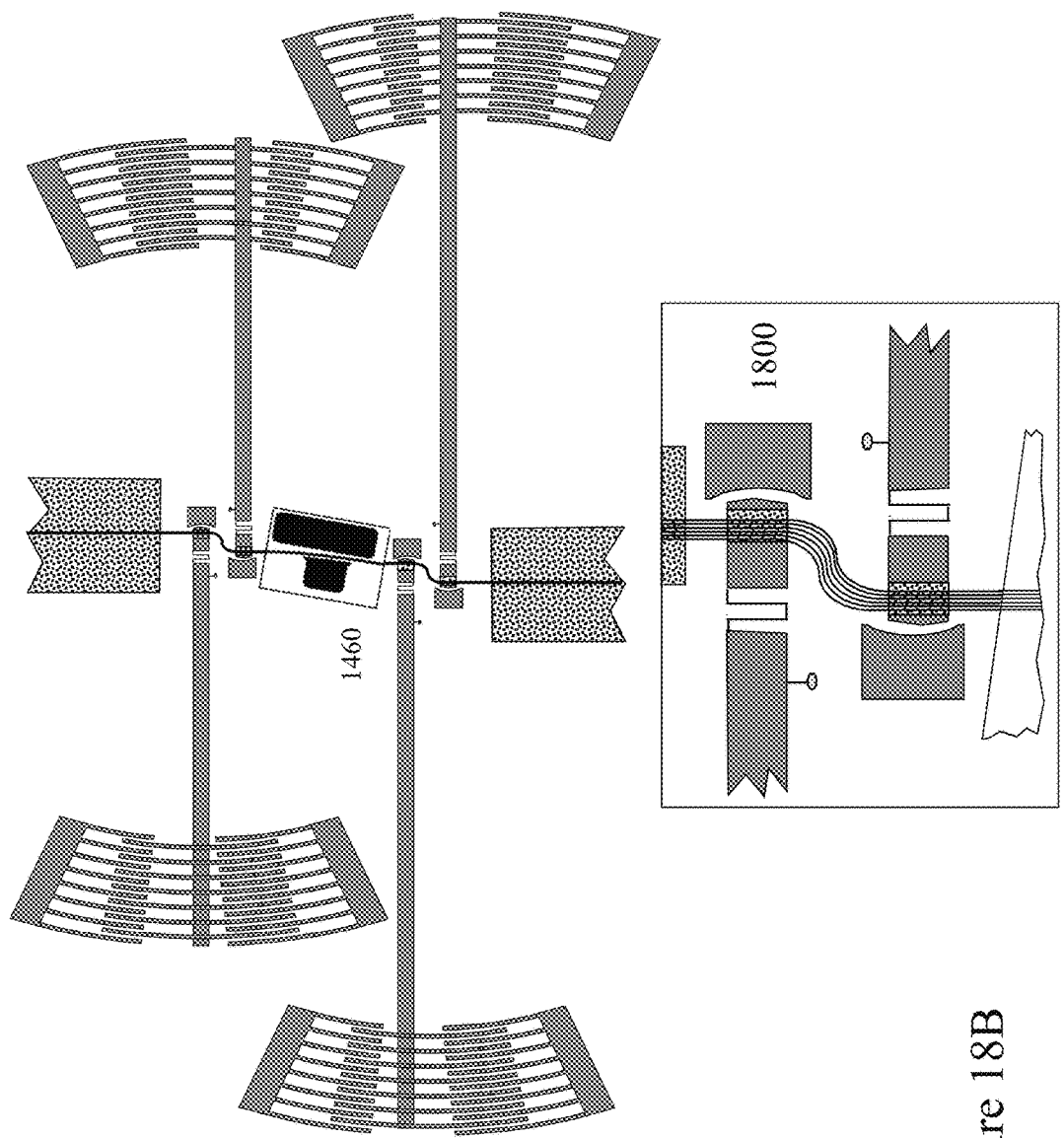
FIG. 18B depicts the configuration and manipulation of silicon nitride-on-silicon waveguides within a MOEMS exploiting MEMS micro-positioners to couple to a hybridly integrated optical gain block according to an embodiment of the invention.

Now referring to FIG. 18B there is depicted an optical gain block 1460 with MOEMS optical waveguide micro-positioners at input and output wherein each MOEMS optical waveguide micro-positioner is implemented according to the embodiment of the invention depicted in FIGS. 14 and 15. In this instance the optical gain block 1460 is being hybridly integrated to a silicon MOEMS such as a MOTUS optical engine as described and depicted supra in respect of FIGS. 2 to 9 respectively. It would also be evident that multiple optical waveguides can be manipulated and aligned as depicted in insert 1800 in FIG. 18B at either one or both ends of a hybrid integrated component and that the number of waveguides at each end may be the same or different according to the MOEMS functionality and the hybrid circuit. Alternatively, the optical waveguide being manipulated may be planar optical waveguide, a wide laterally multimoded pseudo-planar waveguide, or a lensed optical waveguide. In this latter implementation an optical waveguide a $SiO_2$—$Si_3N_4$—$SiO_2$ or $SiO_2$—$Ge:SiO_2$—$SiO_2$ waveguide may form a lens on the free unsupported end of the waveguide through localized flame or electrical heating.

Figure 19:
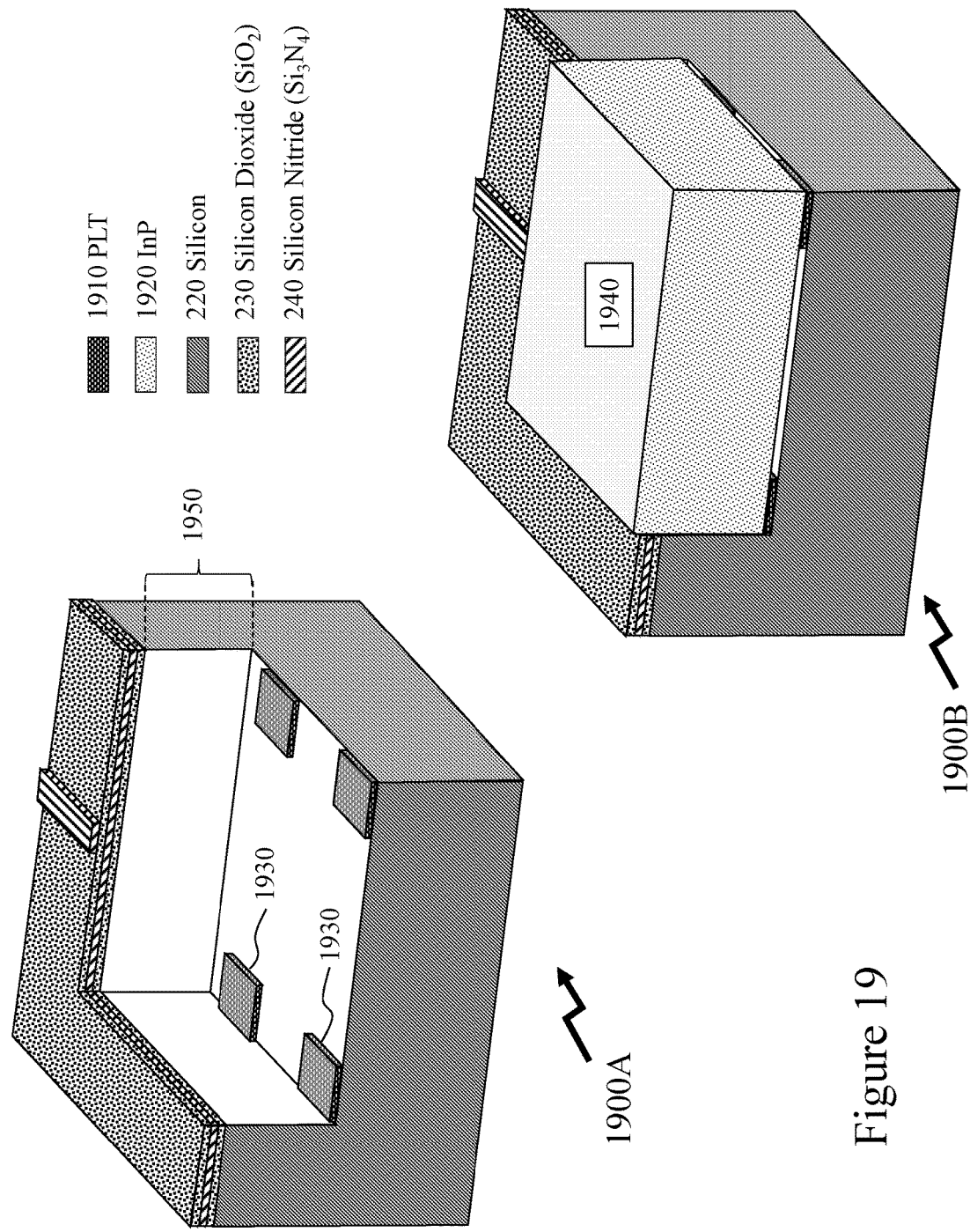
FIG. 19 depicts provisioning of vertical manipulation of an optical circuit element according to an embodiment of the invention exploiting piezoelectric micro-positioners.

As noted supra the positional tolerances for optical alignment of a hybrid optical circuit element with the optical waveguides within the substrate to which the hybrid optical circuit element may be small in both the lateral and vertical axes compared to the longitudinal direction. This is true whether the hybrid optical circuit element is flip-chip mounted or inserted into a micromachined opening within the silicon substrate. Referring to FIG. 19 there are depicted first and second schematics 1900A and 1900B of an embodiment of the invention for providing vertical adjustment of a hybrid optical circuit element relative to the substrate, e.g. a MEMS substrate or a MOEMS substrate for example. As depicted in first schematic 1900A a recess 1950 has been etched into the substrate, silicon 220, and within the bottom of this recess a plurality of pads 1930 have been formed from a piezoelectric material, e.g. lanthium-modified lead titanate ($Pb_{1-1.5x}La_xTiO_3$) (PLT), aluminum nitride (AlN), or scandium aluminum nitride ($Al_{1-x}Sc_xN$) for example. These are electrically connected, via metallization not shown within FIG. 19, allowing their physical dimension vertically to be electrically controlled. Accordingly, the optical die to be hybridly interconnected with the substrate, silicon 220, and may be mounted to the substrate either through insertion and/or flip-chip mounting such as depicted in second schematic 1900B in FIG. 10. Once placed the vertical position of the optical die may be adjusted.

Where the optical die is flip-chip mounted then the recess 1950 may be etched only through the optical stack of $SiO_2$—$Si_3N_4$—$SiO_2$ of the optical waveguide and into the MEMS silicon 220 layers only. In other embodiments the recess 1950 is etched through the $SiO_2$—$Si_3N_4$—$SiO_2$ waveguide, MEMS silicon 220, and sacrificial $SiO_2$ layer into the silicon 220 substrate. Optionally, the electrical interconnection of the pads 1930 may be via electrical interconnections on the optical die which are then connected to the substrate. Optionally, the pads 1930 may be deposited and patterned onto the surface of the optical die rather than within the recess of the substrate. Optionally, vias may be opened into the silicon 220 substrate allowing separately manufactured piezoelectric transducers to be integrated with the silicon 220 substrate and the optical die mounted upon them.

Figure 20:
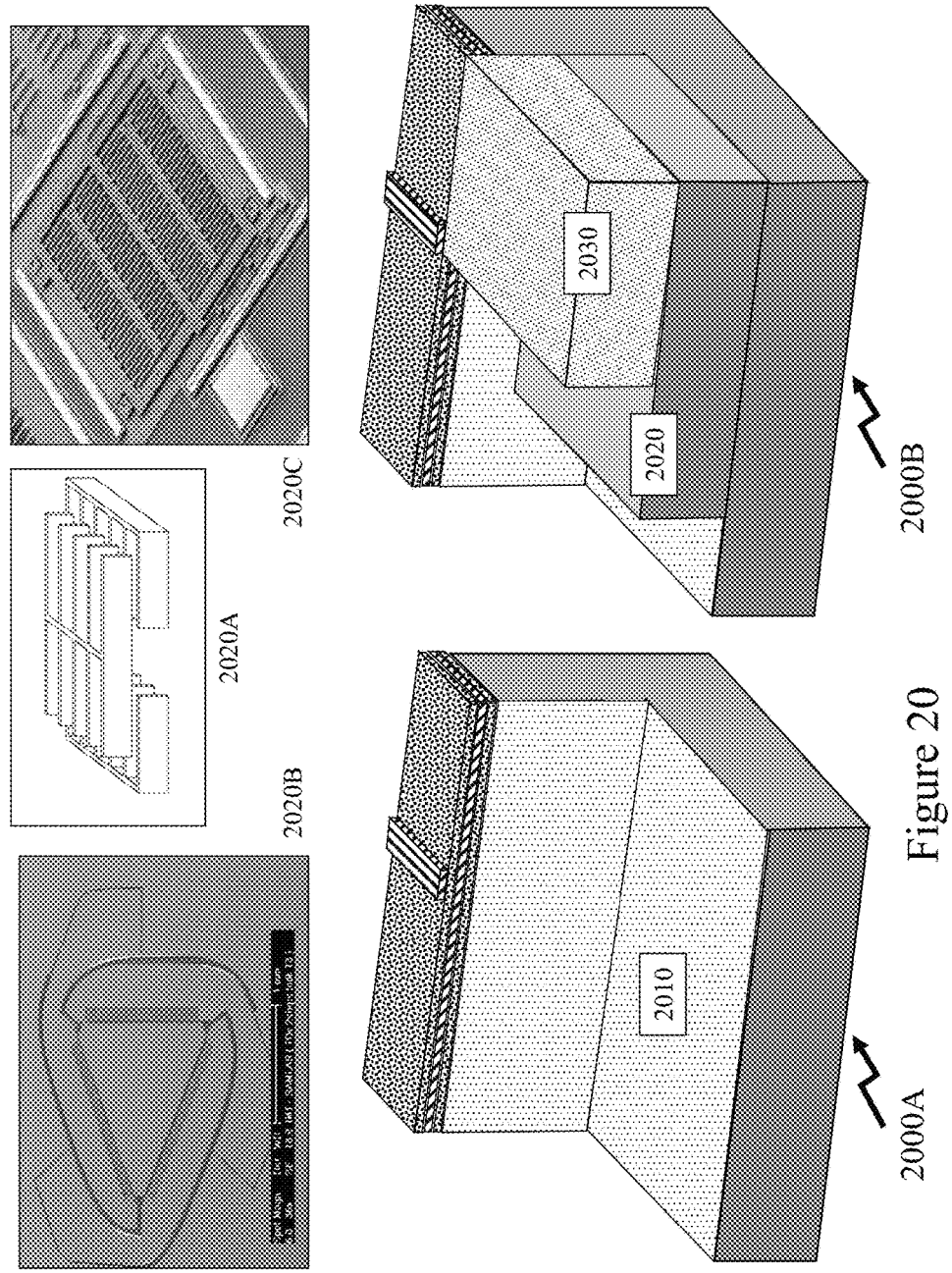
FIG. 20 depicts provisioning of vertical manipulation of an optical circuit element according to an embodiment of the invention exploiting vertical comb-actuator based micro-positioners.

Referring to FIG. 20 there are depicted first and second schematics 2000A and 2000B of an embodiment of the invention for providing vertical adjustment of a hybrid optical circuit element relative to the substrate, e.g. a MEMS substrate or a MOEMS substrate for example. Accordingly, in first schematic 2000A an opening 2010 has been formed within the substrate, e.g. MEMS or MOEMS substrate. Subsequently, as depicted in second schematic 2000B a second silicon MEMS substrate 2020 has been inserted and an optical die 2030 mounted atop the inserted second silicon MEMS substrate 2020. Accordingly, when the second silicon MEMS substrate 2020 integrates a vertical MEMS actuator such as depicted in respect of first to third schematics 2020A to 2020C then actuation of the vertical MEMS actuator allows the vertical position of the optical die 2030 to be adjusted. The vertical MEMS actuator may be a purely vertical actuator such as depicted in respect of first schematic 2020A, a triangular tilt-piston in 2020 supporting purely vertical displacement and/or tilt/displacement in second schematic 2020B, and dual vertical comb MEMS actuator allowing purely vertical displacement and/or tilt/displacement.

Figure 21:
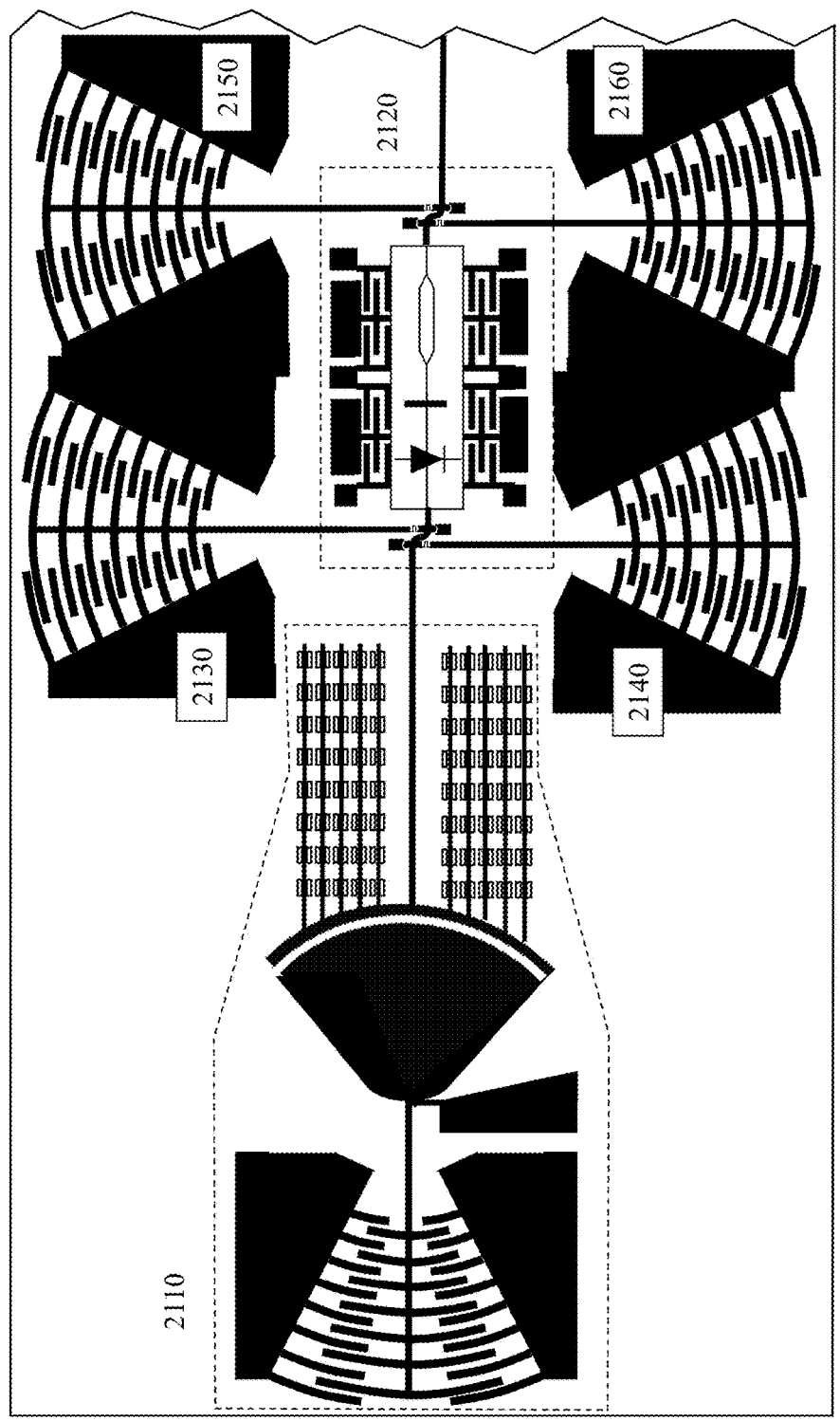
FIG. 21 depicts part of a MOEMS according to an embodiment of the invention exploiting MEMS micro-positioners and vertical comb-actuator based micro-positioners to optical couple the tunable reflective Bragg grating MOEMS channel selector to a compound semiconductor optical gain block—mirror—external modulator die.

Referring to FIG. 21 there is depicted an exemplary schematic of a MOEMS incorporating a MOTUS optical engine 2110 and MOEMS hybrid waveguide assembly 2120 comprising MOEMS optical waveguide micro-positioners at either end driven by first and second angular comb drives 2130 and 2140 and third and fourth angular comb drives 2150 and 2160 respectively. MOEMS hybrid waveguide assembly 2120 also includes vertical comb actuators to adjust the position of the flip-chip mounted InP die onto the MOEMS.

It would be evident that the MOEMS mirror within the MOTUS optical engine, MOEMS optical waveguide micro-positioners, vertical comb drive and angular comb drives are all electrostatically driven MEMS elements within the MOEMS. Accordingly, maintaining their position requires that the electrostatic comb drive voltages are maintained at the appropriate voltage commensurate with their position after alignment/adjustment. Whilst these are very low power control signals these may be moderate or high electrostatic voltages and hence it may be beneficial to remove these by fixing one or more MEMS actuator in position once alignment has been completed.

Figure 22:
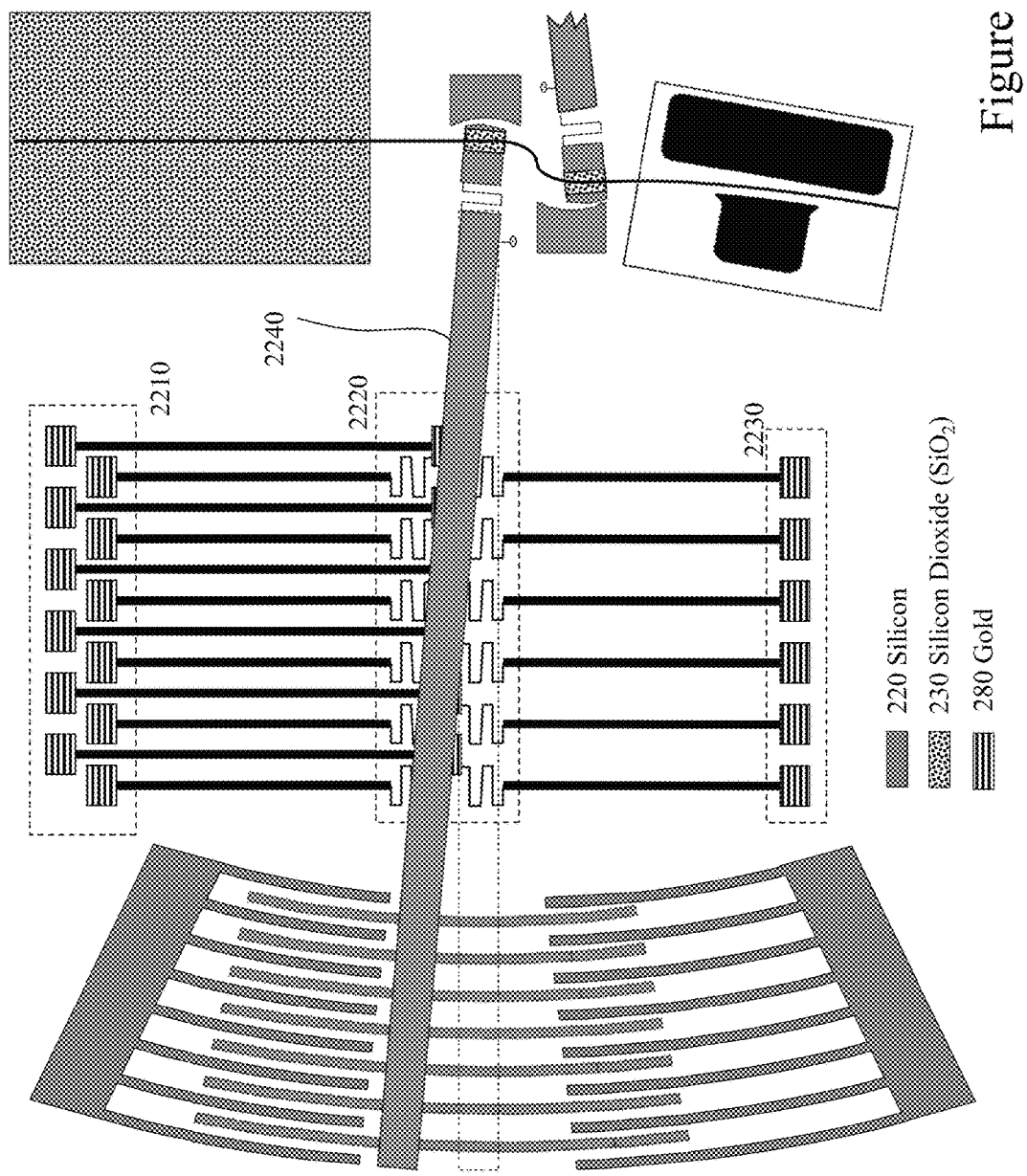
FIG. 22 depicts a MOEMS optical waveguide micro-positioner with post-alignment locking mechanism according to an embodiment of the invention.

Accordingly, referring to FIG. 22 there is depicted a MOEMS optical waveguide micro-positioners such as described and depicted in respect of FIGS. 14 to 18B. Accordingly, an actuator 2240, such as second actuator 1430B in FIGS. 14 and 15, is depicted together with first to third metallizations 2210 to 2230 respectively. As depicted first and second metallizations 2210 and 2230 are gold metallizations such as bond pads for example allowing electrical signals to be selectively applied to the second metallizations 2220 that include thin meandering tracks with indium metallization atop the underlying gold metallization, for example. Accordingly, a pair of thin film heaters are formed with central electrode such that if the central electrode is ground, for example, one or both heaters can be activated. Other electrical connectivities can be provided to selectively power one or other heater or both. With thin film heaters and low melting point upper metallization, e.g. indium, this upper metallization can be heated to molten state allowing it to wick/flow/adhere to metallization upon the actuator 2240. This may be post-alignment to lock the MOEMS optical waveguide micro-positioner into position or during alignment wherein the indium solder is maintained in liquid form during the alignment process. According to the rotation of the MOEMS optical waveguide micro-positioner predetermined heaters may be employed, predetermined subsets of heaters may be activated, or all heaters activated.

It would be evident that actuator 2240 may have metallization formed upon its vertical surfaces during the MOEMS manufacturing sequence, or in other embodiments of the invention metallization may be upon the lower surface of the MOEMS optical waveguide micro-positioner. It would also be evident that other low melting point metallizations may be applied to the MOEMS including, but not limited to, indium tin, indium silver, indium silver time, bismuth tin, and tin silver copper. Optionally, the low temperature melting point metallization may be on the lower surface of the MOEMS actuator.

It would also be evident that a MOEMS optical waveguide micro-positioner according to embodiments of the invention may be manufactured using non-silicon mechanical layers atop a silicon substrate. Such mechanical layers including, but not limited to, silicon, silicon dioxide, silicon nitride, silicon oxynitride, silicon carbide, carbon, aluminum oxide, and a ceramic. Further, such mechanical layers may allow for side wall and bottom metallization according to the manufacturing processes, see for example El-Gamal at al in U.S. Pat. No. 8,658,452 entitled "Low Temperature Ceramic Microelectromechanical Structures" and F. Nabki et al in U.S. Pat. No. 8,071,411 entitled "Low Temperature Ceramic Microelectromechanical Structures."

Figure 23A:
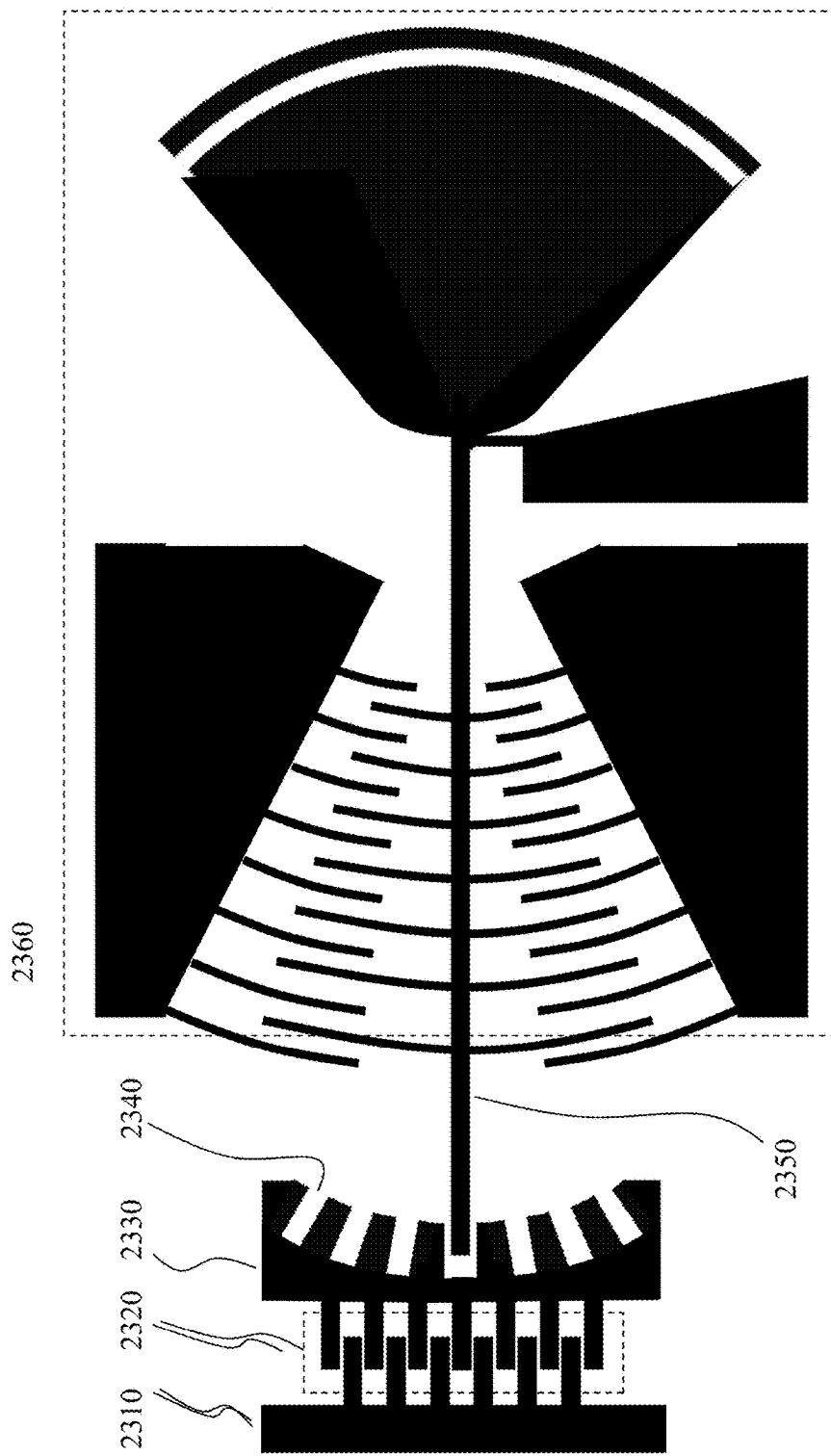
FIGS. 23A and 23B depict MEMS actuators for a MOEMS element with post-alignment locking mechanisms according to an embodiment of the invention.
Figure 23B:
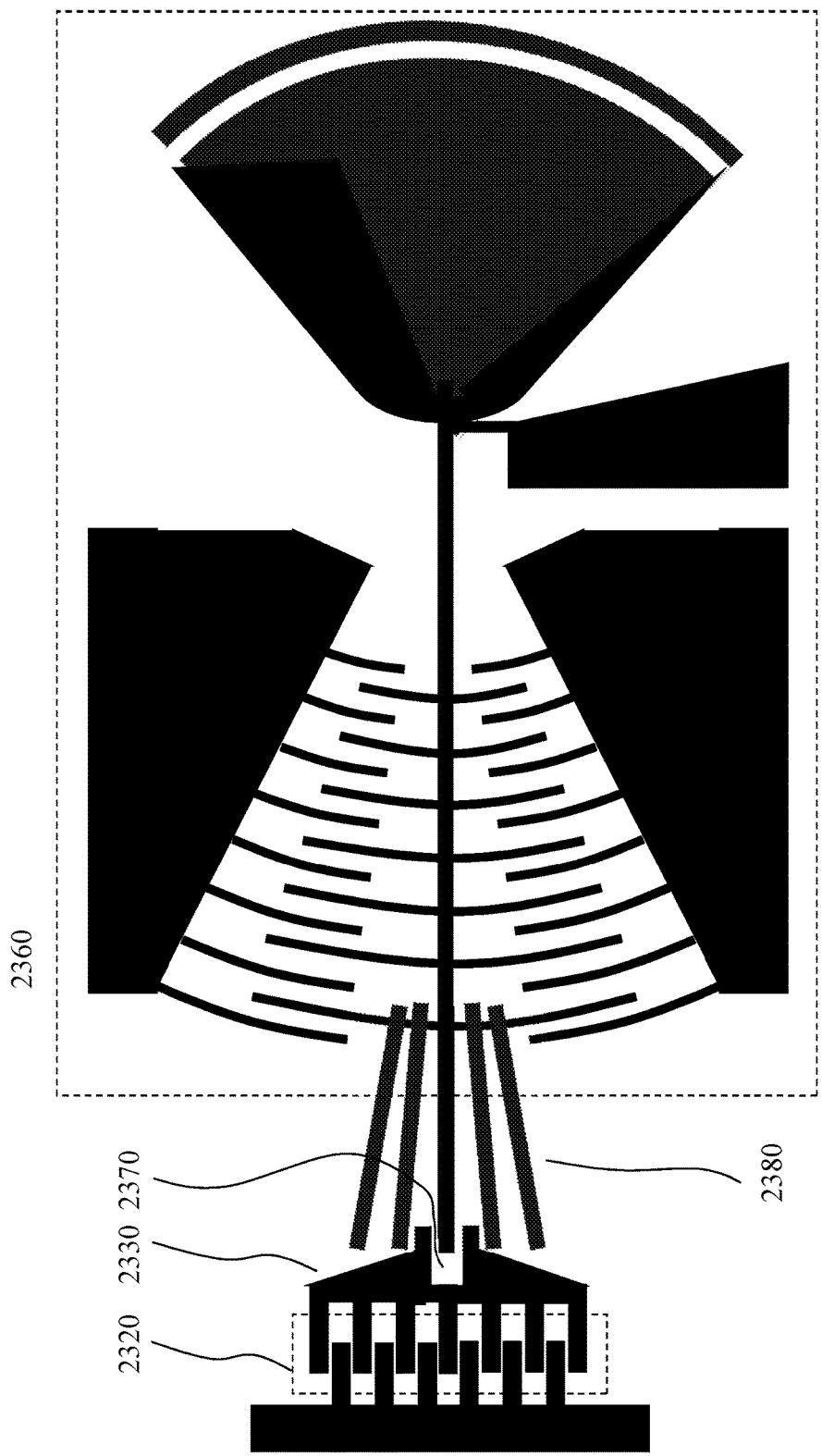

Alternatively, a physical latching or rotational or lateral actuators may be employed such as depicted in respect of FIG. 23A for a rotation actuator wherein an angular comb actuator as part of a rotating mirror based wavelength selective reflector circuit 2360 is depicted, e.g. a MOTUS optical engine as described supra. In this embodiment of the invention the actuator arm 2350 extends beyond the comb drive actuator and engages with openings 2340 within first comb 2330 that is arranged in conjunction with second comb 2310. Accordingly, electrostatic actuation of the combs 2320 results in first comb 2330 being moved away from rotating mirror based wavelength selective reflector circuit 2360 allowing its rotation wherein subsequently removal of the electrostatic actuation of the combs 2320 results in first comb 2330 being moved towards the rotating mirror based wavelength selective reflector circuit 2360 such that the actuator arm 2350 engages an opening 2340 in first comb 2330 such that the actuator arm 2350 is locked within an opening 2340. Such a configuration is particularly suited to a MOEMS actuator with a predetermined series of defined positions, such as the defined rotations for the MOTUS optical engine, rather than a MOEMS optical waveguide micro-positioner which is continuous or quasi-continuous in its positional states to provide the desired positional placement. Optionally, as depicted in FIG. 23B a single opening 2370 may be provided upon the first comb 2330 of the combs 2320 which is selectively disengaged and engaged with one of a plurality of teeth 2380 disposed on the MEMS actuator of the rotating mirror based wavelength selective reflector circuit 2360.

Figure 24:
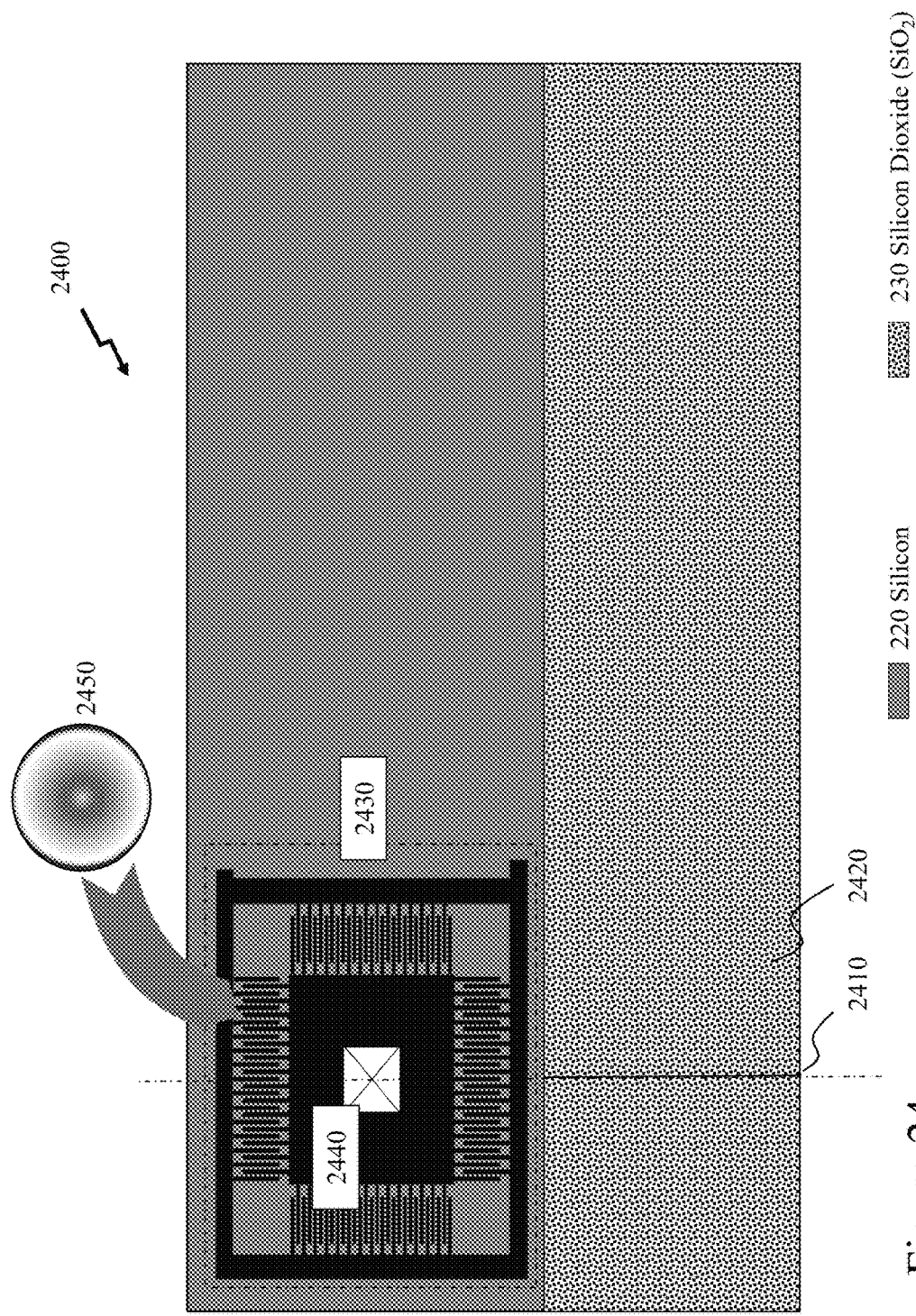
FIG. 24 depicts part of a MOEMS according to an embodiment of the invention exploiting MEMS based micro-positioners to align a micro-optic element.

Referring to FIG. 24 depicts part of a MOEMS 2400 according to an embodiment of the invention exploiting MEMS based micro-positioners 2430 to align a micro-optic element 2450 with an optical waveguide 2410. As depicted the optical waveguide 2410 is part of an optical structure exploiting a silicon dioxide 230 upper cladding such as a $SiO_2$—$Si_3N_4$—$SiO_2$ waveguide structure. This has been grown post fabrication atop a silicon 220 substrate within which a MEMS based micro-positioner 2430 has been previously formed. As depicted the optical structure 2420 comprising at least the silicon dioxide 230 and optical waveguide 2410 terminates prior to the region of the silicon 220 substrate. As such optical signals can be coupled to/from the optical waveguide 2410 by free-space optics. In order to ease alignment of such free-space optical or micro-optic elements the MEMS based micro-positioner 2430 has an etched recess 2440 that accepts a ball lens 2450 which can then be moved laterally, longitudinally, and/or vertically according to the design of the MEMS based micro-positioner 2430. Optionally, the ball lens 2450 may be retained by metallization/soldering to the MEMS based micro-positioner 2430 or epoxied. Optionally, the ball lens 2450 may be located using features atop the MEMS based micro-positioner 2430 rather than etching into it. Similarly, a variety of optical elements other than a ball lens may be employed including, but not limited to, injection molded glass lenses, injection molded plastic lens, graded index (GRIN) lenses, optical fiber based GRIN lenses, etc.

Figure 25A:
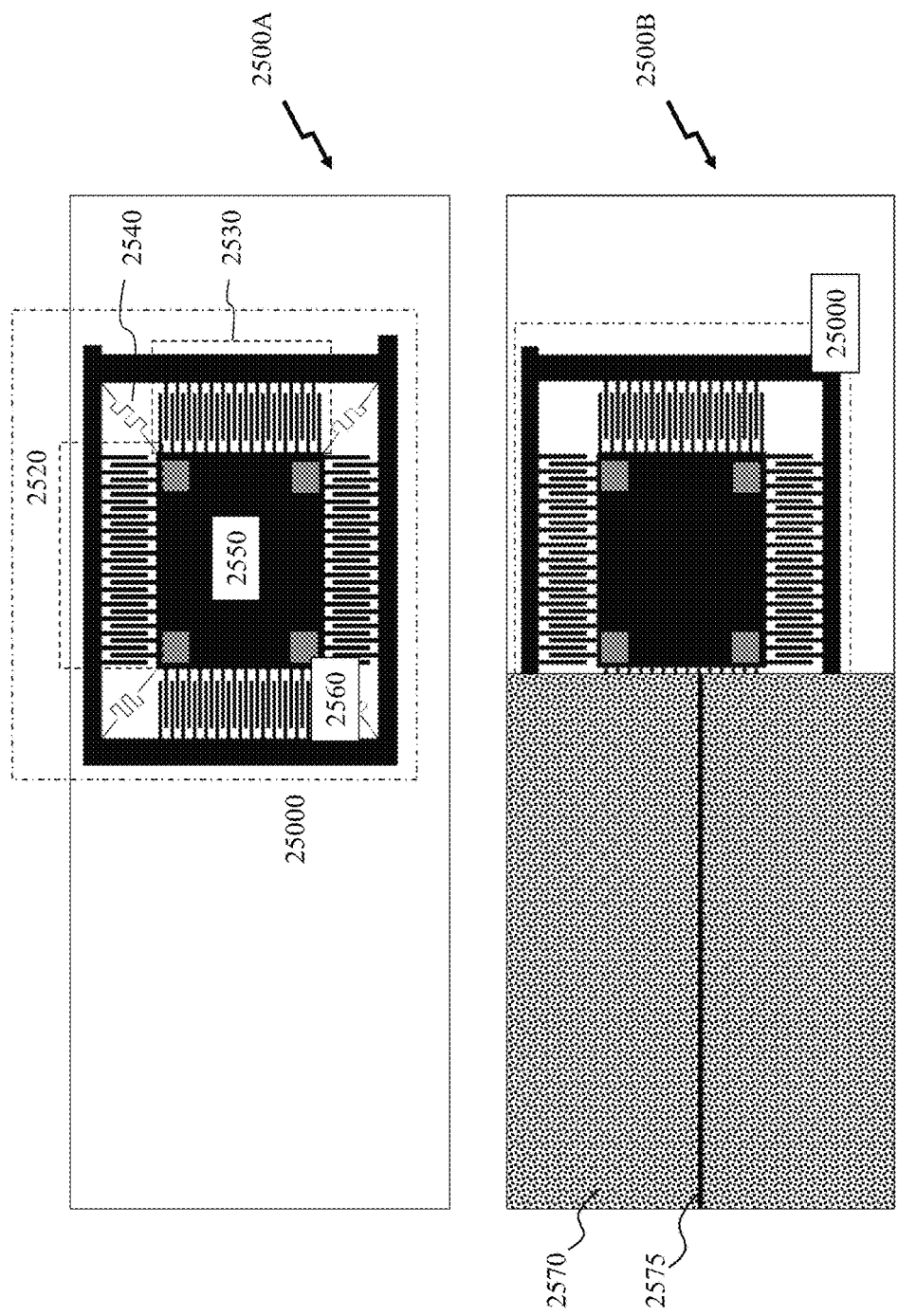
FIGS. 25A and 25B depict part of a MOEMS according to an embodiment of the invention exploiting MEMS micro-positioners to optically align optical waveguides on active and passive photonic circuit elements.
Figure 25B:
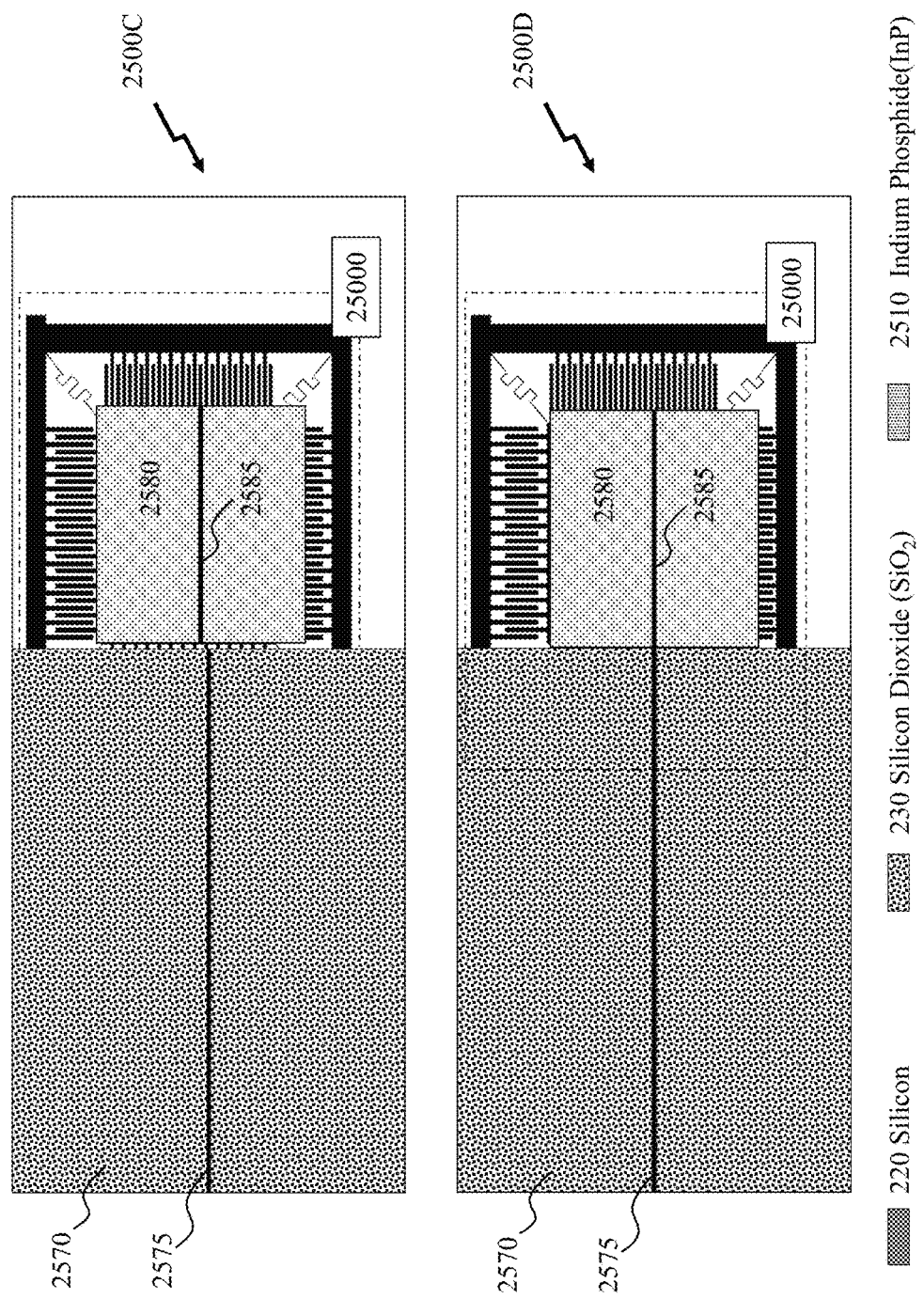

Now referring to FIGS. 25A and 25B depict part of a MOEMS according to an embodiment of the invention exploiting MEMS micro-positioners to optically align optical waveguides on active and passive photonic circuit elements. As depicted in first view 2500A a silicon substrate has formed within it a MEMS based micro-positioner 25000 comprising a pair of first MEMS actuators 2520 in one direction and a pair of second MEMS actuators 2530 in a perpendicular direction in plane with the direction of the pair of first MEMS actuators 2520. Each corner contains a spring support 2540 such that these hold the platform 2550 up but allow its position to be adjusted. These actuators allow the platform 2550 with its mesa structures 2560 to be moved within the plane of the silicon substrate. Next as depicted in second view 2500B a passive optical die 2570 with passive waveguide 2575 has been disposed wherein the end of the passive optical die 2570 now projects over a portion of the MEMS based micro-positioner 25000. Then, as depicted in third view 2500C in FIG. 25B an active optical die 2580 with active waveguide 2585 is placed atop the platform 2550 of the MEMS based micro-positioner 25000, and fixed into position. Then as depicted in fourth view 2500D the MEMS based micro-positioner 25000 is driven in the plane of the silicon substrate such that the passive waveguide 2575 is aligned to the active waveguide 2585. In this manner the active optical die 2580, e.g., a laser diode, may be aligned to the passive waveguide 2575. Optionally the active optical die 2580 may be flip-chip mounted to the platform 2550 and electrically connected via flexible bondwires or through the spring supports 2540. Optionally, the passive optical die 2570 may be similarly flip-chip mounted such that the passive optical die 2570 is aligned to features etched into the silicon substrate within which the MEMS based micro-positioner 25000 is integrated. Optionally, larger MEMS based micro-positioners may be employed to adjust the passive optical die as well or as an alternative. Optionally, additional MEMS based micro-positioners may be employed in conjunction with the MEMS based micro-positioners depicted in FIGS. 24, 25A and 25B respectively to provide not only lateral and longitudinal axes of motion but also rotation. For example, MEMS based micro-positioner 25000 may be the central region of a rotary MEMS element.

Figure 26A:
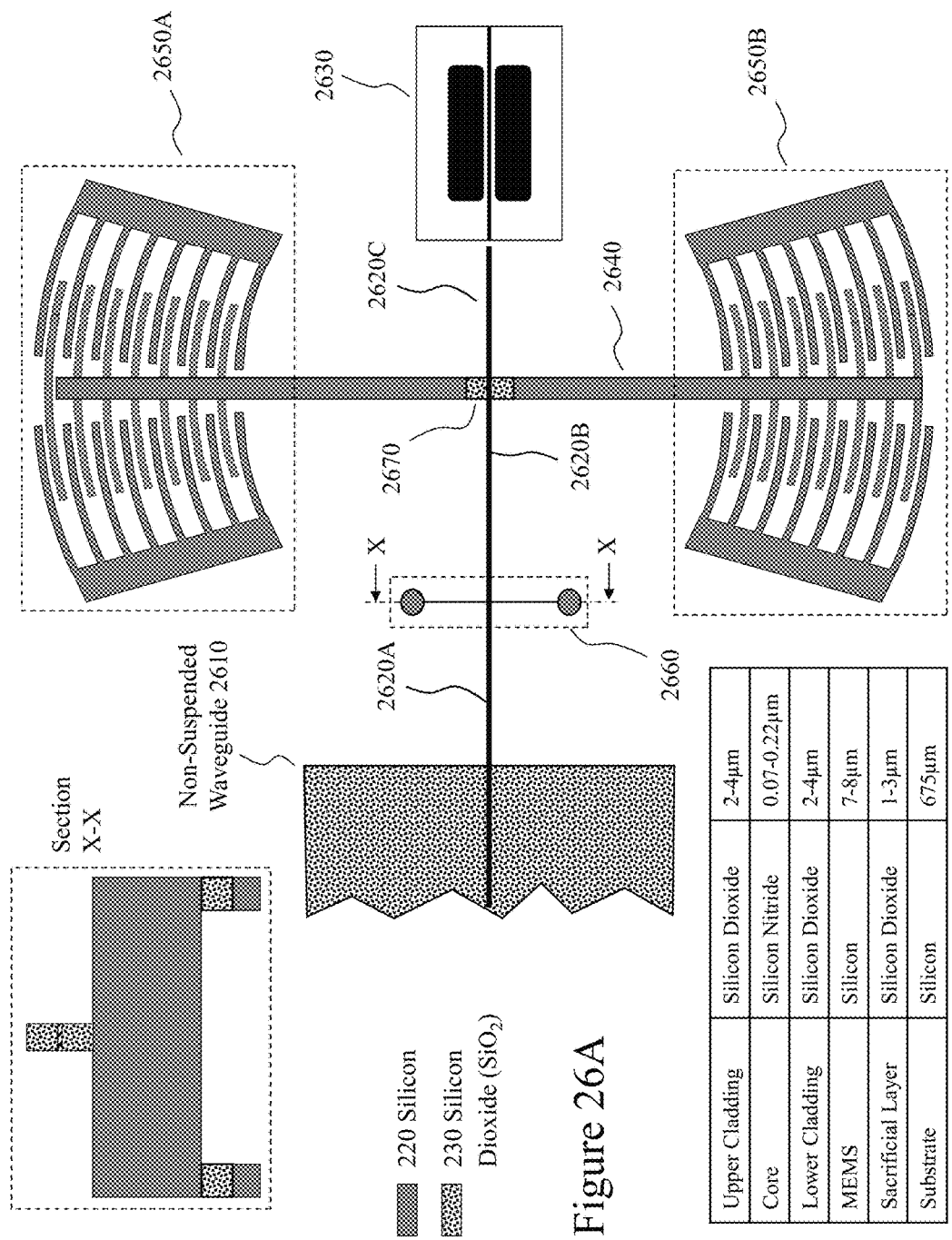
FIGS. 26A to 26D depict alternate configurations for the manipulation of a silicon nitride-on-silicon waveguide within a MOEMS exploiting MEMS micro-positioners according to embodiments of the invention.

Now referring to FIG. 26A there is depicted a configuration for the manipulation of a silicon nitride-on-silicon waveguide within a MOEMS exploiting MEMS micro-positioners according to an embodiment of the invention. As depicted the silicon nitride-on-silicon waveguide begins as a non-suspended waveguide 2610 before transitioning to first suspended waveguide section 2620A and thereafter second suspended waveguide section 2620B wherein a pivot 2660 is disposed "separating" the first and second suspended waveguide sections 2620A and 2620B respectively. As evident from cross-section X-X depicted in the insert the pivot 2660 differs from the pivot described and depicted supra in respect of FIGS. 13B and 13C respectively in that the pivot point is now mounted to the substrate to the sides of the arm formed by the suspended waveguide sections rather than below the arm itself. Disposed between second and third suspended waveguide sections 2620B/2620C respectively is first MEMS suspended waveguide section 2670 mounted to first MEMS arm 2640. The end of third suspended waveguide section 2620C is intended to align to device 2630, e.g. an optical amplifier, distributed feedback (DFB) laser diode, external modulator, etc. First MEMS arm 2640 is supported at both ends by first and second rotating MEMS actuators 2650A and 2650B respectively such that motion of these under electrostatic actuation results in a movement of the overall waveguide structure comprising first to third suspended waveguide sections 2620A to 2620C respectively and first MEMS suspended waveguide section 2670. The motion also being controlled through the flexure properties and placement of the pivot 2660.

Figure 26B:
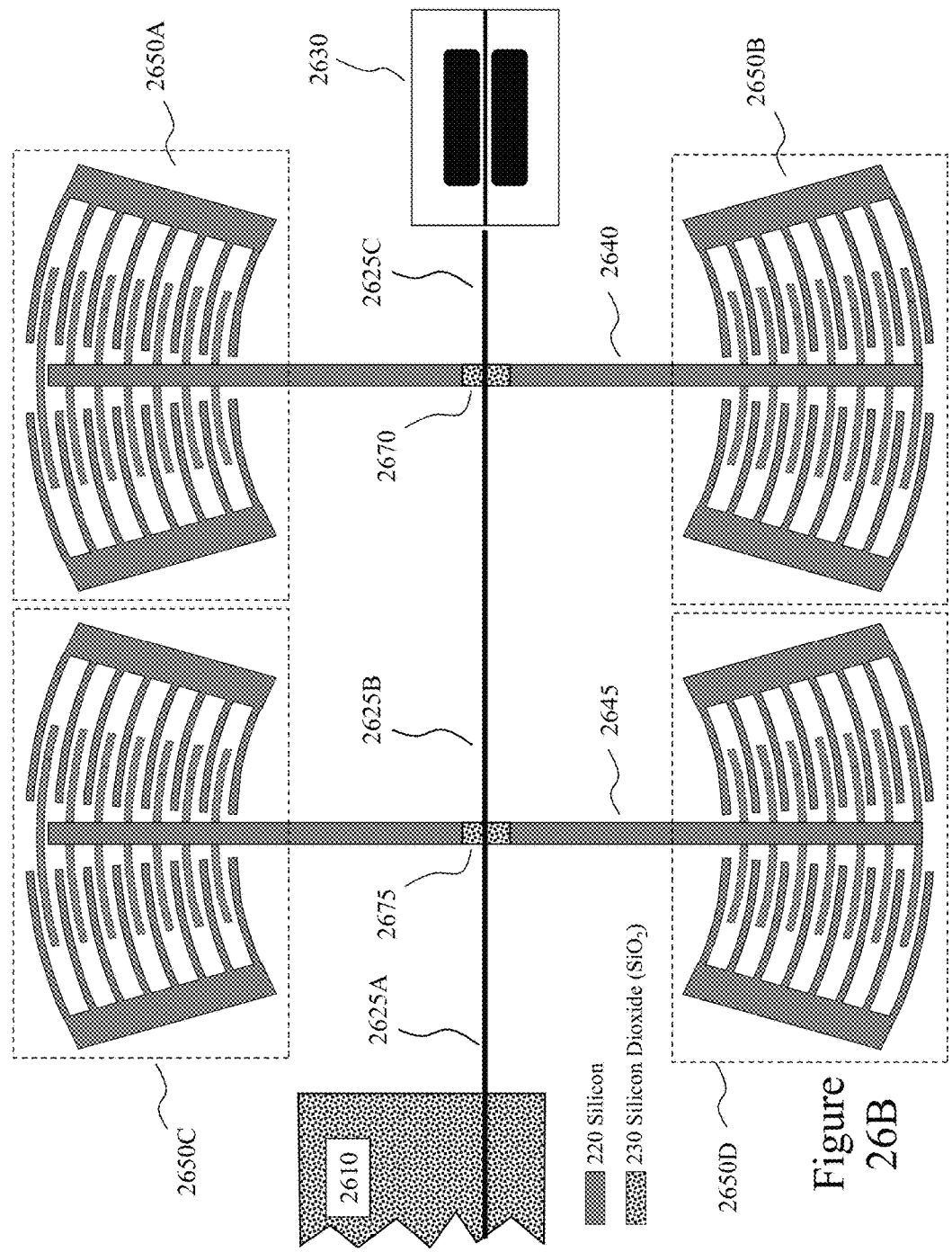

Now referring to FIG. 26B there is depicted a configuration for the manipulation of a silicon nitride-on-silicon waveguide within a MOEMS exploiting MEMS micro-positioners according to an embodiment of the invention. As depicted the silicon nitride-on-silicon waveguide begins as a non-suspended waveguide 2610 before transitioning to first suspended waveguide section 2620A and thereafter second and third suspended waveguide sections 2625B and 2625C respectively. Disposed between first and second suspended waveguide sections 2625A/2625B respectively and second and third suspended waveguide sections 2625B/

2625C respectively are first and second MEMS suspended waveguide sections 2675 and 2670 respectively which are mounted to second MEMS arm 2645 and first MEMS arm 2640 respectively. The end of third suspended waveguide section 2625C is intended to again align to device 2630. First MEMS arm 2640 is supported at both ends by first and second rotating MEMS actuators 2650A and 2650B respectively whilst second MEMS arm 2645 is supported at both ends by third and fourth rotating MEMS actuators 2650C and 2650D respectively. Accordingly, the configuration depicted in FIG. 26B does not have the waveguide attached to a pivot such that motion of the rotating MEMS actuator pairs coupled to the MEMS arms under electrostatic actuation results in flexing and motion of the overall waveguide structure comprising first to third suspended waveguide sections 2625A to 2625C respectively and first and second MEMS suspended waveguide sections 2670 and 2675 respectively allowing positioning and angular control of the end of the third suspended waveguide section 2620C relative to the facet of device 2630.

Figure 26C:
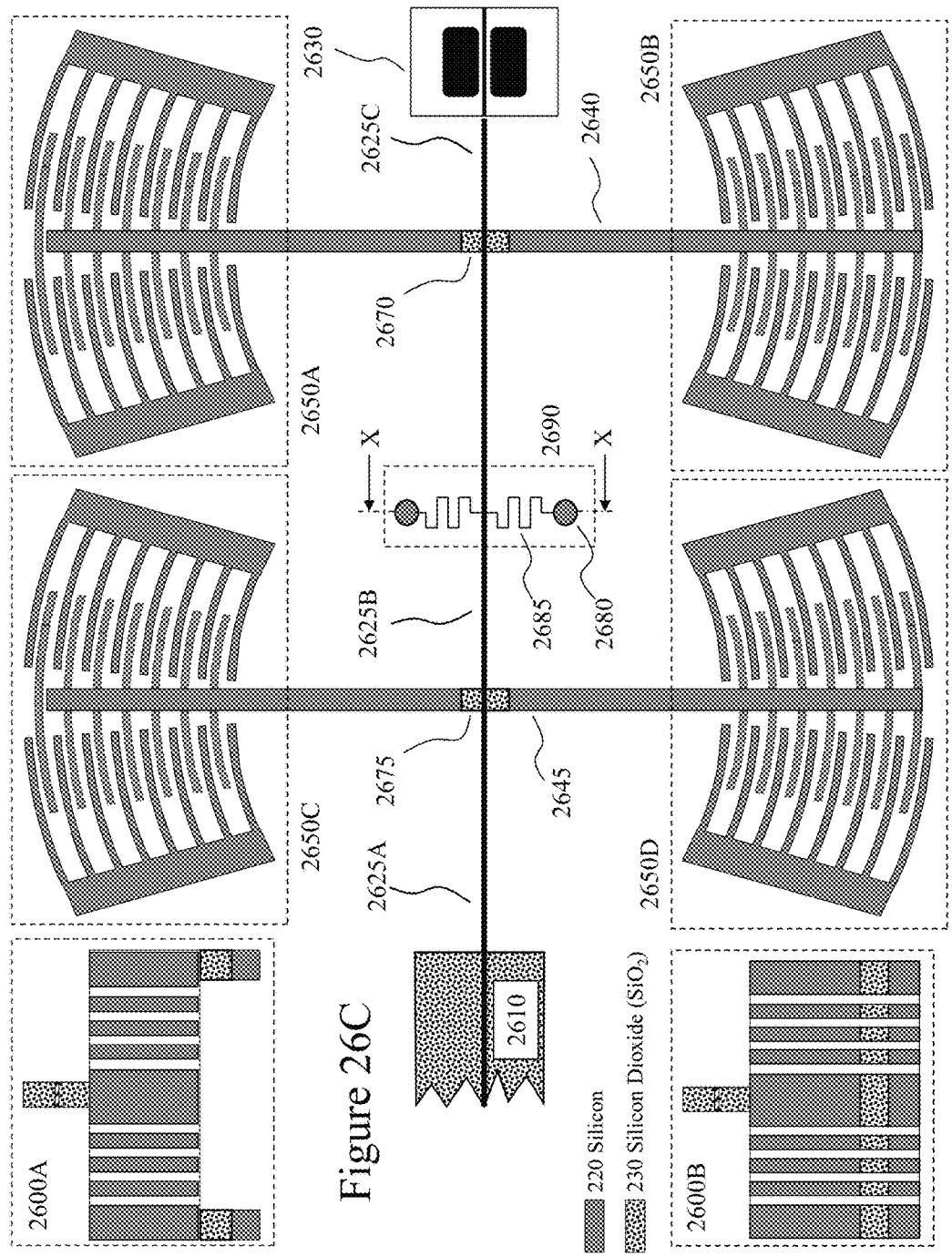

Now referring to FIG. 26C there is depicted essentially the same configuration for the manipulation of a silicon nitride-on-silicon waveguide within a MOEMS exploiting MEMS micro-positioners according to an embodiment of the invention although now disposed along the second suspended waveguide section 2620B is pivot assembly 2690 comprising posts 2680 and springs 2685 wherein the second suspended waveguide section 2620B is coupled on either side to a post 2680 via a spring 2685. Within an embodiment of the invention the springs and posts are as depicted in first cross-section X-X depicted in top insert 2600A wherein the springs 2685 are unsupported beneath and are only supported at their ends. Within another embodiment of the invention the springs and posts are as depicted in second cross-section X-X depicted in lower insert 2600B wherein the springs 2685 are coupled to the substrate and supported along their length. The characteristics of the resulting motion and resolution of the silicon nitride-on-silicon waveguide within a MOEMS exploiting MEMS micro-positioners in this instance is now, in addition, to the characteristics of the suspended waveguide portions and the MEMS actuators also determined by the position, design, and structure of the pivot assembly 2690.

Figure 26D:
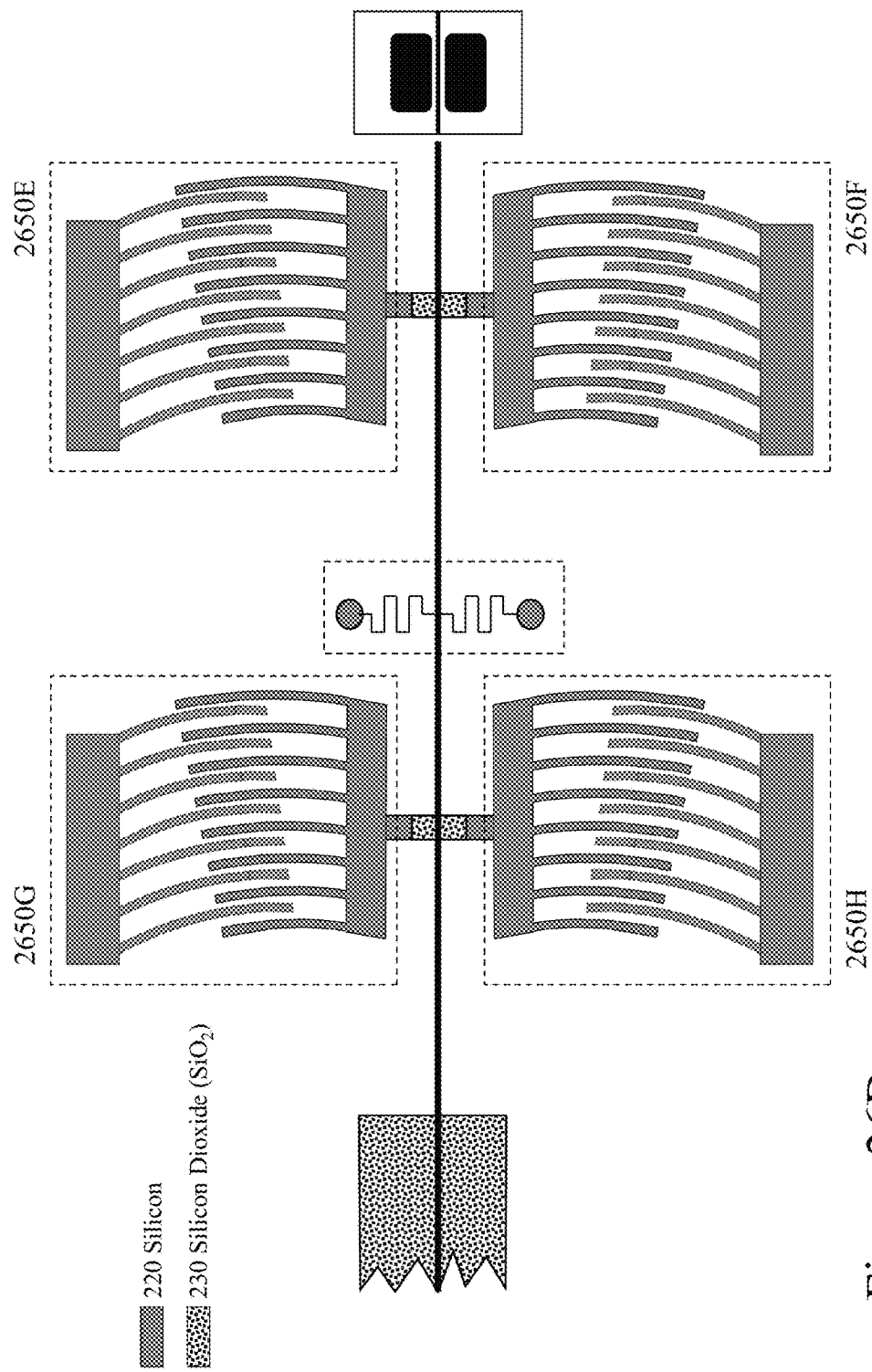

Referring to FIG. 26D there is depicted a variant of the manipulation of a silicon nitride-on-silicon waveguide within a MOEMS exploiting MEMS micro-positioners according to an embodiment of the invention as depicted in FIG. 26C but now with first to fourth comb drive actuators 2650E to 2650G respectively as opposed to first to fourth rotating MEMS actuators 2650A to 2650D respectively. Accordingly, rather than imparting rotary motion of the arms linking the rotating MEMS actuators to the optical waveguide the comb drive actuators directly drive the optical waveguide directly laterally in either direction in order to impart the required manipulation of the optical waveguide.

Figure 27A:
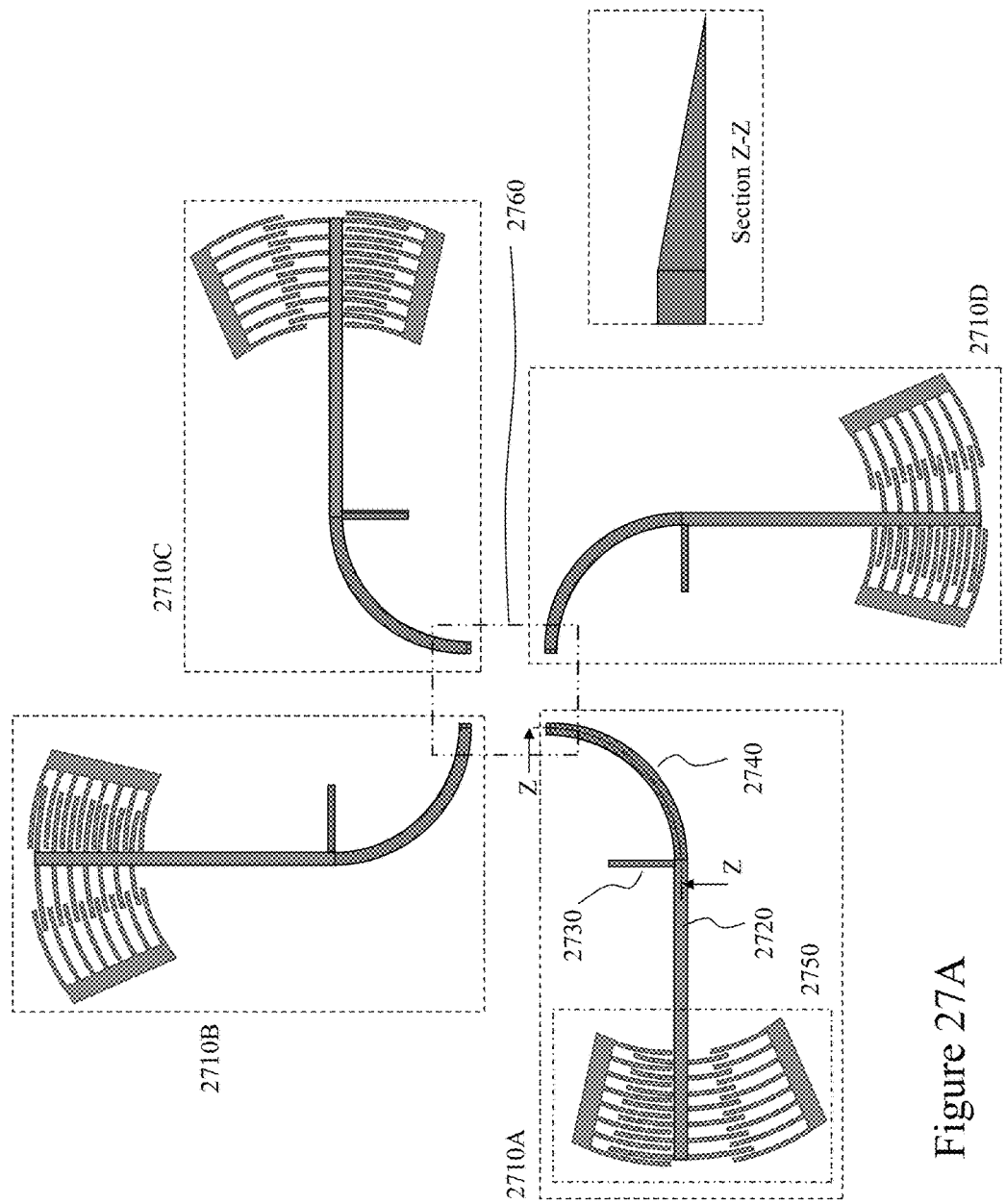
FIGS. 27A and 27B depict provisioning of vertical manipulation of an optical circuit element according to an embodiment of the invention exploiting vertical motion generated with in-plane comb-actuator based micro-positioners.
Figure 27B:
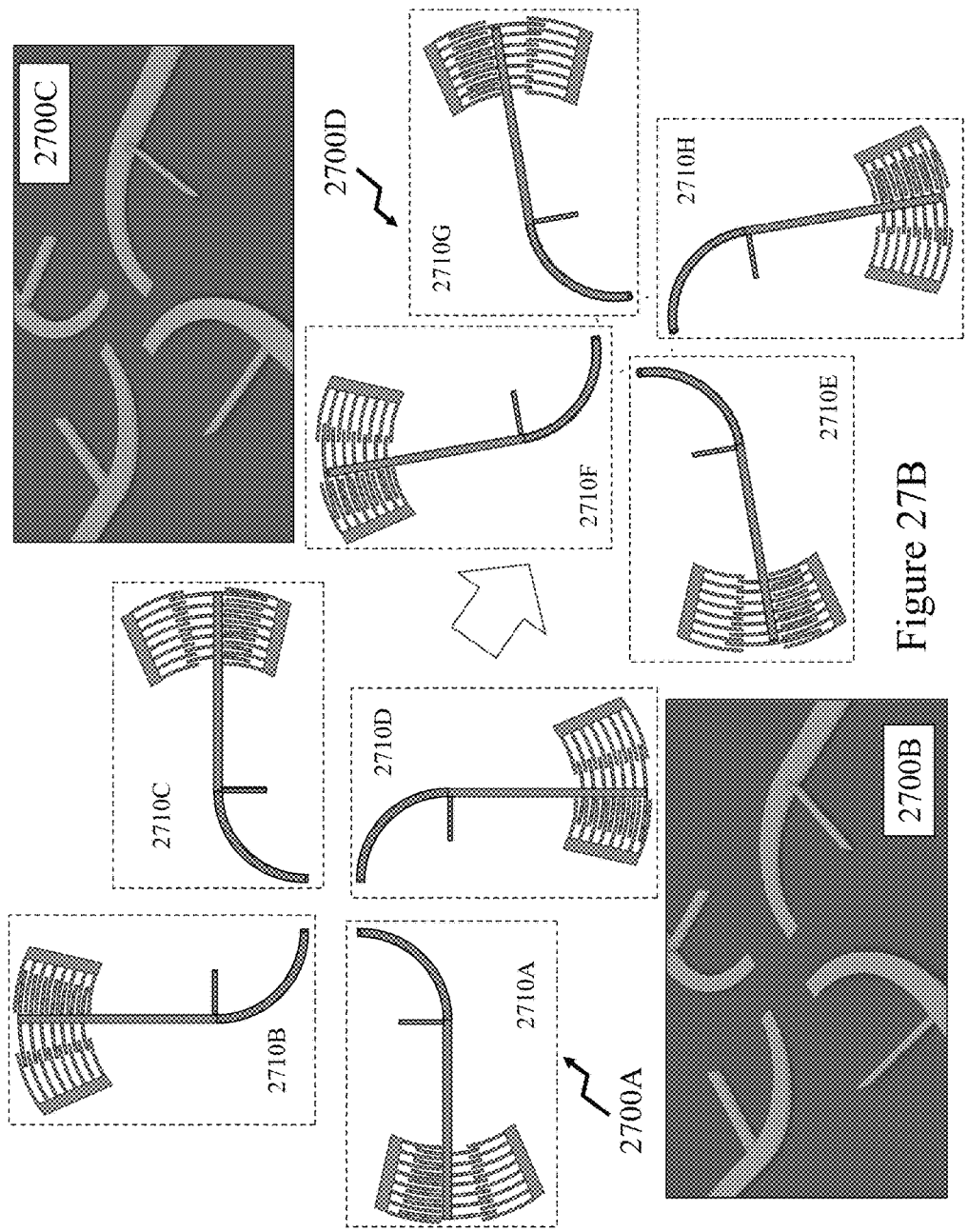

Now referring to FIGS. 27A and 27B there is depicted the provisioning of vertical manipulation of an optical circuit element according to an embodiment of the invention exploiting vertical motion generated with in-plane comb-actuator based micro-positioners. Referring initially to FIG. 27A there are depicted first to fourth MEMS actuators 2710A to 2710D wherein each comprises:

Linear arm 2720
Pivot 2730
Curved arm 2740; and
Rotary MEMS actuator 2750.

Also depicted in the insert is a cross-section Z-Z along the curved arm 2740 indicating that from its end point to the point it joins linear arm 2720 its thickness tapers according to a define profile. Accordingly, if an optical circuit element 2760, e.g. a semiconductor optical amplifier (SOA) die, is placed on top of the first to fourth MEMS actuators 2710A to 2710D then rotation of the arm comprising linear arm 2720 and curved arm 2740 about the pivot 2730 through the action of the rotary MEMS actuators 2750 results in the curved arms 2740 being pushed under the optical circuit element 2760 thereby raising the optical circuit element 2760 vertically away from the plane of the silicon even through the MEMS actuators are operating within the plane of the silicon. Optionally, the tapered thickness of the curved arm 2740 may vary over a length shorter than the curved arm 2740.

Such a motion is depicted in FIG. 27B with first and second plan views 2700A and 2700D respectively of the four MEMS structures before and after rotation together with corresponding first and second perspective views 2700B and 2700C respectively. It would also be evident that the selective motion of sub-sets of the four MEMS actuators will raise corresponding corners of the optical circuit element 2760 such that whilst there is some vertical motion there is also some degree of yaw and pitch control applied to the optical circuit die 2760. It would be evident that other configurations such as linear arm with tapers coupled to linear comb actuators etc. may be employed without departing from the scope of the invention. Further whilst the optical circuit element 2760 is depicted with the actuators engaging upon the corners of the optical circuit element 2760 it would be evident that alternatively the MEMS elements may engage the sides of the optical circuit element 2760. Optionally, the optical circuit element 2760 may be a sub-mount for an optical die or optical element.

Figure 28:
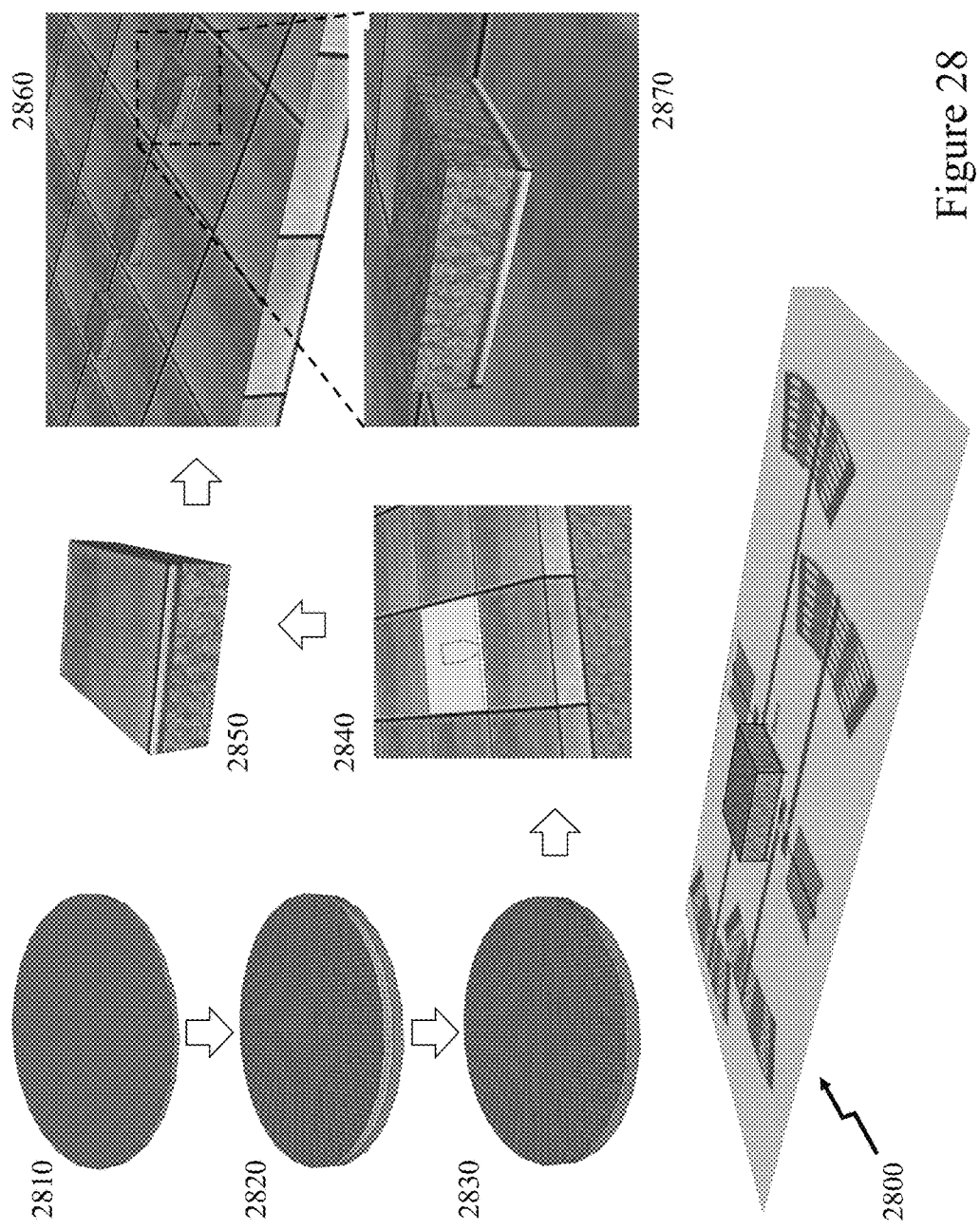
FIG. 28 depicts a hybrid integration methodology for active elements within MOEMS according to an embodiment of the invention with thin silicon waveguide layer and tapers bonded to active device with flip-chip mounting of bonded wafers to MEMS based micro-positioners.

Now referring to FIG. 28 there is depicted a hybrid integration methodology process flow for active elements within MOEMS according to an embodiment of the invention with thin silicon waveguide layer and tapers bonded to active device with flip-chip mounting of bonded wafers to MEMS based micro-positioners. As depicted the process flow comprises the following steps:

Step 2810 wherein an initial active semiconductor wafer is employed which has been processed to form semiconductor optical amplifier (SOA) structures within it;
Step 2820 wherein a silicon-on-insulator (SOI) wafer is bonded to the active semiconductor wafer;
Step 2830 wherein the SOI wafer is thinned, for example by etching, mechanical polishing and chemo-mechanical polishing (CMP);
Step 2840 wherein the thinned SOI wafer is now processed to define waveguide tapers above the OSA structures within the active semiconductor wafer;
Step 2850 wherein the bonded wafer pair are diced/processed to separate the discrete die which now contain SOA structures with vertically coupled SOI waveguide tapers;
Step 2860 wherein the discrete SOA—taper die is now flip-chip bonded to a silicon MOEMS wafer to provide the optical gain block functionality wherein the silicon MOEMS wafer includes MEMS based micro-positioners such as depicted in FIG. 18B, for example.

Also depicted in FIG. 28 is a 3D perspective representation 2800 of such an assembled structure as depicted in FIG. 18B using the methodology of FIG. 28 wherein the semiconductor active structure is uppermost, the SOI bonded ultra-thin wafer is adjacent the silicon MOEMS surface.

Whilst the depiction in respect of FIG. 28 is made with respect to an optical amplifier die it would be evident that other active semiconductor devices such as laser diodes, light emitting diodes, photodetectors, and avalanche photodetectors. Further, the SOI wafer may be etched to form structures for coarse alignment of the flip-chip die to the silicon MOEMS wafer.

Within the embodiments of the invention described supra in respect of embodiments of the invention optical waveguides exploiting a silicon nitride core with silicon oxide upper and lower cladding, a $SiO_2$—$Si_3N_4SiO_2$ waveguide structure are depicted. However, it would be evident that other waveguide structures may be employed including, but not limited to, silica-on-silicon, with doped (e.g. germanium, Ge) silica core relative to undoped cladding, silicon oxynitride, polymer-on-silicon, doped silicon waveguides. Additionally, other waveguide structures may be employed including vertical and/or lateral waveguide tapers and forming microball lenses on the ends of the waveguides via laser and/or arc melting of the waveguide tip. Further, embodiments of the invention have been described primarily with respect to the optical alignment of a silicon-on-insulator (SOI) waveguide, e.g. $SiO_2$—$Si_3N_4SiO_2$; $SiO_2$—$Ge:SiO_2$—$SiO_2$; or Si—$SiO_2$, and an active InP waveguide, e.g. an SOA. However, it would be evident to one skilled in the art that the embodiments of the invention may be employed in a variety of waveguide coupling structures coupling onto and/or from waveguides employing material systems that include, but not limited to, $SiO_2$—$Si_3N_4SiO_2$; $SiO_2$—Ge:$SiO_2$—$SiO_2$; Si—$SiO_2$; ion exchanged glass, ion implanted glass, polymeric waveguides, InGaAsP, GaAs, III-V materials, II-VI materials, Si, SiGe, and optical fiber. Whilst primarily waveguide-waveguide systems have been described it would be evident to one skilled in the art that embodiments of the invention may be employed in aligning intermediate coupling optics, e.g. ball lenses, spherical lenses, graded refractive index (GRIN) lenses, etc. for free-space coupling into and/or from a waveguide device.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A device comprising:
   a substrate;
   an optical waveguide structure comprising:
   an optical waveguide formed upon a substrate;
   a first suspended optical waveguide section coupled at a first end to the optical waveguide and at a second distal end to a first end of a non-suspended optical waveguide section;
   the non-suspended optical waveguide section disposed upon an arm of a first microelectromechanical systems (MEMS) micro-positioner; and
   a second suspended waveguide coupled at a first end to a second distal end of the non-suspended optical waveguide section;
   the first MEMS micro-positioner comprising a first portion for providing motion of the arm coupled to a first end of the arm; wherein
   the optical waveguide structure is continuous from the first suspended optical waveguide section to the second suspended optical waveguide section.

2. The device according to claim 1, further comprising a second MEMS micro-positioner comprising a first portion for providing a motion of the aim; wherein
   the first portion of the second MEMS micro-positioner is coupled to a second distal end of the arm;
   the first MEMS micro-positioner and the second MEMS micro-positioner are disposed laterally on either side of the optical waveguide structure.

3. The device according to claim 2, wherein
   the first MEMS micro-positioner, second MEMS micro-positioner and the arm are one set of linked actuators of a plurality of sets of linked actuators;
   each arm within a set of linked actuators supports a non-suspended waveguide portion of a plurality of non-suspended waveguide portions; and
   between each sequential pair of non-suspended waveguide portions are joined by a suspended waveguide portion.

4. The device according to claim 2, wherein
   the first MEMS micro-positioner, second MEMS micro-positioner and the arm are one set of linked actuators of a plurality of sets of linked actuators each disposed at a predetermined location along the second portion of the optical waveguide structure;
   each arm within a set of linked actuators supports a non-suspended waveguide portion of a plurality of non-suspended waveguide portions;
   between each sequential pair of non-suspended waveguide portions are joined by a suspended waveguide portion; and
   an anchor is disposed along a suspended waveguide portion disposed between a first set of linked actuators of the plurality of sets of linked actuators and another set of linked actuators of the plurality of sets of linked actuators.

5. The device according to claim 4, wherein
   the anchor comprises:
   a first post disposed to a first side of the suspended optical waveguide section between the sequential pair of non-suspended waveguide portions;

a second post disposed to a second other side of the suspended optical waveguide section between the sequential pair of non-suspended waveguide portions;

a first spring coupling the first post to the suspended optical waveguide section between the sequential pair of non-suspended waveguide portions; and a second spring coupling the second post to the suspended optical waveguide section between the sequential pair of non-suspended waveguide portions.

6. The device according to claim 2, wherein
each of the first MEMS micro-positioner and the second MEMS micro-positioner provide rotary motion of the arm and each further comprise a linear MEMS actuator for selectively locking and unlocking the first MEMS micro-positioner or second MEMS micro-positioner with which they are associated in order to prevent and allow rotary motion respectively.

7. The device according to claim 2, further comprising:
a first plurality of heaters disposed upon a substrate upon which the first MEMS micro-positioner is formed between the first MEMS micro-positioner and the non-suspended optical waveguide section and beneath the arm;
a second plurality of heaters disposed upon the substrate between the second MEMS micro-positioner and the non-suspended optical waveguide section and beneath the arm; wherein
the first and second pluralities of heaters allow a material disposed between the first and second pluralities of heaters and the arm to be liquefied when the first and second pluralities of heaters are activated allowing motion of the arm and then solidified when the first and second pluralities of heaters are de-activated to prevent motion of the arm.

8. The device according to claim 2, wherein
the motion of the arm coupling the first MEMS micro-positioner and the second MEMS micro-positioner under action of the first electrostatic actuator and second electrostatic actuator is at least one of rotation and translation.

9. The device according to claim 1, wherein
the motion of the arm under the action of the first portion of the first MEMS micro-positioner is rotation.

10. The device according to claim 1, further comprising;
an anchor located disposed between the first portion of at a predetermined position with respect to an arm linking the first MEMS micro-positioner and the point at which the non-suspended optical waveguide section is supported by the arm.

11. The device according to claim 1, wherein the arm comprises:
a first portion coupled to the first portion of the first MEMS micro-positioner;
a second portion supporting the non-suspended optical waveguide section of the optical waveguide structure; and
a third portion disposed between the first portion and the second portion; wherein the third portion acts a spring.

12. The device according to claim 1, further comprising:
a plurality of heaters formed upon a substrate upon which the first MEMS micro-positioner is formed and disposed beneath the arm; wherein
the plurality of heaters allow a material disposed between the plurality of heaters and the arm to be liquefied when the plurality of heaters are activated allowing motion of the arm under the action of the first portion of the first MEMS micro-positioner and then solidified when the heaters are de-activated to prevent motion of the arm.

13. The device according to claim 1, wherein
the first MEMS micro-positioner is one of a pair of MEMS micro-positioners;
the second distal end of the second suspended waveguide is coupled to a first end of another non-suspended optical waveguide section disposed upon an arm of the MEMS micro-positioner of the pair of MEMS micro-positioners;
a second distal end of the another non-suspended optical waveguide section is coupled to a first end of another suspended optical waveguide section.

14. The device according to claim 1, wherein
the first MEMS micro-positioner comprises an electrostatic rotary actuator to move the non-suspended optical waveguide section and an electrostatic linear actuator for selectively locking and unlocking the first MEMS micro-positioner to prevent and allow rotary motion respectively.

15. The device according to claim 1, further comprising:
an actuator control electrode; wherein
the arm comprises:
a first portion coupled to the first portion of the first MEMS micro-positioner;
a second portion supporting the non-suspended optical waveguide section of the optical waveguide structure; and
a third portion disposed between the first portion and the second portion; wherein the third portion acts a spring; and
the actuator control electrode is disposed adjacent an end of the second portion of the arm distal to the end of the second portion of the arm coupled to the third portion of the arm; and
activation of the actuator control electrode results in either electrostatic attraction or electrostatic repulsion between the second portion of the arm and the actuator control electrode.

16. The device according to claim 1, further comprising:
a first actuator control electrode;
a second actuator control electrode; wherein
the arm comprises:
a first portion coupled to the first portion of the first MEMS micro-positioner;
a second portion supporting the non-suspended optical waveguide section of the optical waveguide structure; and
a third portion disposed between the first portion and the second portion; wherein the third portion acts a spring; and
the first actuator control electrode is disposed in a first position relative to an end of the second portion of the arm distal to the end of the second portion of the arm coupled to the third portion of the arm;
the second actuator control electrode is disposed in a second position relative to the end of the second portion of the arm distal to the end of the second portion of the arm coupled to the third portion of the arm;
activation of the first actuator control electrode results in either electrostatic attraction or electrostatic repulsion between the second portion of the arm and the actuator control electrode; and activation of the second actuator control electrode results in either electrostatic attraction or electrostatic repulsion between the second portion of the arm and the actuator control electrode.

17. The device according to claim 1, wherein the optical waveguide, the first suspended optical waveguide section, the non-suspended optical waveguide section, and the second suspended waveguide each comprise a plurality of optical waveguides.

18. The device according to claim 1, wherein the first suspended optical waveguide section deforms under motion of the first MEMS micro-positioner such that a distance between end of the optical waveguide and the non-suspended optical waveguide section varies under the motion of the first MEMS micro-positioner.

19. The device according to claim 1, further comprising a pivot coupled to the first suspended optical waveguide section between the optical waveguide and the non-suspended optical waveguide section.

20. The device according to claim 1, wherein the optical waveguide comprises a first three-dimensional (3D) optical waveguide upon a carrier layer attached to the substrate;

the first suspended optical waveguide section comprises a second 3D optical waveguide comprising only the core;

the second suspended optical waveguide section comprises a third 3D optical waveguide comprising only the core; and the non-suspended optical waveguide section comprises a fourth 3D optical waveguide upon the carrier layer; wherein the first 3D optical waveguide and the fourth 3D optical waveguide each comprises a core formed from a first predetermined material, an upper cladding formed from a second predetermined material and a lower cladding formed from a third predetermined material.

* * * * *